United States Patent
Peng et al.

(10) Patent No.: US 12,300,623 B2
(45) Date of Patent: May 13, 2025

(54) INTEGRATED CIRCUIT

(71) Applicant: TAIWAN SEMICONDUCTOR MANUFACTURING CO., LTD., Hsinchu (TW)

(72) Inventors: Shih-Wei Peng, Hsinchu (TW); Chia-Tien Wu, Taichung (TW); Jiann-Tyng Tzeng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/474,822

(22) Filed: Sep. 26, 2023

(65) Prior Publication Data
US 2024/0021526 A1    Jan. 18, 2024

Related U.S. Application Data

(63) Continuation of application No. 17/035,160, filed on Sep. 28, 2020, now Pat. No. 11,817,392.

(51) Int. Cl.
*H01L 23/538* (2006.01)
*H01L 21/768* (2006.01)

(52) U.S. Cl.
CPC .... *H01L 23/5384* (2013.01); *H01L 21/76802* (2013.01); *H01L 21/76879* (2013.01); *H01L 23/5386* (2013.01)

(58) Field of Classification Search
CPC ............. H01L 23/5384; H01L 23/5386; H01L 23/5286; H01L 21/76802; H01L 21/76879
See application file for complete search history.

(56) References Cited

U.S. PATENT DOCUMENTS

| | | |
|---|---|---|
| 6,225,207 B1 | 5/2001 | Parikh |
| 6,239,485 B1 | 5/2001 | Peters et al. |

(Continued)

FOREIGN PATENT DOCUMENTS

| | | |
|---|---|---|
| KR | 10-2010141 B1 | 8/2019 |
| KR | 10-2021-0131787 A | 11/2021 |

(Continued)

OTHER PUBLICATIONS

U.S. Appl. No. 16/656,715, filed Oct. 18, 2019.

*Primary Examiner* — Bac H Au
(74) *Attorney, Agent, or Firm* — Birch, Stewart, Kolasch & Birch, LLP

(57) ABSTRACT

An integrated circuit includes a first conductive structure including a root portion of the first conductive structure, tine portions that are arranged in a first semiconductor layer, a neck portion surrounded by a film structure. The integrated circuit further includes a second conductive structure having first and second portions that are stacked along a first direction. The first portion of the second conductive structure is surrounded by the film structure and the second portion of the second conductive structure is in the first semiconductor layer. A third conductive structure in the integrated circuit has horizontal and vertical structures. The horizontal structure extends in a second semiconductor layer and the vertical structure passes through the second semiconductor layer and the film structure to contact a first conductive rail. The first conductive rail and the tine portions are apart from the horizontal structure along the first direction by a same distance.

20 Claims, 28 Drawing Sheets

(56) References Cited

U.S. PATENT DOCUMENTS

| | | |
|---|---|---|
| 6,335,494 B1 | 1/2002 | Gregor et al. |
| 8,154,128 B2 | 4/2012 | Lung |
| 8,164,171 B2 | 4/2012 | Lin et al. |
| 8,211,791 B2 | 7/2012 | Lin et al. |
| 8,507,957 B2 | 8/2013 | Hou et al. |
| 10,867,968 B2 | 12/2020 | Chen et al. |
| 10,878,162 B2 | 12/2020 | Peng et al. |
| 11,158,580 B2 | 10/2021 | Sio et al. |
| 2004/0238942 A1 | 12/2004 | Chakravorty et al. |
| 2006/0103024 A1 | 5/2006 | Salmon |
| 2010/0103634 A1 | 4/2010 | Funaya et al. |
| 2012/0181701 A1 | 7/2012 | Chen et al. |
| 2014/0360759 A1 | 12/2014 | Kunieda et al. |
| 2016/0093591 A1 | 3/2016 | Lan et al. |
| 2016/0118338 A1 | 4/2016 | Zhang et al. |
| 2016/0329241 A1 | 11/2016 | Lin et al. |
| 2017/0371995 A1 | 12/2017 | Correale, Jr. et al. |
| 2018/0151411 A1 | 5/2018 | Yang et al. |
| 2018/0174886 A1 | 6/2018 | Chen et al. |
| 2019/0051607 A1 | 2/2019 | Suk et al. |
| 2019/0103353 A1 | 4/2019 | Liu et al. |
| 2019/0139915 A1 | 5/2019 | Dalmia et al. |
| 2019/0157210 A1 | 5/2019 | May et al. |
| 2019/0166319 A1 | 5/2019 | Sato et al. |
| 2020/0066641 A1 | 2/2020 | Aygun et al. |
| 2020/0082052 A1 | 3/2020 | Chien et al. |
| 2020/0203276 A1 | 6/2020 | Hiblot et al. |
| 2020/0205279 A1 | 6/2020 | Ecton et al. |
| 2020/0286905 A1 | 9/2020 | Kai et al. |
| 2021/0098349 A1 | 1/2021 | Miyazawa et al. |
| 2021/0098558 A1 | 4/2021 | Chen et al. |
| 2021/0249262 A1 | 8/2021 | Peng et al. |
| 2021/0343650 A1 | 11/2021 | Peng et al. |
| 2021/0407942 A1 | 12/2021 | Yu et al. |

FOREIGN PATENT DOCUMENTS

| | | |
|---|---|---|
| TW | 201229799 A1 | 7/2012 |
| WO | WO 2009/110537 A1 | 9/2009 |

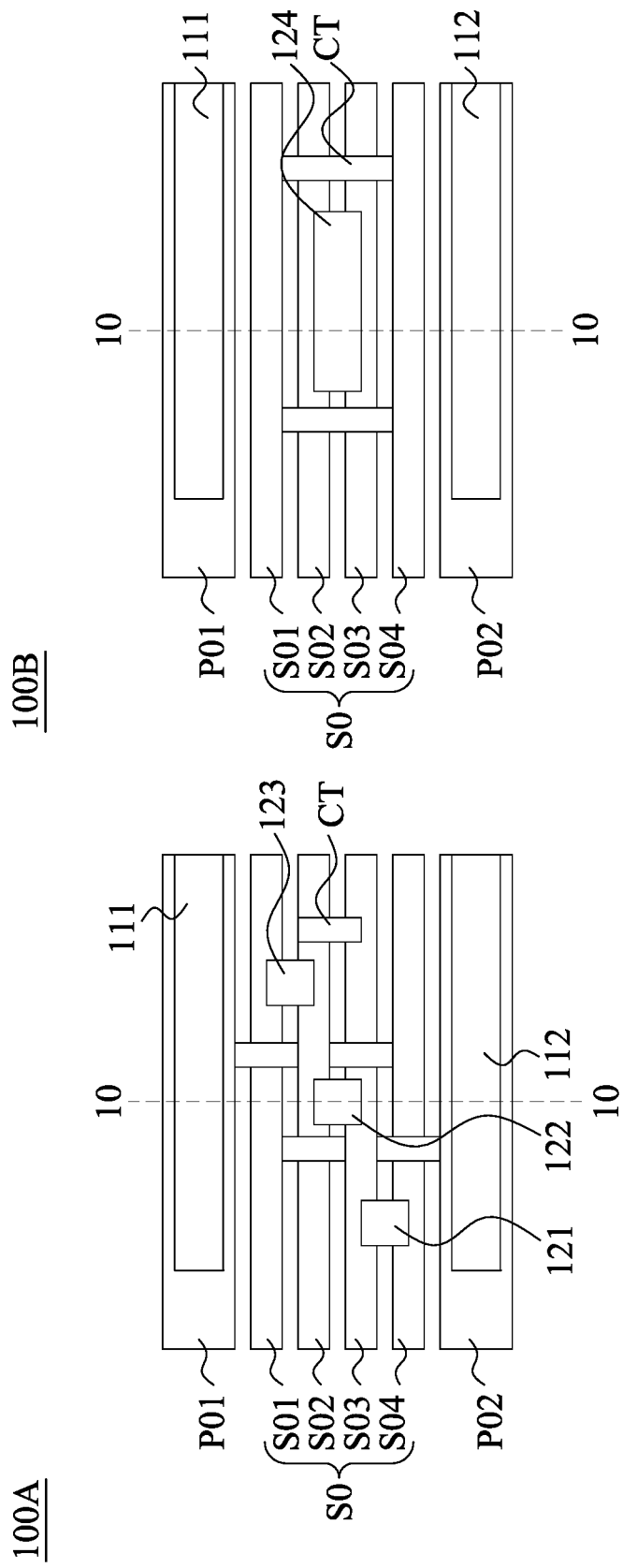

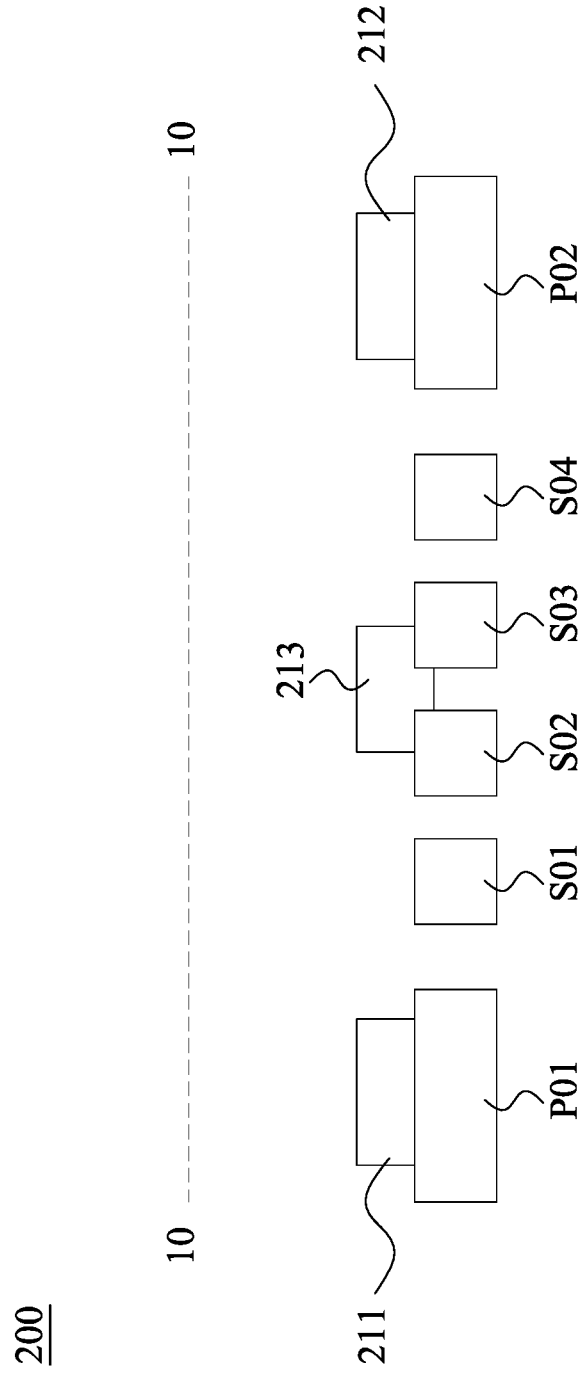

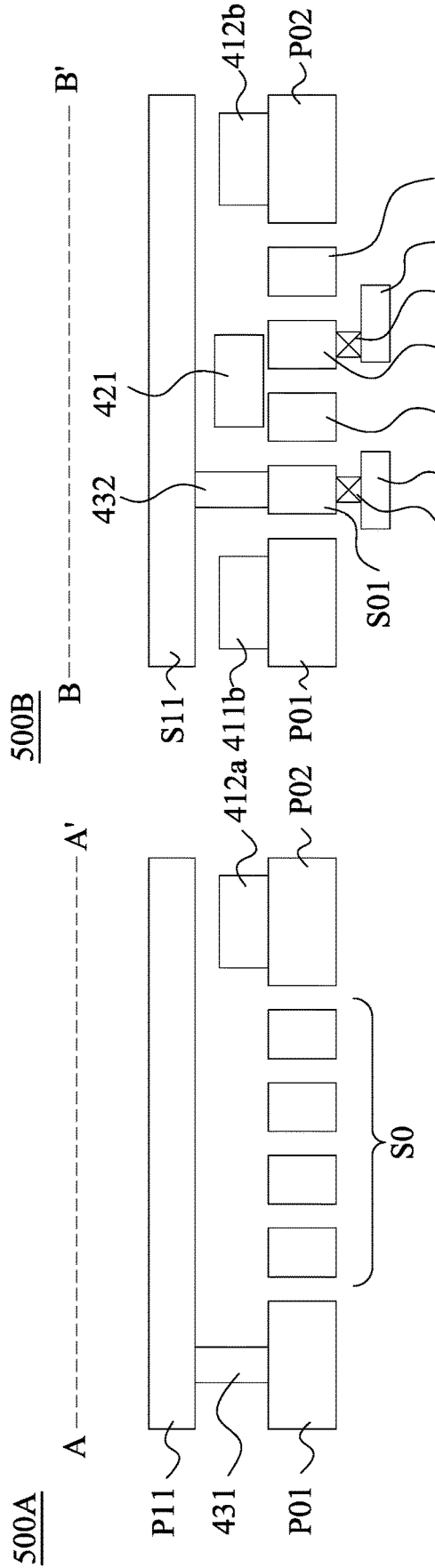
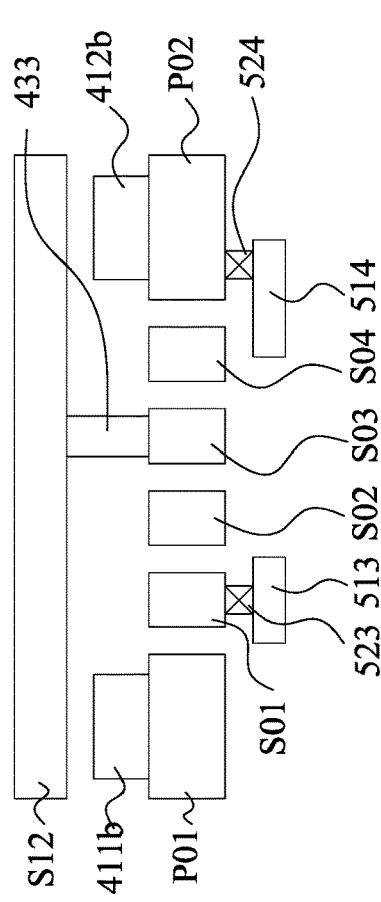

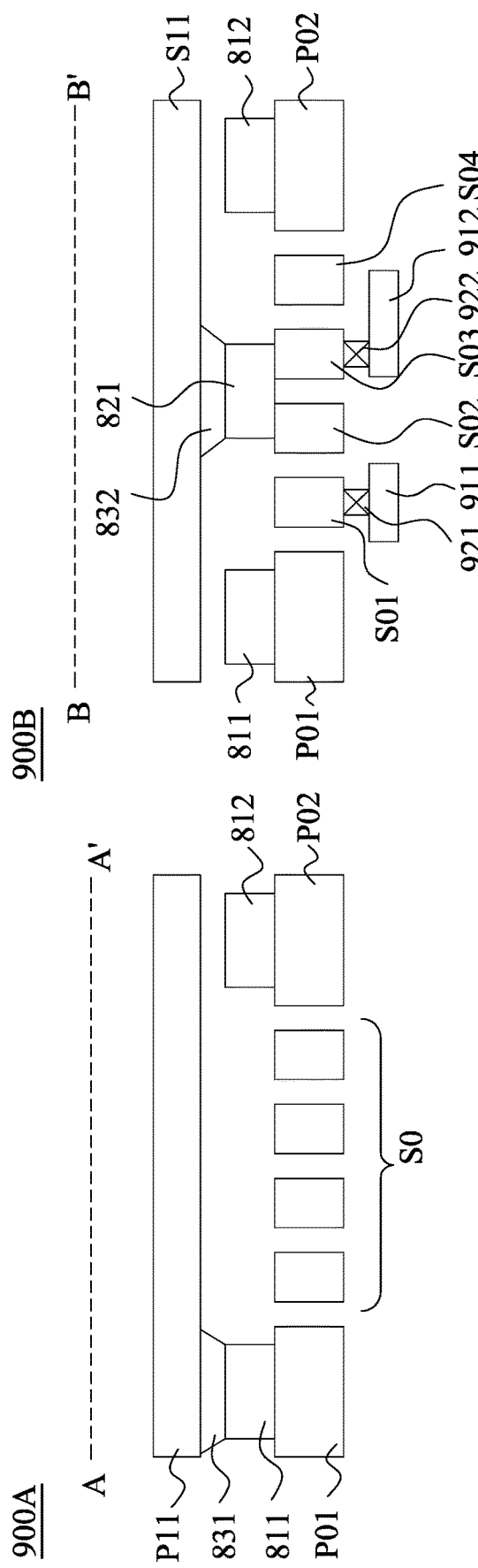

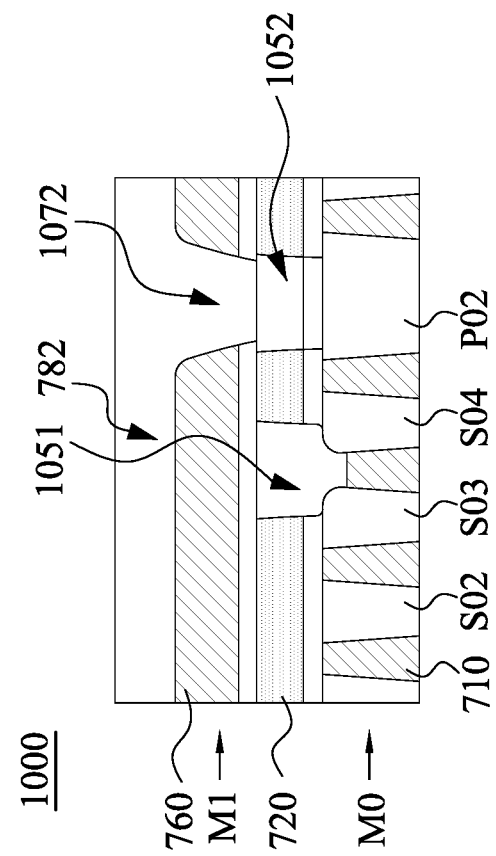
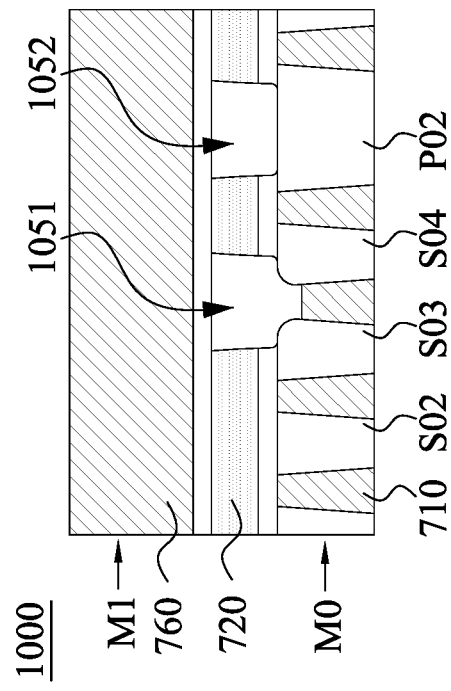
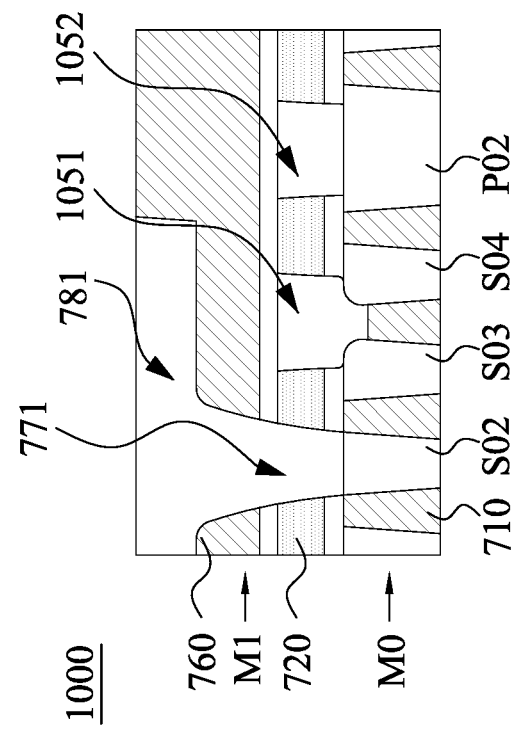
Fig. 10A
Fig. 10B
Fig. 10C

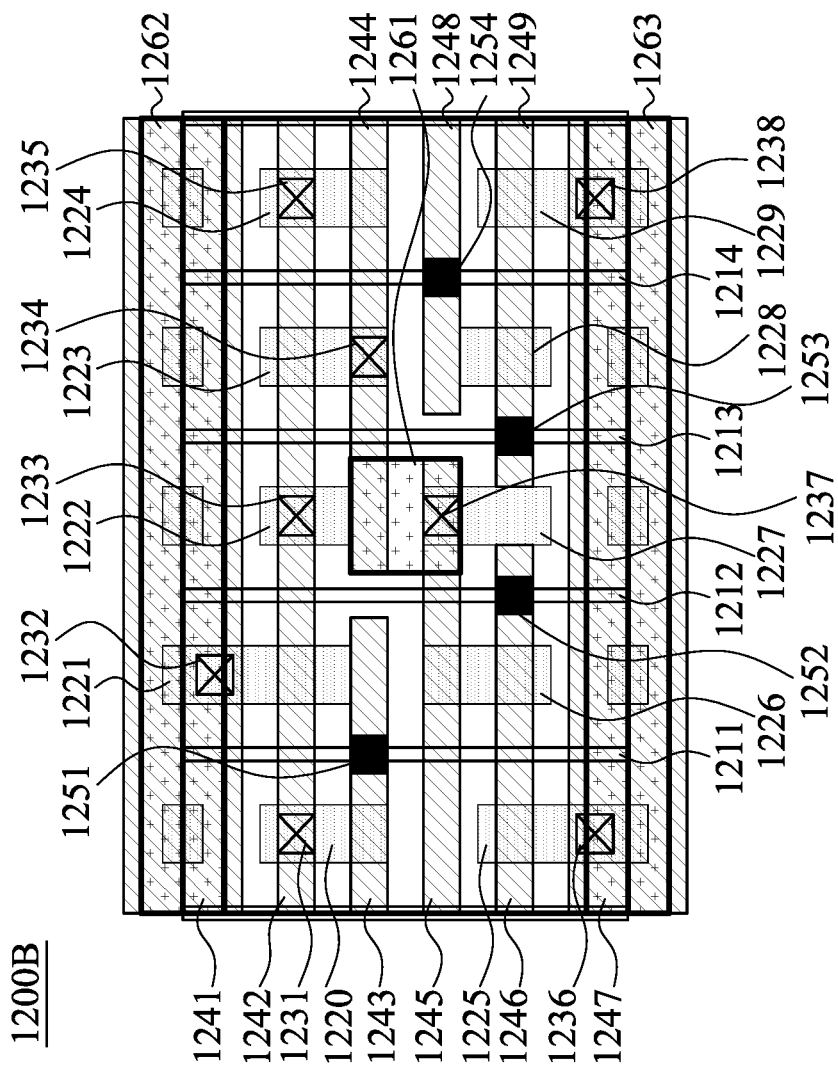
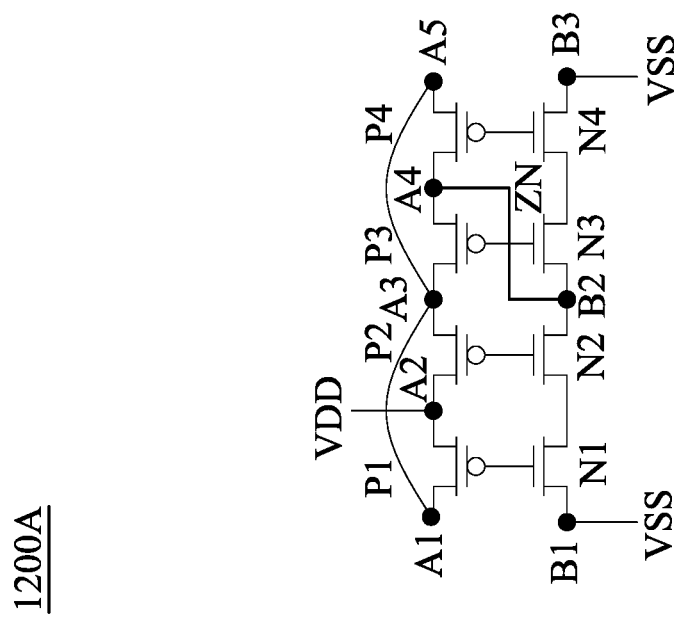
FIG. 12B
FIG. 12A

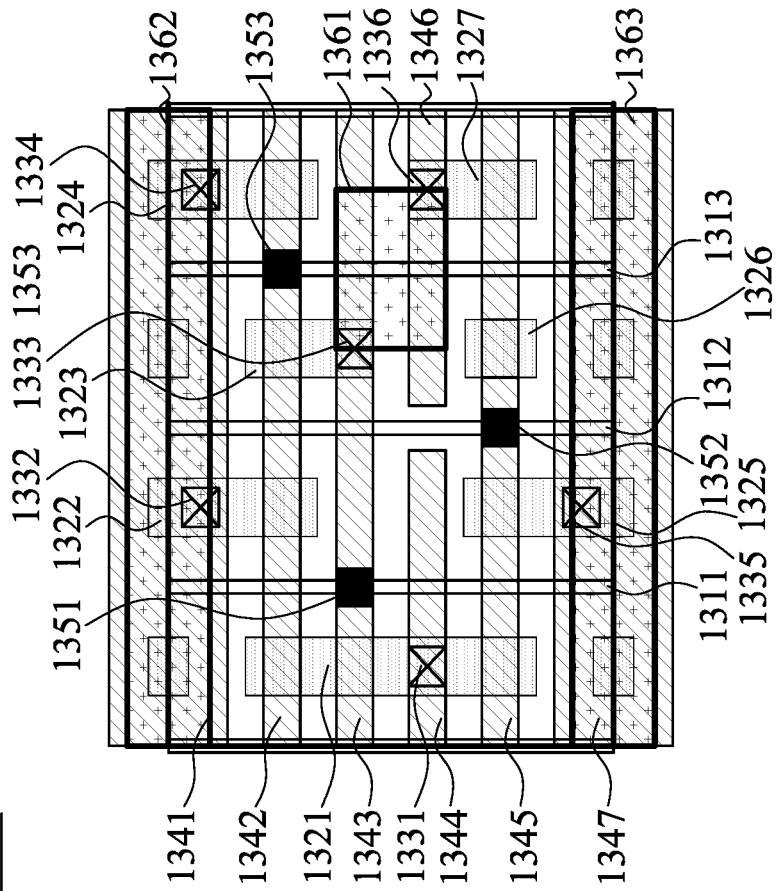
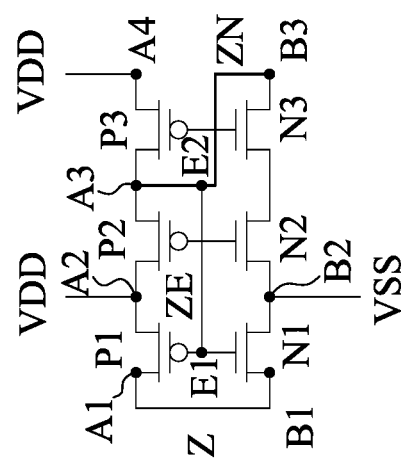
FIG. 13B
FIG. 13A

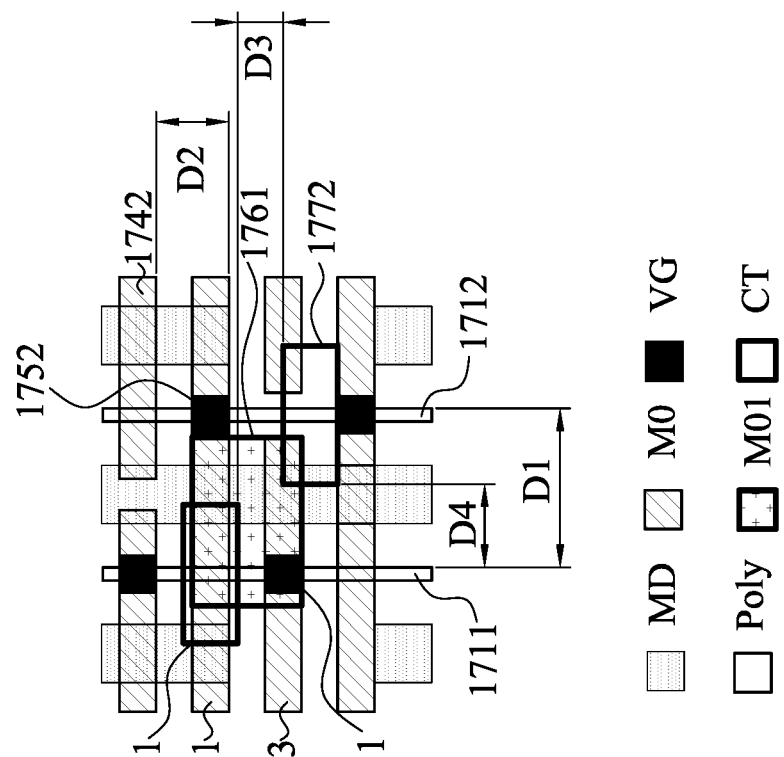
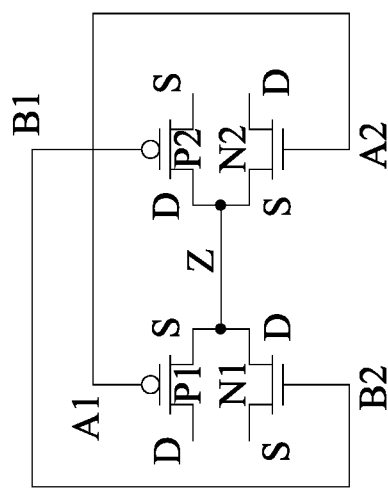
FIG. 17A
FIG. 17B

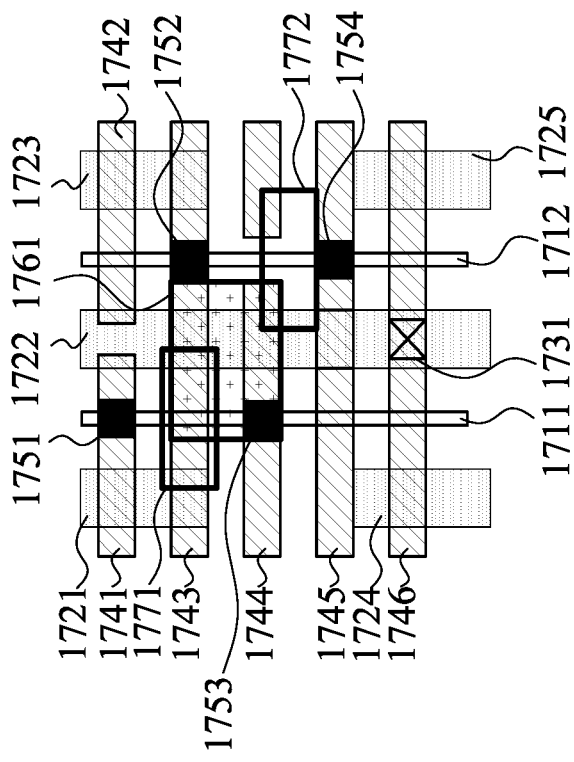
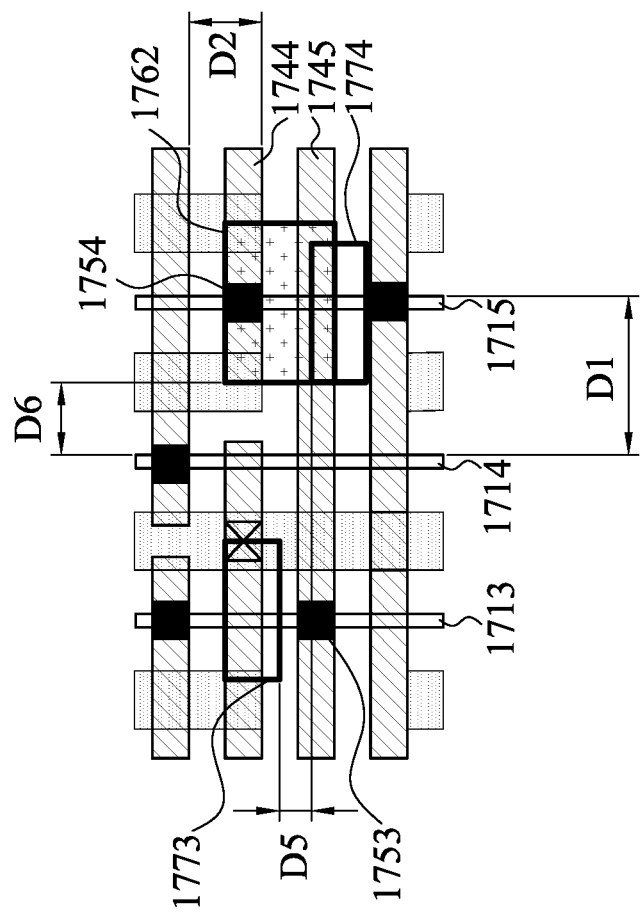
FIG. 17C
FIG. 17D

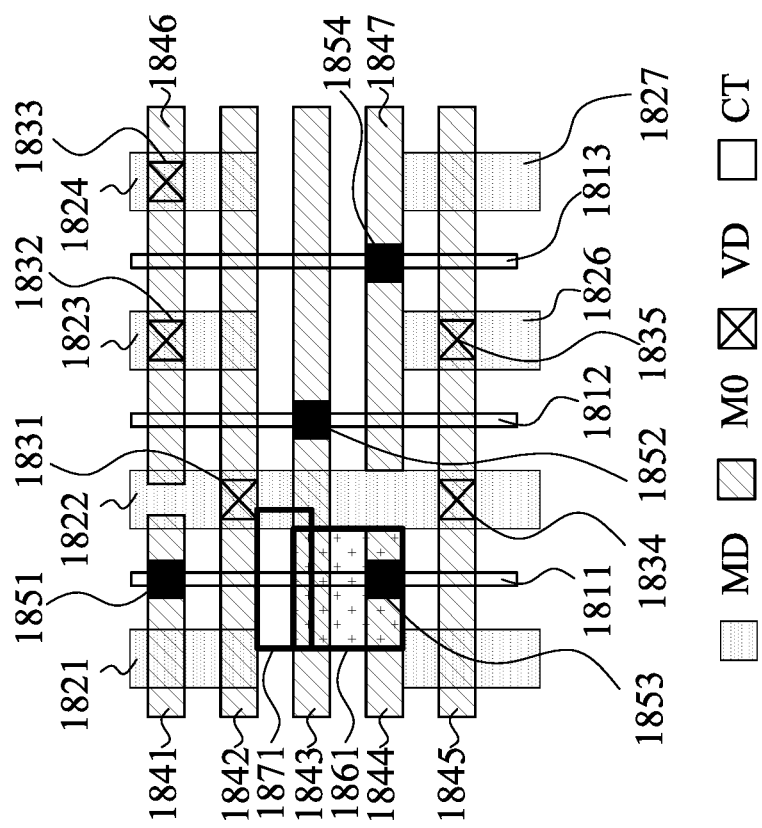
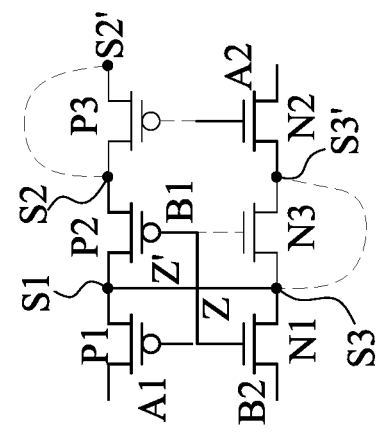
FIG. 18B
FIG. 18A

INTEGRATED CIRCUIT

CROSS-REFERENCE

The present application is a continuation application of U.S. application Ser. No. 17/035,160, filed Sep. 28, 2020, now U.S. Pat. No. 11,817,392, issued Nov. 14, 2023, the full disclosures of which are incorporated herein by reference.

BACKGROUND

Integrated circuits (ICs) have experienced exponential growth. The design of the ICs has produced generations with smaller size and having more complicated circuits. Increasingly dense ICs result in benefits in terms of speed, functionality and cost, but cause increasingly difficult design and fabrication issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 1B are layout diagrams of an integrated circuit (IC), in accordance with some embodiments of the present disclosure.

FIG. 2 is a cross-section schematic diagram of a layout diagram corresponding to the layout diagram of FIG. 1A or 1B, in accordance with some embodiments of the present disclosure.

FIGS. 5A to 5C are cross-section schematic diagrams of layout diagrams corresponding to the layout diagram of FIG. 4, in accordance with some embodiments of the present disclosure.

FIGS. 9A to 9C are cross-section schematic diagrams of layout diagrams corresponding to the layout diagram of FIG. 8, in accordance with some embodiments of the present disclosure.

FIGS. 10A to 10C are schematic diagrams, in cross-sectional view of part of an IC corresponding to the IC of FIG. 8, illustrating various processes of the method of FIG. 6, in accordance with some embodiments of the present disclosure.

FIG. 12A is a circuit diagram of an IC, in accordance with some embodiments of the present disclosure.

FIG. 12B is a layout diagram of an IC corresponding to the IC of FIG. 12A, in accordance with some embodiments of the present disclosure.

FIG. 13A is a circuit diagram of an IC, in accordance with some embodiments of the present disclosure.

FIG. 13B is a layout diagram of an IC corresponding to the IC of FIG. 13A, in accordance with some embodiments of the present disclosure.

FIG. 17A is a circuit diagram of an IC, in accordance with some embodiments of the present disclosure.

FIGS. 17B to 17E is a layout diagram of an IC corresponding to the IC of FIG. 17A, in accordance with some embodiments of the present disclosure.

FIG. 18A is a circuit diagram of an IC, in accordance with some embodiments of the present disclosure.

FIG. 18B is a layout diagram of an IC corresponding to the IC of FIG. 18A, in accordance with some embodiments of the present disclosure.

DETAILED DESCRIPTION

Figure 3A:
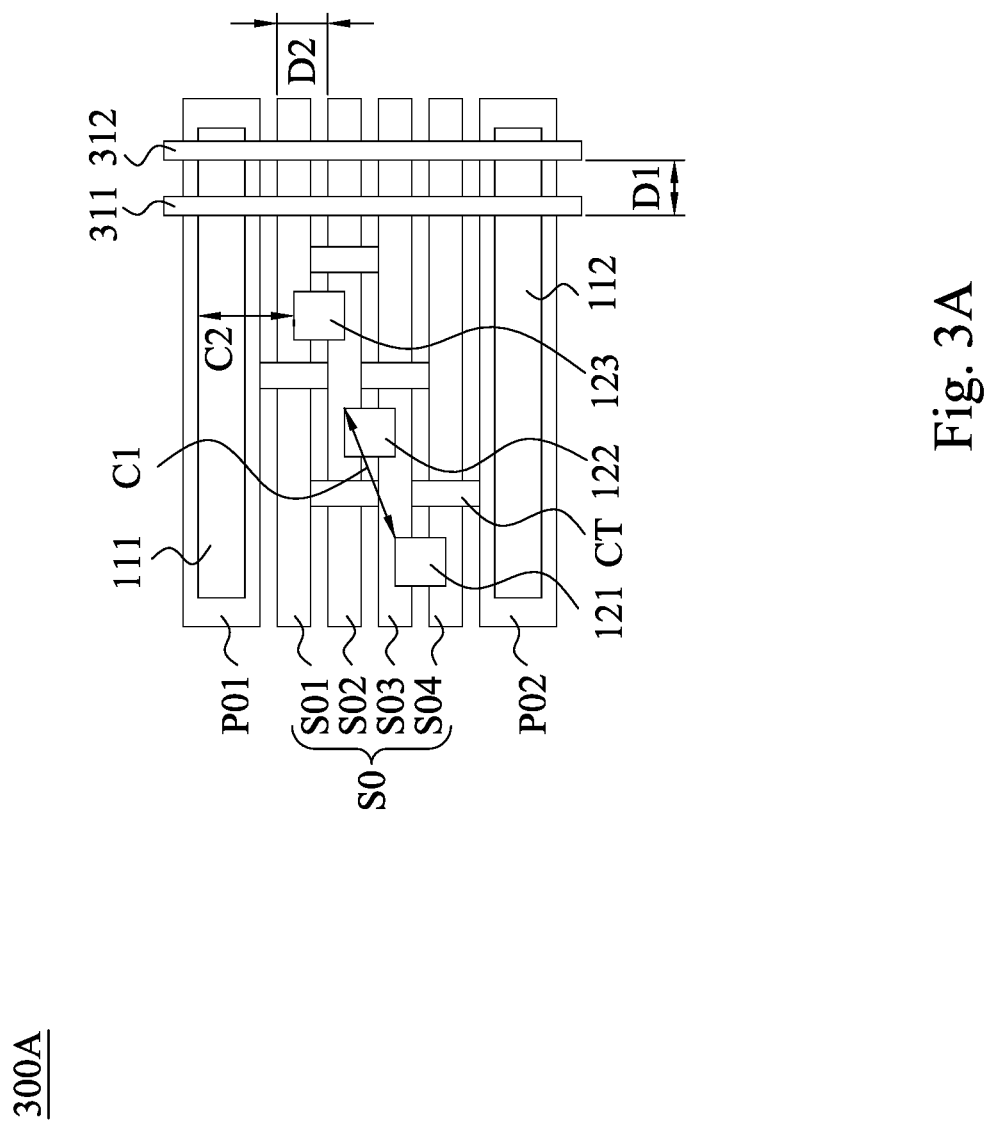
FIGS. 3A to 3C are layout diagrams of an IC, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIGS. 1A and 1B. FIG. 1A is a layout diagram 100A of an integrated circuit (IC), and FIG. 1B is a layout diagram 100B of an IC, in accordance with some embodiments of the present disclosure. For simplicity of illustration of the layout diagram 100A or 100B, it is merely illustrates a few patterns disposed in one metal layer which, for example, in some embodiments, is a metal-zero (M0) layer hereinafter.

For illustration in FIG. 1A, the layout diagram 100A includes conductive rails P01, P02, S01, S02, S03 and S04, conductive segments 111, 112, 121, 122 and 123, and cut segments CT. For simplicity, each of the conductive rails S01, S02, S03 and S04 is referenced as S0 hereinafter for illustration, because each of the conductive rails S01, S02, S03 and S04 operates in a similar way in some embodiments.

The conductive rails P01, P02 and S0 are disposed in the same metal layer which, in some embodiments, the M0 layer, and are separated from each other in a layout view. The conductive rails S0 are disposed between the conductive rails P10 and P20 in a layout view. The conductive segment 111 is disposed on the conductive rail P01, and the conductive segment 112 is disposed on the conductive rail P02. The conductive segments 121-123 are disposed on and between at least two adjacent conductive rails S0. Specifically, the conductive segment 121 is disposed on and disposed between the conductive rails S03 and S04. The conductive segment 122 is disposed on and disposed between the conductive rails S02 and S03. The conductive segment 123 is disposed on and disposed between the conductive rails S01 and S02. Alternatively stated, in a layout view, the conductive segment 121 is partially overlapped with the conductive rails S03 and S04; the conductive segment 122 is partially overlapped with the conductive rails S02 and S03; and the conductive segment 123 is partially overlapped with the conductive rails S01 and S02. Each of the cut segments CT is disposed across one of the conductive rails S0. For example, with reference to FIG. 1A, the cut segment CT with labeling is disposed across the conductive rail S02.

In some embodiments, the conductive rails P01 and P02 are configured to receive power signals (which are discussed at least with reference to FIGS. 4 and 5A to 5C) that are disposed in another metal layer which, for example, in some embodiments, is a first metal (M1) layer hereinafter. The M1 layer is disposed above the M0 layer where disposed the conductive rails P01 and P02. In various embodiments, the conductive rails P01 and P02 are indicated as power conductive rails, for transmitting the power signals including, for example, supply voltage signals (which is indicated as VDD discussed with reference to FIG. 4) or reference voltage signals (which is indicated as VSS discussed with reference to FIG. 4). In some other embodiments, the conductive rails P01 and P02 are referred to as a pair of power conductive rails, and are configured to transmit power signals with voltages that are different from one another.

In some embodiments, the conductive rails S0 are configured to receive data signals that are disposed in a same metal layer where the conductive rails P01 and P02 are disposed (i.e., the M0 layer). In various embodiments, the conductive rails S0 are indicated as signal conductive rails, for transmitting the data signals including, for example, signals (which is indicated as D1 and D2 shown in FIG. 4). In some other embodiments, at least two conductive rails S0 are coupled to each other, for transmitting the same data signals.

In some embodiments, each of the cut segments CT is configured to cut off at least one pattern in the layout diagram 100A, for separating this pattern into two portions. In various embodiments, the cut segments CT are removed before generating a layout diagram for fabricating the IC.

In some embodiments, the conductive segments 111 and 112 are shaped as extending rails that are similar to the conductive rails P01 and P02. In various embodiments, the conductive segment 111 is coupled to the conductive rail P01, and is spaced apart from the power signal that is disposed in M1 layer and is coupled to the conductive rail P01. In further embodiments, the conductive segment 111 contacts the conductive rail P01. Similarly, the conductive segment 112 is coupled to the conductive rail P02, and is spaced apart from the power signal that is disposed in M1 layer and is coupled to the conductive rail P02. In further embodiments, the conductive segment 112 contacts the conductive rail P02. In various embodiments, the conductive segments 111 and 112 are indicated as "V0 rail", for forming additional conductive segments/traces/tracks/patterns on the conductive rails P01 and P02. Alternatively stated, a height of the conductive rails P01 or P02 in the M0 layer is increased by disposing the conductive segments 111 or 112 on and above the conductive rails P01 or P02. In some other embodiments, the conductive rails P01 and P02, and the conductive segments 111 and 112 are made of a metal material that is same as one another.

In some embodiments, the conductive segments 121, 122 and 123 are shaped as a block. In various embodiments, the conductive segment 121 is coupled between the conductive rails S03 and S04, and is spaced apart from the data signal (which is discussed at least with reference to FIGS. 4 and 5A to 5C) that is disposed in M1 layer. In further embodiments, the conductive segment 121 contacts the conductive rails S03 and S04. Similarly, the conductive segment 122 is coupled between the conductive rails S02 and S03, and the conductive segment 123 is coupled between the conductive rails S01 and S02. Each of the conductive segments 122 and 123 is spaced apart from the data signal that is disposed in M1 layer. In further embodiments, the conductive segment 122 contacts the conductive rails S02 and S03; and the conductive segment 123 contacts the conductive rails S01 and S02. In various embodiments, the conductive segments 121, 122 and 123 are indicated as "M0 jumper", for forming additional conductive segments/traces/tracks/patterns on the conductive rails S0, and disposing across at least two adjacent conductive rails S0. Alternatively stated, a height of the conductive rails S0 in the M0 layer is increased by disposing the conductive segments 121, 122 or 123 on and above the conductive rails S0. In some other embodiments, the conductive rails S0, and the conductive segments 121, 122 and 123 are made of a metal material that is same as one another.

The layout diagram 100B of the IC has a configuration similar to that of the layout diagram 100A of the IC as illustrated in FIG. 1A, and similar detailed description is therefore omitted. Compared to FIG. 1A, the layout diagram 100B shown in FIG. 1B includes a conductive segment 124, rather than the conductive segments 121-123, disposed on the conductive rails S0. The conductive segment 124 is disposed on and disposed between the conductive rails S02 and S03. Alternatively stated, in a layout view, the conductive segment 124 is partially overlapped with the conductive rails S02 and S03. In some embodiments, the conductive segment 124 has a configuration or arrangement similar to the conductive segments 121-123 shown in FIG. 1A.

The number and arrangement of conductive segments or conductive rails shown in FIGS. 1A and 1B are given for illustrative purposes. Various numbers and arrangements of conductive segments or conductive rails to implement the layout diagram 100A in FIG. 1A or the layout diagram 100B in FIG. 1B are within the contemplated scope of the present disclosure. For example, in some embodiments, in addition to the conductive segments 121, 122 and 123 or the conductive rails P01, P02 and S0 shown in FIG. 1A, the layout diagram 100A further includes the conductive rails disposed between the conductive rails P01, P02 and next to the conductive rails S0, in a layout view.

Reference is now made to FIG. 2. FIG. 2 is a cross-section schematic diagram of a layout diagram 200 corresponding to the layout diagram 100A of FIG. 1A or the layout diagram 100B of FIG. 1B, taken along a line 10-10, in accordance with some embodiments of the present disclosure. The layout diagram 200 with respect to the embodiments of FIG. 1A or 1B, like elements in FIG. 2 are designated with the same reference numbers for ease of understanding.

For illustration in FIG. 2, the conductive segments 211 and 212 are disposed on the conductive rails P10 and P20, respectively, as discussed with embodiments shown in FIGS. 1A and 1B. The conductive segment 213 is disposed on two adjacent conductive rails S02 and S03. Furthermore, a part of the conductive segment 213 is disposed in a space between the conductive rails S02 and S03, in a direction along the line 10-10 which is also referred to as a column direction with reference to FIGS. 1A-1B. Alternatively stated, the conductive segment 213 is disposed stuck between the conductive rails S02 and S03.

Figure 3B:
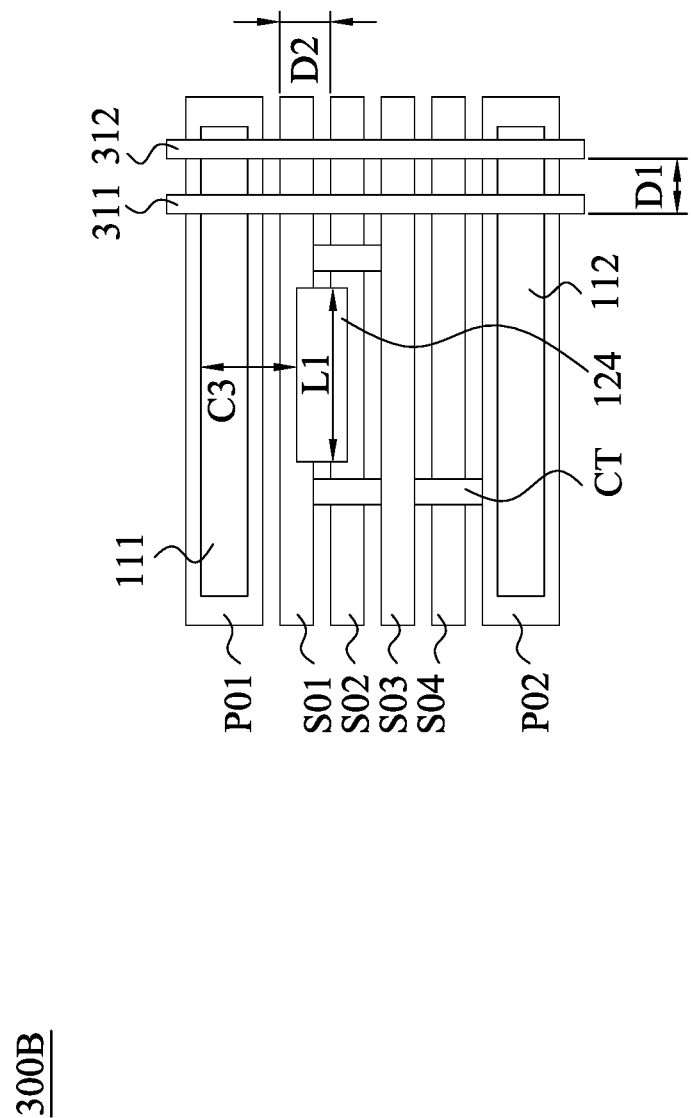
Figure 3C:
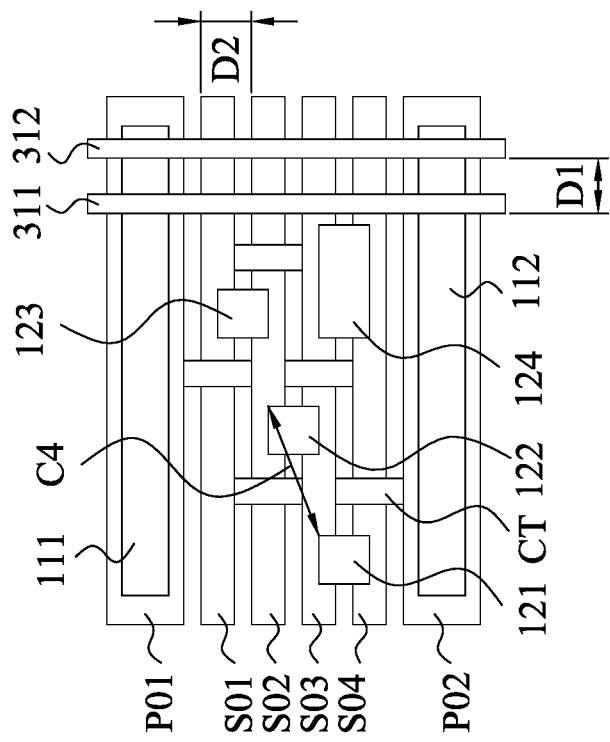

Reference is now made to FIGS. 3A to 3C. FIGS. 3A to 3C are layout diagrams 300A, 300B and 300C of an IC, in accordance with some embodiments of the present disclosure. Each of the layout diagrams 300A, 300B and 300C of the IC has a configuration similar to that of the layout diagram 100A of the IC as illustrated in FIG. 1A or the layout diagram 100B of the IC as illustrated in FIG. 1B, and similar detailed description is therefore omitted. Each of the layout diagrams 300A, 300B and 300C with respect to the embodiments of FIG. 1A or 1B, like elements in FIGS. 3A to 3C are designated with the same reference numbers for ease of understanding.

Compared to FIG. 1A or 1B, each of the layout diagrams 300A, 300B and 300C shown in FIGS. 3A to 3C further includes gate segments 311 and 312 disposed across the conductive rails P01 and P02 and the conductive rails S0, in a layout view. As illustrated in FIGS. 3A to 3C, the conductive rails P01, P02 and S0 extend along a row direction, and the gate segments 311 and 312 extend along a column direction that is substantially perpendicular to the row direction.

In some embodiments, the gate segments 311 and 312 are formed in an active area that is below the M0 layer, for forming gate terminals of transistors included in the IC. In various embodiments, the gate segments 311 and 312 include polysilicon (PO), and are formed by a gate forming process, which is also referred to as an "PO process" using a polysilicon mask.

In some embodiments, a distance between two adjacent gates which are, for example, with reference to FIGS. 3A to 3C, the gate segments 311 and 312, is indicated as a gate pitch D1. The gate pitch D1 is also referred to as a poly pitch D1 hereinafter. In some other embodiments, a distance between two adjacent conductive rails which are, for example, with reference to FIGS. 3A to 3C, the rail segments S01 and S02, is indicated as a M0 pitch D2. In alternative embodiments, at least one of the poly pitch D1 or the M0 pitch D2 is limited by design rules in the layout diagram of the IC, and the design rules are associated with the fabrication processes or technologies of the IC.

For illustration in FIG. 3A, the layout diagram 300A includes conductive segments 121, 122 and 123 shaped as blocks and disposed on and between the conductive rails S0. The layout diagram 300A also includes a pair of conductive segments 111 and 112 shaped as extending rails and disposed on a pair of conductive rails P01 and P02, respectively. For each of the conductive segments 121, 122 and 123, it is shaped as a square, and a width of each of the conductive segments 121, 122 and 123 is approximately equal to one M0 pitch D2. Alternatively stated, a size of each of the conductive segments 121, 122 and 123 is approximately equal to a square of M0 pitch D2 (i.e., M0 pitch D2*M0 pitch D2).

A distance between corresponding corners of two adjacent conductive segments is about in a range of half of one poly pitch D1 to one poly pitch D1 (i.e., 0.5*poly pitch D1~1*poly pitch D1). As illustrated in FIG. 3A, a corner of the conductive segments 121 is separated from a corresponding corner of the conductive segments 122 by a distance C1, and the distance C1 is about in a range discussed above.

Furthermore, a width of each of the conductive segments 111 and 112 is substantially equal to or smaller than a width of each of the conductive rails P01 and P02. In some embodiments, a length of each of the conductive segments 111 and 112 is also substantially equal to or smaller than a length of each of the conductive rails P01 and P02.

A distance between one conductive segment indicated as the V0 rail and one conductive segment indicated as the M0 jumper is about in a range of half of the poly pitch D1 to 1.2 times of the poly pitch D1 (i.e., 0.5*poly pitch D1~1.2*poly pitch D1), in some embodiments. As illustrated in FIG. 3A, the conductive segment 111 is indicated as the V0 rail that is disposed on one of the conductive rails P01 and P02. The conductive segment 123 is indicated as the M0 jumper that is disposed on at least two adjacent conductive rails S0. The conductive segment 111 is separated from the conductive segment 123, which is disposed adjacent to the conductive segment 111, by a distance C2. The distance C2 is about in a range discussed above.

Compared to embodiments illustrated in FIG. 3A, the layout diagram 300B includes one conductive segment 124 shaped as a railed block and disposed on and between the conductive rails S0. The conductive segment 124, it is shaped as a rectangular block, and a length L1 of the conductive segment 124 is greater than twice of the poly pitch D1 (i.e., L1>2*poly pitch D1), in some embodiments.

A distance between one conductive segment indicated as the V0 rail and one conductive segment indicated as the M0 jumper is about in a range of half of the poly pitch D1 to one of the poly pitch D1 (i.e., 0.5*poly pitch D1~1*poly pitch D1), in some embodiments. For example, with reference to FIG. 3B, the conductive segment 111 disposed the conductive rail P01 is separated from the conductive segment 124, that is disposed adjacent to the conductive segment 111 and disposed on the conductive rail S01, by a distance C3. The distance C3 is about in a range discussed above.

Compared to embodiments illustrated in FIG. 3A, the layout diagram 300C further includes one conductive segment 124 shaped as a railed block and disposed on and between the conductive rails S0. In some embodiments, the layout diagram 300C is an alternative embodiment combining with the layout diagrams 300A and 300B.

Each of the conductive segments 121, 122 and 123 is shaped as a square, and a width of the same is approximately equal to one M0 pitch D2. Alternatively stated, a size of each of the conductive segments 121, 122 and 123 is approximately equal to a square of M0 pitch D2 (i.e., M0 pitch D2*M0 pitch D2). Similar to that illustrated in FIG. 3A, a distance between two adjacent conductive segments 121, 122 or 123 is about in a range of half of one poly pitch D1 to one poly pitch D1 (i.e., 0.5*poly pitch D1~1*poly pitch D1). For example, with reference to FIG. 3C, a distance between a corner of the conductive segments 121 and a corresponding corner of the conductive segment 122 is indicated as a distance C4. The distance C4 is in a range of 0.5*poly pitch D1 to 1*poly pitch D1. Furthermore, a length or width of the conductive segments 111 or 112 is also substantially equal to or smaller than a length or a width of the conductive rails P01 or P02.

In some embodiments, a distance between one conductive segment indicated as the V0 rail and another conductive segment indicated as the M0 jumper is not limited in the layout diagram 300C. For example, with reference to FIG. 3C, a distance between the conductive segment 111 indicated as the V0 rail and the conductive segment 124 indicated as the M0 jumper may be smaller than 0.5*poly pitch D1.

In some embodiments, the layout diagram 300C is generated by at least one mask (which is discussed with reference to FIG. 22). For example, the conductive segments 111 and 112 are patterned by utilizing a first mask. The remaining conductive segments 121, 122 and 123 are patterned by utilizing a second mask. Accordingly, the layout diagram 300C has less design limitations compared to the layout diagram 300A or 300B that is patterned by one mask.

The configuration and arrangement of the layout diagrams 300A, 300B and 300C shown in FIGS. 3A to 3C is given for illustrative purposes. Various configurations and arrangements of the layout diagrams 300A, 300B and 300C to implement the IC are within the contemplated scope of the present disclosure. For example, in some embodiments, in a layout view, at least one of the conductive segments 121, 122, 123 or 124 is disposed on and between or across more than three conductive rails S0.

Figure 4:
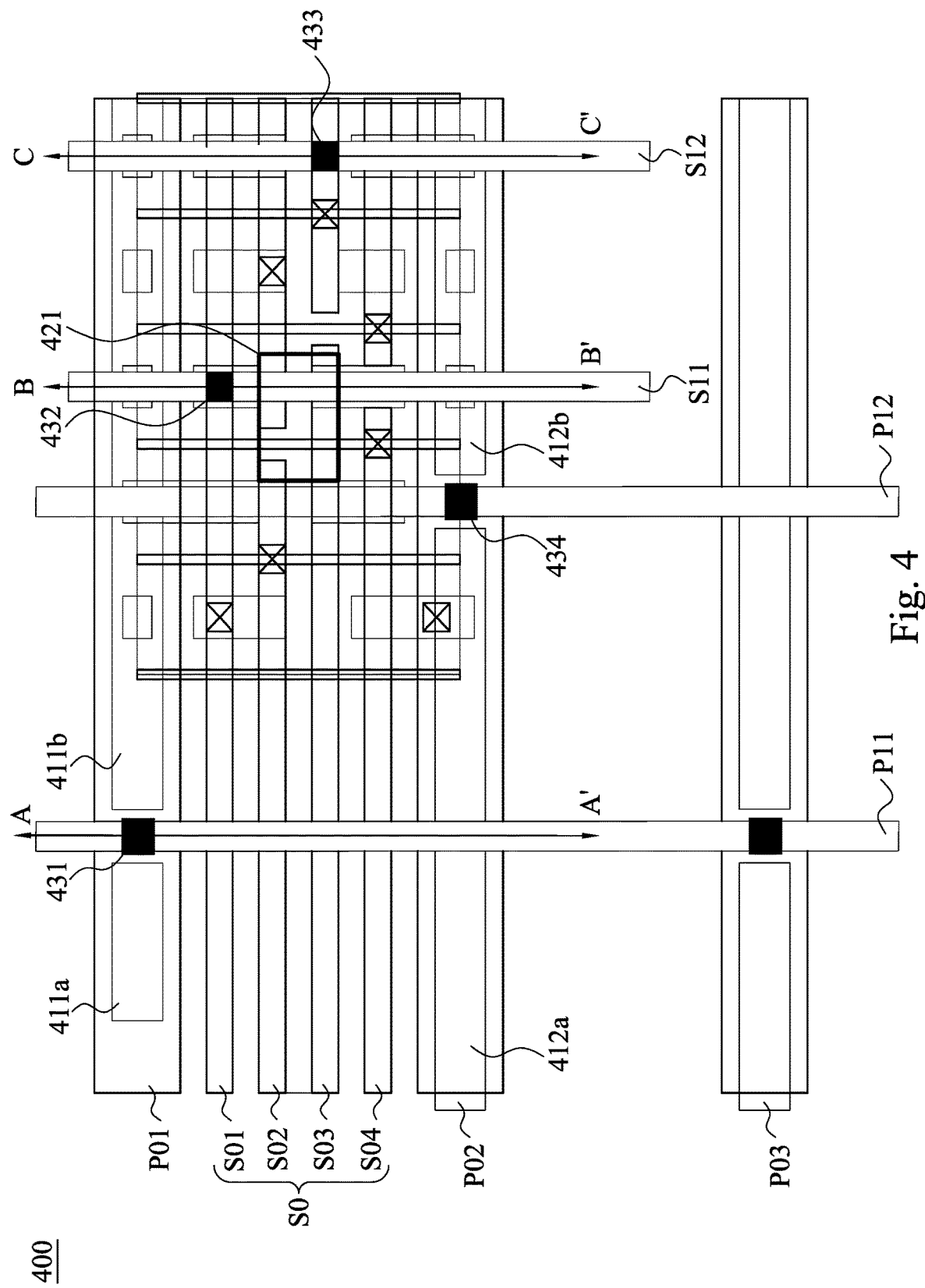
FIG. 4 is a layout diagram of an IC, in accordance with some embodiments of the present disclosure.

Reference is now made to FIG. 4. FIG. 4 is a layout diagram 400 of an IC, in accordance with some embodiments of the present disclosure. The layout diagram 400 with respect to the embodiments of FIG. 1A or 1B, like elements in FIG. 4 are designated with the same reference numbers for ease of understanding.

For illustration in FIG. 4, the layout diagram 400 includes conductive rails P01, P02 and P03, and conductive rails S01, S02, S03 and S04 disposed in the M0 layer and extending along a row direction. In some embodiments, the conductive rails S01, S02, S03 and S04 are referenced as S0 hereinafter for simplicity of illustration. In a layout view, the conductive rails P01 and P02 are separated from one another by the conductive rails S0, and the conductive rails P02 and P03 are separated from one another by additional conductive rails that are not shown in FIG. 4. In some embodiments, the conductive rail P01 is identical to the conductive rail P03. The conductive rails P01, P02, and S0 of the layout diagram 400 have configurations similar to that of the layout diagram as illustrated in FIG. 1A, and similar detailed description is therefore omitted.

The layout diagram 400 further includes conductive segments 411a, 411b, 412a, 412b and 421 disposed on the conductive rails P01, P02, and S0, signal rails P11, P12, S11 and S12 disposed in the M1 layer, and vias 431, 432, 433 and 434 disposed between the M0 layer and the M1 layer. The signal rails P11, P12, S11 and S12 are separated from each other, and extend along a column direction, in a layout view. Alternatively stated, in a layout view, the signal rails P11, P12, S11 and S12 are disposed above and across the conductive rails P01, P02, P03 and S0. The vias 431, 432, 433 and 434 are overlapped with at least two of the conductive rails P01, P02 and S0 and the signal rails P11, P12, S11 and S12, in a layout view. Specifically, in a layout view, the via 431 is overlapped with the conductive rail P01 and the signal rail P11; the via 434 is overlapped with the conductive rail P02 and the signal rail P12; the via 432 is overlapped with the conductive rail S01 and the signal rail S11; and the via 433 is overlapped with the conductive rail S03 and the signal rail S12.

The conductive segments 411a and 411b are disposed on the conductive rail P01 and are separated from each other, in a layout view. The via 431 is disposed between the conductive segments 411a and 411b, in a layout view. Alternatively stated, one conductive segment indicated as the V0 rail is disposed on the conductive rail P01. Such conductive segment includes several separated portions including, for example, with reference to FIG. 4, the conductive segments 411a and 411b. In addition, at least one via is disposed between these separated portions, in a layout view. With reference to FIG. 4, the via 431 is disposed between the separated portions which are the conductive segments 411a and 411b, in a layout view. Similarly, the conductive segments 412a and 412b are disposed on the conductive rail P02, and are separated from each other in a layout view. The via 434 is disposed between the conductive segments 412a and 412b, in a layout view.

The conductive segment 421 is disposed on and disposed between the conductive rails S02 and S03. The conductive segment 421 is shaped as a railed block and extends along the row direction. Alternatively stated, at least one conductive segment indicated as the M0 jumper extends parallel to the conductive rails S0. Such conductive segment is disposed on and between the conductive rails S0, and is separated from another conductive segment indicated as the V0 rail in a layout view, in some embodiments. For example, the conductive segment 421 that is indicated as the M0 jumper is separated from the conductive segment 411b or 412b that is indicated as the V0 rail, in a layout view.

In some embodiments, the signal rails P11 and P12 are configured to provide power signals to the conductive rails P01 and P02. In various embodiments, the signal rail P11 is configured to provide a voltage signal that is different from that of the signal rail P12. For example, the signal rail P11 is configured to provide the supply voltage signal with voltage VDD, and the signal rail P12 is configured to provide the reference voltage signal with voltage VSS. The voltage VDD is higher than the voltage VSS which, in some embodiments, is referred to as a ground. In alternative embodiments, the signal rails P11 and P12 are indicated as power rails, for providing the power signals (e.g., VDD or VSS) to the power conductive rails including, for example, the conductive rails P01, P02 and P03.

In some embodiments, the signal rails S11 and S12 are configured to provide data signals to the conductive rails S0. In various embodiments, the signal rail S11 is configured to provide a data signal that is different from that of the signal rail S12. For example, the signal rail S11 is configured to provide a control signal for controlling first transistors, and the signal rail S12 is configured to provide another control signal for controlling second transistors. In alternative embodiments, the signal rails S11 and S12 are indicated as data rails, for providing the data signals to the signal conductive rails including, for example, the conductive rails S01 to S04.

Reference is now made to FIGS. 5A to 5C. FIG. 5A is a cross-section schematic diagram of a layout diagram 500A corresponding to the layout diagram 400 of FIG. 4, taken along a line A-A'; FIG. 5B is a cross-section schematic diagram of a layout diagram 500B corresponding to the layout diagram 400 of FIG. 4, taken along a line B-B'; and FIG. 5C is a cross-section schematic diagram of a layout diagram 500C corresponding to the layout diagram 400 of FIG. 4, taken along a line C-C', in accordance with some embodiments of the present disclosure. The layout diagrams 500A to 500C with respect to the embodiments of FIG. 4, like elements in FIGS. 5A to 5C are designated with the same reference numbers for ease of understanding.

For illustration in FIG. 5A, the signal rail P11 extends along the line A-A' and across from the conductive rails P01, S0 to the conductive rail P02. The via 431 is disposed between the conductive rail P01 and the signal rail P11 without extra spacing. The conductive segment 412a is disposed on the conductive rail P02 and is spaced apart from the signal rail P11. With above configurations, a height of the conductive segment 412a is smaller than a height of the via 431.

In some embodiments, the conductive rail P01 is coupled through the via 431 to the signal rail P11, for receiving the supply voltage signal with voltage VDD. With the above configurations, since the conductive segment 412a is separated from the signal rail P11, the conductive segment 412a or the conductive rail P02 is not coupled to or does not contact the signal rail P11. In various embodiments, both of the conductive segment 412a and the conductive rail P02 are coupled to the ground by separating from the signal rail P11. In addition, the conductive rail P02 is not coupled to any signal rails disposed in the M1 layer, and is indicated as a ground rail. Similarly, since the conductive rails S0 are separated from the signal rail P11, these conductive rails S0 are not coupled to the signal rail P11.

For illustration in FIG. 5B, the signal rail S11 extends along the line B-B' and across from the conductive rails P01, S0 to the conductive rail P02. The conductive segment 411b is disposed on the conductive rail P01 and is spaced apart from the signal rail S11. Similarly, the conductive segment 412b is disposed on the conductive rail P02 and is spaced apart from the signal rail S11. The conductive segment 421 is disposed on two adjacent conductive rails S02 and S03 and is also spaced apart from the signal rail S11. Alternatively stated, each of the conductive segments 411b, 412b and 421 is separated from the signal rail S11 along a vertical direction that is perpendicular to the line B-B' illustrated in FIG. 5B. In addition, the via 432 is disposed between the conductive rail S01 and the signal rail S11 without extra spacing. With above configurations, a height of the conductive segment 411b, 421 or 412b is smaller than a height of the via 432.

Compared to embodiments illustrated in FIG. 5A, the layout diagram 500B further illustrates conductive segments 511 and 512, and vias 521 and 522. The conductive segments 511 and 512 are disposed in the active area (not shown) that is below the M0 layer, and the vias 521 and 522 are disposed between the active area and the M0 layer. Specifically, the via 521 is disposed between the conductive segment 511 and the conductive rail S01 without extra spacing. The via 522 is disposed between the conductive segment 512 and the conductive rail S03 without extra spacing.

In some embodiments, the conductive segment 511 is coupled through the via 521 to the conductive rail S01. The conductive rail S01 is further coupled through the via 432 to the signal rail S11, for receiving the data signal provided to the conductive segment 511. Furthermore, the conductive segment 512 is coupled through the via 522 to the conductive rail S03, and the conductive rail S03 is further coupled through the conductive segment 421 to the conductive rail S02. Alternatively stated, at least two adjacent conductive rails including, for example, the conductive rails S02 and S03, are coupled together through the conductive segment indicated as the M0 jumper including, for example, the conductive segment 421.

In some embodiments, the conductive segments 511 and 512 are disposed in the active area, for forming source or drain terminals of transistors included in the IC. In various embodiments, the conductive segments 511 and 512 are referred to as a metal-like defined (MD) segments hereinafter. In alternative embodiments, the vias 521 and 522, coupled from the MD segments 511 and 512 to other elements of the IC, are referred to as via-defined (VD) vias hereinafter.

In some embodiments, the MD segment includes a portion of at least one metal layer, e.g., one or more of copper (Cu), silver (Ag), tungsten (W), titanium (Ti), nickel (Ni), tin (Sn), aluminum (Al) or another metal or material suitable for providing a low resistance electrical connection between elements included in the IC, i.e., a resistance level below a predetermined threshold corresponding to one or more tolerance levels of a resistance-based effect on circuit performance. In some other embodiments, the MD segment includes a section of the semiconductor substrate and/or an epitaxial layer having a doping level, e.g., based on an implantation process, sufficient to cause the segment to have the low resistance level. In various embodiments, a doped MD segment includes one or more of silicon (Si), SiGe, silicon-carbide (SiC), boron (B), phosphorous (P), arsenic (As), gallium (Ga), a metal as discussed above, or another material suitable for providing the low resistance level. In some embodiments, an MD segment includes a dopant having a doping concentration of about $1*10^{16}$ per cubic centimeter ($cm^{-3}$) or greater.

For illustration in FIG. 5C, the signal rail S12 extends along the line C-C' and across from the conductive rails P01, S0 to the conductive rail P02. The conductive segment 411b is disposed on the conductive rail P01 and is spaced apart from the signal rail S12. Similarly, the conductive segment 412b is disposed on the conductive rail P02 and is spaced apart from the signal rail S12. Alternatively stated, each of the conductive segments 411b and 412b is separated from the signal rail S12 along a vertical direction that is perpendicular to the line C-C' illustrated in FIG. 5C. In addition, the via 433 is disposed between the conductive rail S03 and the signal rail S12 without extra spacing. With above configurations, a height of the conductive segment 411b or 412b is smaller than a height of the via 433.

In some embodiments, the conductive rail S03 is coupled through the via 433 to the signal rail S12, for receiving the data signal provided to the conductive rail S03. The conductive rail P01 or P02 is not coupled to the signal rail P12, for receiving the signal that is equivalently indicated as the ground.

Compared to embodiments illustrated in FIG. 5A, the layout diagram 500C further illustrates MD segments 513 and 514, and VD vias 523 and 524. The via 523 is disposed between the MD segment 513 and the conductive rail S01 without extra spacing, and the via 524 is disposed between the MD segment 514 and the conductive rail P02 without extra spacing. The MD segments 513 and 514 or the vias 523 and 524 have configurations similar to that of the MD segments 511 and 512 or the vias 521 and 522, correspondingly, as illustrated in FIG. 5B, and similar detailed description is therefore omitted.

In some approaches, no other conductive segments disposed on the conductive rails in the M0 layer. With such configuration, a resistance coupled between the conductive rails and the signal rails in the M1 layer is substantially contributed to a height of the conductive rail and a size of the via coupled between the M0 and M1 layers. It affects IR-drop issue and further slows down a working speed of the IC.

Compared to the above approaches, additional conductive segment including, for example, the conductive segment 412a, is disposed on the conductive rails including, for example, the conductive rail P02, in the M0 layer. This additional conductive segment 412a is spaced apart from the M1 layer, for increasing a height of the conductive rail P02 in the M0 layer without changing a cell height of the corresponding layout diagram 400. Accordingly, a resistance of the conductive rail P02 that is also referred to as the power conductive rail is reduced. It is reduced by disposing the conductive segment 412a indicated as the V0 rail on the top surface of the conductive rail P02.

Furthermore, additional conductive segment including, for example, the conductive segment 421, is disposed on and between at least two adjacent conductive rails including, for example, the conductive rails S02 and S03. This additional conductive segment 421 is also spaced apart from the M1 layer, for coupling these two adjacent conductive rails S02 and S03 together as a local interconnection. Accordingly, routings for coupling more than two conductive rails S0 are reduced by disposing the conductive segment 421 that is indicated as the M0 jumper. It further improves the electromagnetic bottleneck of the date signals transmitted in these conductive rails S0 and the IC performance.

Figure 6:
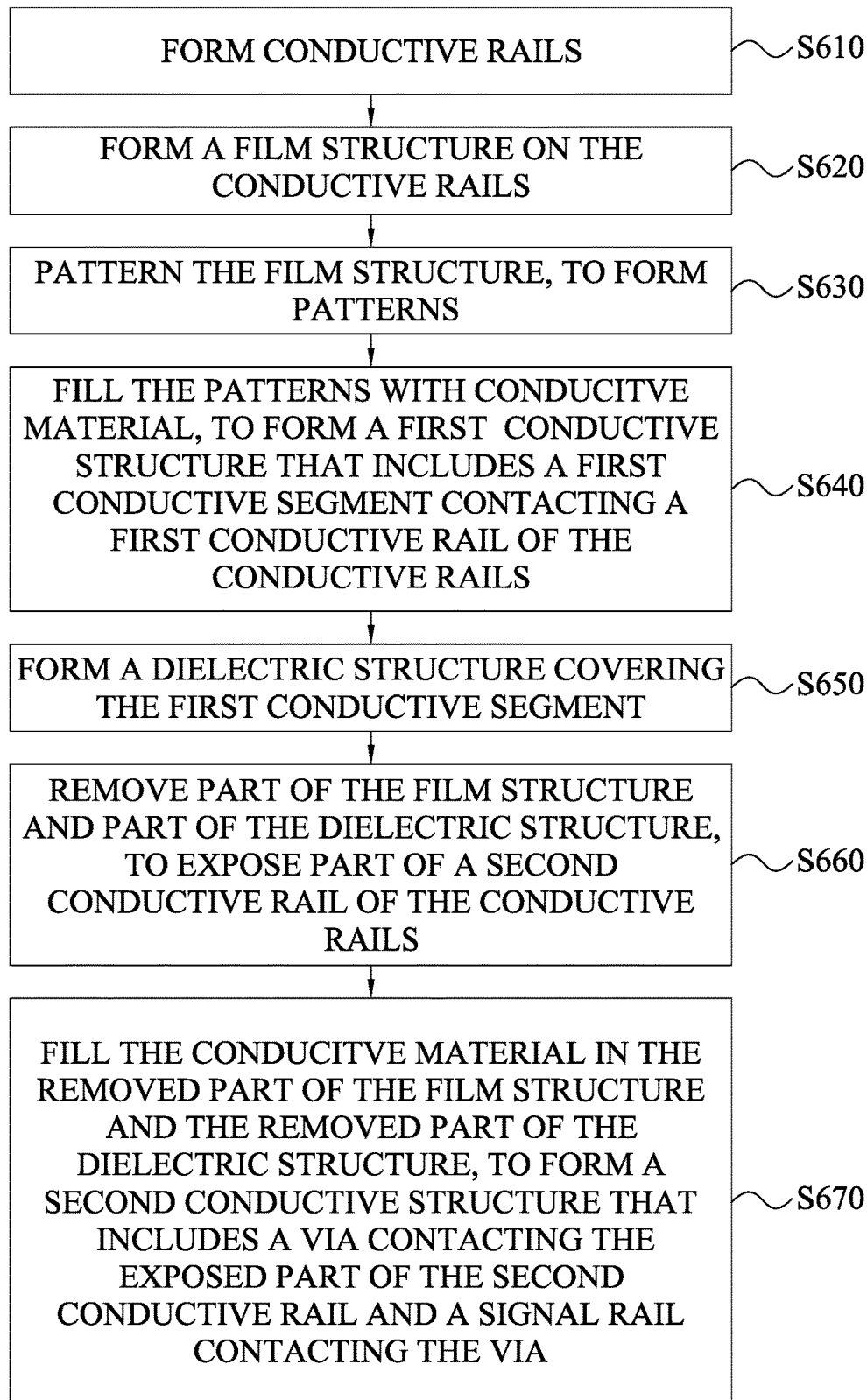
FIG. 6 is a flow chart of a method for manufacturing an IC, in accordance with some embodiments of the present disclosure.

Reference is now made to FIG. 6 and FIGS. 7A to 7G. FIG. 6 is a flow chart of a method 600 for manufacturing an IC including the conductive rails P01, P02 and S0, the conductive segments 411a, 411b, 412a, 412b and 421, and vias 431 to 434 shown in FIG. 4, or an IC shown in FIGS. 7A to 7G, in accordance with some embodiments of the present disclosure. FIGS. 7A to 7G are schematic diagrams, in cross-sectional view of part of the IC 700 corresponding to the IC of FIG. 4 along the column direction as illustrated in FIG. 4, illustrating various processes of the method 600 of FIG. 6, in accordance with some embodiments of the present disclosure. It is understood that additional operations can be provided before, during, and after the processes shown by FIG. 6 and FIGS. 7A to 7G, and some of the operations described below can be replaced or eliminated, for additional embodiments of the method. The order of the operations/processes may be interchangeable. Throughout the various views and illustrative embodiments, like reference numbers are used to designate like elements.

In operation S610 of FIG. 6, multiple conductive rails are formed within the M0 layer of the IC 700. The conductive rails include the conductive rails P01, P02 and S0 illustrated in FIG. 4, and dielectric material stack between these conductive rails.

In operation S620, a film structure is formed on the conductive rails. Accordingly, the film structure is formed on the M0 layer of the IC 700. Alternatively stated, the film is deposited on the M0 layer. The operations S610-S620 are performed as illustrated in FIG. 7A.

Figure 7A:
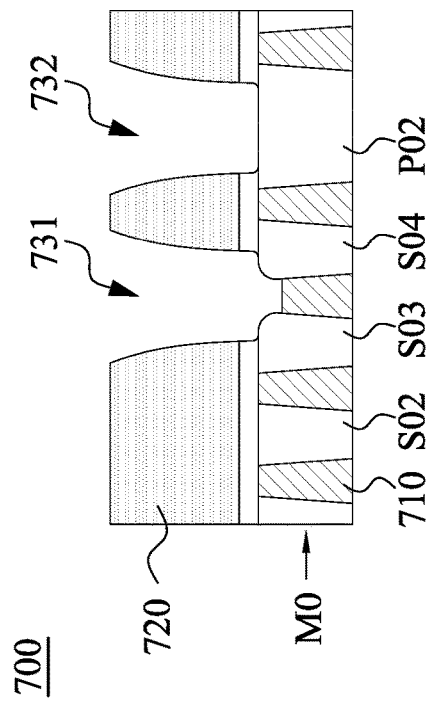
FIGS. 7A to 7G are schematic diagrams, in cross-sectional view of part of an IC corresponding to the IC of FIG. 4, illustrating various processes of the method of FIG. 6, in accordance with some embodiments of the present disclosure.

For illustration, as shown in FIG. 7A, the IC 700 includes conductive rails P02, S02, S03 and S04, and dielectric structure 710 formed in the M0 layer, and includes a film structure 720 formed on the M0 layer. The conductive rails P02, S02, S03 and S04 are separated from each other by the dielectric structure 710. In some embodiments, a material of the dielectric structure 710 is different from a material of the film structure 720. In various embodiments, the dielectric structure 710 and the film structure 720 are isolated from each other. In alternative embodiments, a thickness of the film structure 720 is substantially equal to a distance between the M0 layer and the M1 layer (which is at least shown in FIG. 7E).

In operation S630, the film structure is patterned to form patterns. In some embodiments, the patterning operation is utilized photolithography and etching, for spacing a specific pattern in the film structure. The operation S630 is processed as illustrated in FIG. 7B.

Figure 7B:
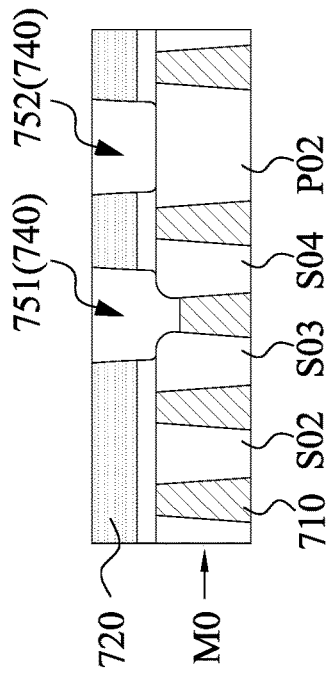

For illustration, as shown in FIG. 7B, patterns 731 and 732 are formed in the film structure 720. Specifically, the pattern 731 is formed in the film structure 720 and formed above and between the conductive rails S03 and S04. At a surface of the M0 layer and a bottom of the film structure 720, a part of the conductive rails S03 and S04 and a part of the film structure 720 are removed to form the pattern 731. Moreover, the pattern 732 is formed in the film structure 720 and formed above and between the conductive rail P02. Similarly, around the surface of the M0 layer, part of the film structure 720 is removed to form the pattern 732.

In operation S640, the patterns are filled with a conductive material, to form a first conductive structure that includes a first conductive segment contacting a first conductive rail of the conductive rails. In some embodiments, the first conductive segment corresponds to at least one of the conductive segment 411a or 411b illustrated in FIG. 4 and the first conductive rail corresponds to the conductive rail P01 illustrated in FIG. 4. In other embodiments, the first conductive segment corresponds to at least one of the conductive segment 412a or 412b illustrated in FIG. 4 and the first conductive rail corresponds to the conductive rail P02 illustrated in FIG. 4. The operation S640 is processed as illustrated in FIGS. 7C-7D.

In some embodiments, the filling operation in S640 is also indicated as a multi-metal gap fill process. In various embodiments, the patterns are filled with the conductive material, for forming interconnect structures between two adjacent metal layers which, for example, are the M0 layer and the M1 layer.

Figure 7C:
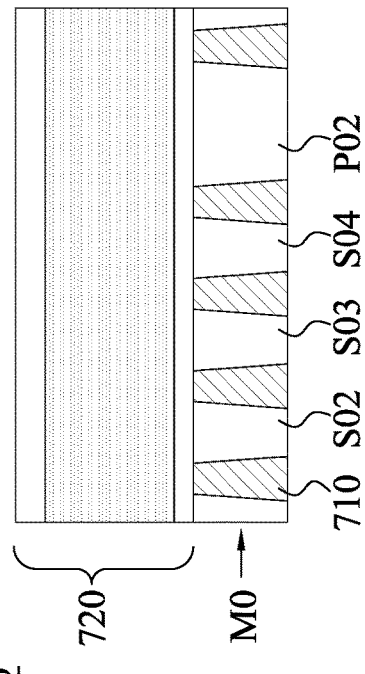
Figure 7D:
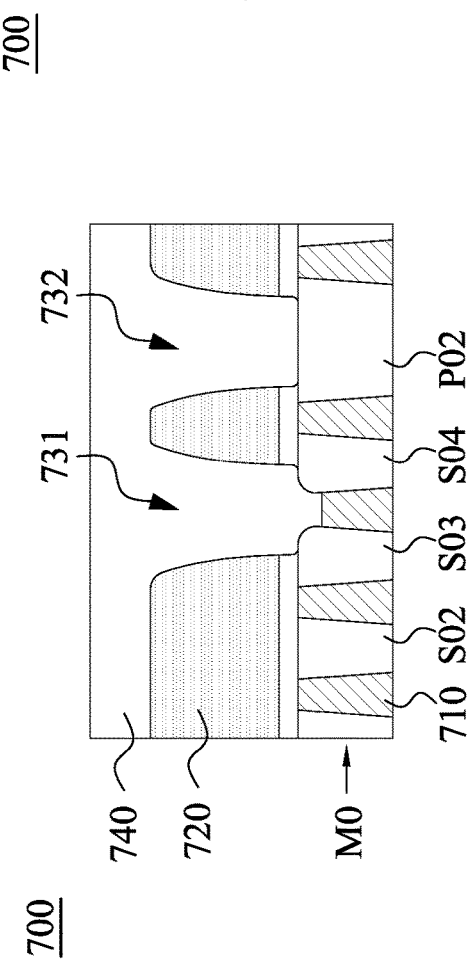

For illustration, as shown in FIG. 7C, a conductive structure 740 is formed on the film structure 720, and is further filled in the patterns 731 and 732.

In some embodiments, a material of the conductive structure 740 is the same as a material of the conductive segments S02 to S04 and P02 formed in the M0 layers. Alternatively stated, a material of the pattern 731 or 732 is the same as a material of the conductive segment S04 or P02. In various embodiments, if the conductive structure 740 physically contacts the conductive segments S02 to S04 and P02 formed in the M0 layers, the conductive structure 740 and the conductive segments S02 to S04 and P02 are coupled to each other. In alternative embodiments, the conductive material is copper (Cu), cobalt (Co), tungsten (W), Ruthenium (Ru), aluminum (Al), graphene, or any other suitable conductive material.

For illustration, as shown in FIG. 7D, conductive segments 751 and 752 are formed. In some embodiments, the conductive segments 752 corresponds to at least one of the conductive segment 411a, 411b, 412a or 412b that contacts the conductive rail P01 or P02, illustrated in FIG. 4. Thereby, the conductive segment 752 is able to form the first conductive segment that contacts the first conductive rail, as discussed in the operation S640. In other embodiments, the conductive segments 751 corresponds to the conductive segment 421 that contacts two adjacent conductive rails S0, illustrated in FIG. 4.

As illustrated in FIG. 7D, the conductive segment 751 is formed on the M0 layer, and is formed on the part of the conductive rail S03, the film structure 720, and the part of the conductive rail S04. Alternatively stated, the conductive segment 751 is formed above and between the conductive rails S03 and S04. In addition, conductive segment 752 is formed on the M0 layer, and is also formed on the conductive rail P02. Furthermore, the conductive segments 751 and 752, and the film structure 720 have a same surface that is substantially parallel to the surface of the M0 layer. Alternatively stated, all of the conductive segments 751 and 752 and the film structure 720 form a substantially plat surface above the M0 layer. In some embodiments, the conductive segments 751 and 752 are made of the same conductive material as the conductive structure 740 is made.

In some embodiments, the operation S640 further includes the following operations. The patterns filled with the conductive material and the film structure are polished. In some other embodiments, the polishing operation in S640 is performed by chemical mechanical polishing (CMP) to remove extra conductive material on the top of surface. In various embodiments, part of the structures is removed with a combination of CMP and dry etch.

In operation S650, a dielectric structure covering the first conductive segment is formed. In some embodiments, the dielectric structure is formed and stacked on the remaining structure after performing the operation S640. In other embodiments, the M1 layer is generated by forming the dielectric structure on the film structure, and is processed as illustrated in FIG. 7E.

Figure 7E:
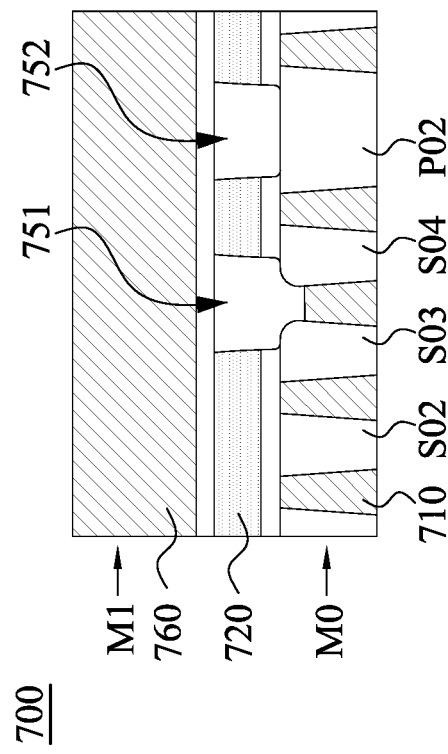

For illustration, as shown in FIG. 7E, a dielectric structure 760 is generated by forming on the film structure 720 and the conductive segments 751 and 752. In some embodiments, a material of dielectric structure 710 is the same as a material of the dielectric structure 760. In various embodiments, a thickness of the dielectric structure 760 is substantially equal to a distance between the M1 layer and a second metal layer (M2, not shown) above the M1 layer.

In operation S660, part of the film structure and part of the dielectric structure are removed, to expose part of a second conductive rail of the conductive rails. In some embodiments, the second conductive rail corresponds to one of the conductive rails S0 illustrated in FIG. 4.

In operation S670, the conductive material is filled in the removed part of the film structure and the removed part of the dielectric structure, to form a second conductive structure that includes a via contacting the exposed part of the second conductive rail and a signal rail contacting the via. In some embodiments, the via included in the second conductive structure corresponds to the via 432 illustrated in FIG. 4, and the signal rail included in the second conductive structure corresponds to the data rail S11 illustrated in FIG. 4. The operations S660-S670 are processed as illustrated in FIGS. 7F-7G.

Figure 7F:
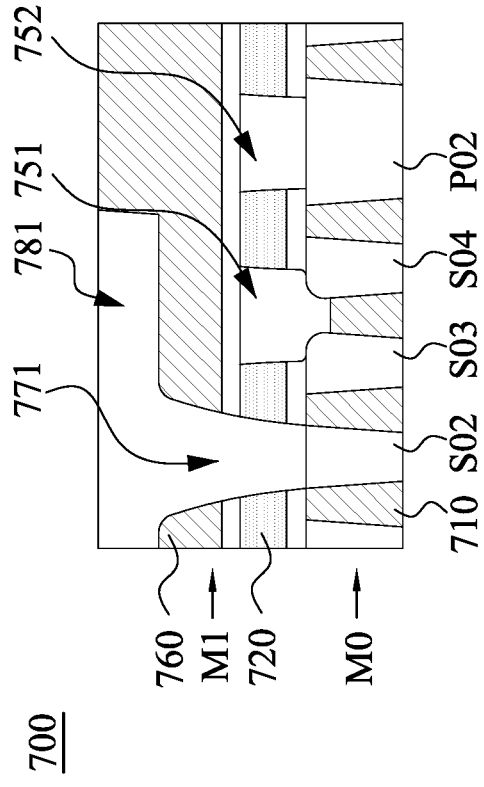
Figure 7G:
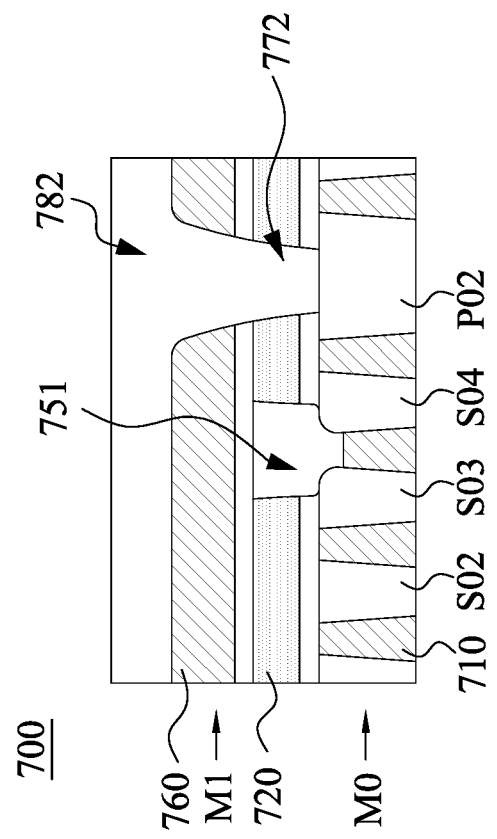

For illustration, as shown in FIG. 7F, part of the film structure 720 and part of the dielectric structure 760 are removed, and a structure 781 is exposed. Furthermore, the conductive material (not shown) are filled in the removed structures 720 and 760, to form a via 771 and the structure 781 which corresponds to a signal rail. The via 771 and the structure 781 are contacted to each other, and correspond to the via 432 and the signal rail S11 respectively, as shown in FIG. 4, in some embodiments. Also illustrated in FIG. 7G, part of the film structure 720 and part of the dielectric structure 760 are removed, and a structure 782 is exposed. Furthermore, the removed structures 720 and 760 are filled in the conductive material (not shown), to form a via 772 and the structure 782 which corresponds to a signal rail. The via 772 and the structure 782 are contacted to each other.

As illustrated in FIG. 7F, the IC 700 further includes via 771 formed on the M0 layer and connected to a structure 781 formed in the M1 layer. One terminal of the via 771 is formed on the conductive rail S02, and the other terminal of the via 771 is formed in the M1 layer. With the operations discussed above, a height of via 771 is substantially equal to or slightly greater than a distance between the conductive rail S02 and the structure 781. Alternatively stated, a height of via 771 is substantially equal to or slightly greater than a distance between the M0 layer and the M1 layer.

In some embodiments, the via 771 is configured to be coupled between the conductive rail S02 and the structure 781 formed in the M1 layer. In various embodiments, the structure 781 is a signal rail that is configured to providing data signals. In some other embodiments, the via 771 is coupled between the conductive rail S02 and the data rail S11, and corresponds to the via 432 shown in FIG. 4 or 5B.

Moreover, the conductive segment 751 is formed on the M0 layer as discussed above, and is separated from the M1 layer by the dielectric structure 760. Alternatively stated, the conductive segment 751 is spaced apart from the M1 layer. With the operations discussed above, a height of the conductive segment 751 is smaller than a height of the via 771. Similar to configurations of the conductive segment 751, the conductive segment 752 is formed on the M0 layer and is spaced apart from the M1 layer. Also, a height of the conductive segment 752 is smaller than a height of the via 771.

In some embodiments, the conductive segment 751 is coupled between the conductive rails S03 and S04. In some other embodiments, the conductive segment 751 is referred to as the M0 jumper, and corresponds to the conductive segment 421 shown in FIG. 4 or 5B. In various embodiments, the conductive segment 752 is coupled to the conductive rail P02. In some other embodiments, the conductive segment 752 is referred to as the V0 rail, and corresponds to the conductive segment 412a shown in FIG. 4 or 5A.

In some embodiments, the operation for forming the conductive segments 751 and 752 and the via 771 with the above arrangement between the M0 and M1 layers is referred to as a dual damascene process. It makes connections between the conductive segments 751 and 752 and the structure 781 formed in the M1 layer. In some other embodiments, the operation for forming the conductive segments 751 and 752 and the via 771 with the above arrangement between the M0 and M1 layers is referred to as a single damascene process. Compared to embodiments performed by the dual damascene process, the via 771 performed by the single damascene process has a greater height.

For illustration, as shown in FIG. 7G, the IC 700 includes via 772 formed on the M0 layer and connected to a structure 782 formed in the M1 layer. One terminal of the via 772 is formed on the conductive rail P02, and the other terminal of the via 772 is formed in the M1 layer. With the operations discussed above, similar to configurations of the via 771, a height of via 772 is substantially equal to or slightly greater than a distance between the conductive rail P02 and the structure 782.

In some embodiments, the via 772 is configured to couple between the conductive rail P02 and the structure 782 formed in the M1 layer. In various embodiments, the structure 782 is a power rail that is configured to providing power signals. In some other embodiments, the via 772 is coupled between the conductive rail P02 and the power rail P11, and corresponds to the via 431 shown in FIG. 4 or 5A.

As described above, the integrated circuit in the present disclosure is provided with conductive segments formed on the M0 layer and is spaced apart from the M1 layer. The conductive segment indicated as the V0 rail is disposed on the power conductive rail, and the conductive segment indicated as the M0 jumper is disposed on at least two signal conductive rails. Accordingly, routing between the M0 layer and the M1 layer is reduced, and resistances of the power conductive rails or the signal conductive rails are also reduced by additional arrangements of the conductive segment.

The configuration of FIGS. 7A-7G is given for illustrative purposes. Various configurations of the elements mentioned above in FIGS. 7A-7G are within the contemplated scope of the present disclosure.

Figure 8:
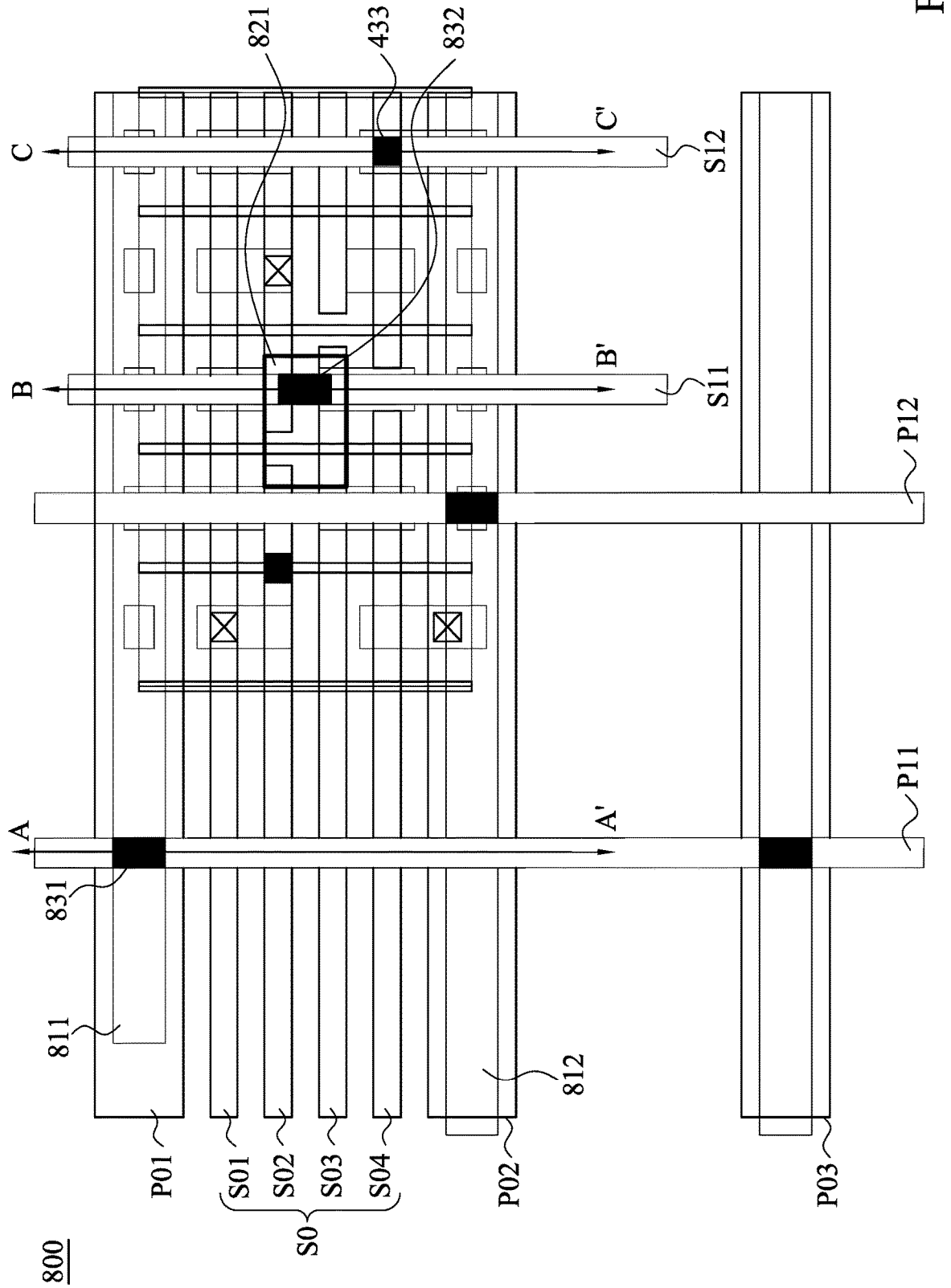
FIG. 8 is a layout diagram of an IC, in accordance with some embodiments of the present disclosure.

Reference is now made to FIG. 8. FIG. 8 is a layout diagram 800 of an IC, in accordance with some embodiments of the present disclosure. The layout diagram 800 has configurations similar to that of the layout diagram 400 as illustrated in FIG. 4, and similar detailed description is therefore omitted. The patterns shown in the layout diagram 800 with respect to the embodiments of FIG. 4, like elements in FIG. 8 are designated with the same reference numbers for ease of understanding.

Compared to embodiments illustrated in FIG. 4, the layout diagram 800 includes conductive segments 811 and 812 disposed on the conductive rails P01 and P02 respectively. The layout diagram 800 also includes conductive segment 821 disposed on and between the conductive rails S02 and S03. The layout diagram 800 further includes vias 831, 832 and 433 disposed between the M0 layer and the M1 layer. Specifically, in a layout view, the via 831 is overlapped with the conductive rail P01, the conductive segment 811 and the signal rail P11; the via 832 is overlapped with a conductive rail S02, the conductive rail S03, the conductive segment 821 and the signal rail S11; and the via 433 has similar configuration to that is shown in FIG. 4.

In some embodiments, the conductive segment 811 corresponds to the conductive segment 411a or 411b shown in FIG. 4. Compared to the conductive segment 411a or 411b of FIG. 4, the conductive segment 811 is not separated into multiple portions. Similarly, the conductive segment 812 corresponds to the conductive segment 412a or 412b shown in FIG. 4. In various embodiments, the conductive segment 811 has similar configuration/arrangement to the conductive segment 812. In some other embodiments, the conductive segment 821 corresponds to the conductive segment 421 shown in FIG. 4, and has similar configuration/arrangement to the conductive segment 421.

Reference is now made to FIGS. 9A to 9C. FIG. 9A is a cross-section schematic diagram of a layout diagram 900A corresponding to the layout diagram 800 of FIG. 8, taken along a line A-A'; FIG. 9B is a cross-section schematic diagram of a layout diagram 900B corresponding to the layout diagram 800 of FIG. 8, taken along a line B-B'; and FIG. 9C is a cross-section schematic diagram of a layout diagram 900C corresponding to the layout diagram 800 of FIG. 8, taken along a line C-C', in accordance with some embodiments of the present disclosure. The layout diagram 900A has configurations similar to that of the layout diagram 500A as illustrated in FIG. the layout diagram 900B has configurations similar to that of the layout diagram 500B as illustrated in FIG. 5B; and the layout diagram 900C has similar configuration/arrangement to the layout diagram 500C shown in FIG. 5C, and similar detailed description is therefore omitted. The layout diagrams 900A to 900C with respect to the embodiments of FIG. 8, like elements in FIGS. 9A to 9C are designated with the same reference numbers for ease of understanding.

For illustration in FIG. 9A, the conductive segment 811 is disposed on the conductive rail P01. The via 831 is disposed between the conductive segment 811 and the signal rail P11 without extra spacing. The conductive segment 812 is disposed on the conductive rail P02 and is spaced apart from the signal rail P11.

In some embodiments, the conductive rail P01 is coupled to the conductive segment 811, and is further coupled through the via 831 to the signal rail P11, for receiving the supply voltage signal with voltage VDD. With the above configurations, since the conductive segment 812 is separated from the signal rail P11, the conductive segment 812 or the conductive rail P02 is not coupled to the signal rail P11.

For illustration in FIG. 9B, the conductive segment 811 is disposed on the conductive rail P01 and is spaced apart from the signal rail S11. The conductive segment 812 is disposed on the conductive rail P02 and is spaced apart from the signal rail S11. The conductive segment 821 is disposed on two adjacent conductive rails S02 and S03. In addition, the via 832 is disposed between the conductive segment 821 and the signal rail S11 without extra spacing.

Compared to embodiments illustrated in FIG. 9A, the layout diagram 900B further illustrates conductive segments 911 and 912, and vias 921 and 922. In some embodiments, the conductive segments 911 and 912 correspond to the MD segments 511 and 512 in FIG. 5B respectively, and the vias 921 and 922 correspond to the VD vias 521 and 522 in FIG. 5B respectively. The conductive segments 911 and 912 are indicated as the MD segments hereinafter, and the vias 921 and 922 are indicated as the VD vias hereinafter.

With reference to FIG. 9B, the VD via 921 is disposed between the MD segment 911 and the conductive rail S01 without extra spacing. The VD via 922 is disposed between the MD segments 912 and the conductive rail S03 without extra spacing.

In some embodiments, the MD segment 911 is coupled through the VD via 921 to the conductive rail S01. Furthermore, the MD segment 912 is coupled through the VD via 922 to the conductive rail S03. The conductive rail S03 is further coupled to the conductive segment 821, and is further coupled through the via 832 to the signal rail S11, for receiving the data signal provided to the conductive rail S03 and further to the MD segment 912. On the other hand, the conductive rail S03 is also coupled through the conductive segment 821 to the conductive rail S02. Accordingly, the conductive rail S02 is also configured to receive the data signal transmitted from the signal rail S11.

For illustration in FIG. 9C, conductive segments 913 and 914, and vias 923 and 924 are disposed below the conductive rails P01, P02 and S0. In some embodiments, the conductive segments 913 and 914 correspond to the MD segments 513 and 514 in FIG. 5C respectively, and the vias 923 and 924 correspond to the VD vias 523 and 524 in FIG. 5C respectively.

Reference is now made to FIGS. 10A to 10C and back to FIG. 6. FIGS. 10A to 10C are schematic diagrams, in cross-sectional view of part of the IC 1000 corresponding to the IC of FIG. 8 along the column direction as illustrated in FIG. 8, illustrating some processes of the method of FIG. 6, in accordance with some embodiments of the present disclosure. FIG. 10A illustrates the operation S650 in FIG. 6, and has configurations similar to that is illustrated in FIG. 7E. FIG. 10B illustrates the operations S660-S670 in FIG. 6, and have configurations similar to that are illustrated in FIGS. 7F and 7G As such, similar detailed description is therefore omitted.

As illustrated in FIG. 10A, a conductive segment 1051 is disposed on the part of the conductive rail S03, the film structure 720 and the part of the conductive rail S04, and is disposed on and above the M0 layer. A conductive segment 1052 is disposed on the conductive rail P02 and is disposed on and above the M0 layer. Similar to the conductive segments 751 and 752 shown in FIG. 7E, the conductive segments 1051 and 1052 and the film structure 720 form a substantially plat surface above the M0 layer. In some embodiments, the conductive segments 1052 corresponds to at least one of the conductive segment 811 or 812 that contacts the conductive rail P01 or P02, illustrated in FIG. 8. In other embodiments, the conductive segments 1051 corresponds to the conductive segment 821 that contacts two adjacent conductive rails S0, illustrated in FIG. 8.

For illustration of the operations shown in FIG. 6, as shown in FIG. 10A, the conductive rail P02 corresponds to the first conductive rail, and the conductive segment 1052 corresponds to the first conductive segment that contacts the first conductive rail. With reference to the operation S650 in FIG. 6 and FIG. 10A, the dielectric structure 760 is formed and covers the conductive segment 1052. The dielectric structure 760 also covers the conductive segment 1051.

Regarding the operations S660-S670 in FIG. 6 and FIG. 10B, part of structures are removed and are filled with the conductive material, to form a via 771 and the structure 781 which corresponds to a signal rail, as discussed with reference to FIGS. 6 and 7F-7G. The via 771 and the structure 781 correspond to the via 832 and the signal rail S11 respectively, as shown in FIG. 8, in some embodiments. As shown in FIG. 10B, the via 771 is formed on the M0 layer and is connected to the structure 781 formed in the M1 layer, which is similar to the embodiments illustrated in FIG. 7F.

In some embodiments, the conductive segment 1051 is referred to as the M0 jumper, and corresponds to the conductive segment 821 shown in FIG. 8 or 9B. In some other embodiments, the conductive segment 1052 is referred to as the V0 rail, and corresponds to the conductive segment 812 shown in FIG. 8 or 9B. In various embodiments, the via 771 corresponds to the via 433 shown in FIG. 8 or 9C.

In some embodiments, the method further includes the following operations. The dielectric structure is further patterned to form other patterns other than that are formed in the operation S630. These patterns are subsequently filled with the conductive material, to form a via that contacts the first conductive segment formed in the operation S640. Such via contacts the first conductive segment and a power rail disposed next to the second conductive rail. For illustration in FIG. 10C, in some embodiments, the first conductive segment corresponds to the conductive segment 1052, and the power rail corresponds to the structure 782 which corresponds to a power rail, thereby, the via corresponds to the via 1072 that contacts the first conductive segment and the power rail.

As shown in FIG. 10C, a via 1072 is formed on the conductive segment 1052 and is connected to the structure 782 formed in the M1 layer. One terminal of the via 1072 is formed on the conductive segment 1052, and the other terminal of the via 1072 is formed in the M1 layer. With the operations discussed above, a height of via 1072 is smaller than a distance between the conductive rail P02 and the structure 782. Also, a height of via 1072 is smaller than a height of via 771 shown in at least one of FIG. 7F, 7G or 10B.

In some embodiments, the via 1072 is configured to couple between the conductive segment 1052 and the structure 782 formed in the M1 layer. In various embodiments, the structure 782 is referred to as the power rail, for providing power signals. The conductive segment 1052 is referred to as the V0 rail, and corresponds to the conductive segment 811 shown in FIG. 9A. Also, the via 1072 corresponds to the via 831 shown in FIG. 9A. Accordingly, the via 1072 is coupled between the conductive segment 1052 and the power rail P11 shown in FIG. 8 or 9A.

The configuration of FIGS. 10A, 10B, and 10C is given for illustrative purposes. Various configurations of the elements mentioned above in FIGS. 10A, 10B, and 10C are within the contemplated scope of the present disclosure.

To implement various devices, the layout diagrams as discussed above with respect to FIGS. 1A, 1B, 2, 3A to 3C, 4, 5A to 5C, 8 and 9A to 9C are used or modified to be used, as illustrated by the non-limiting examples discussed below with respect to FIGS. 11A to 19B. In the various embodiments discussed below, the IC of the present disclosure is implemented through the use of layout diagrams depicted in FIGS. 11A, 12A, 13A, 14A, 15A, 16A, 17A, 18A and 19A that correspond to circuit diagrams depicted in FIGS. 11B, 12B, 13B, 14B, 15B, 16B, 17B to 17E, 18B and 19B, as indicated. To indicate correspondence between a given layout diagram feature formed based on the given layout diagram feature, a same reference designator is used in each of the layout diagram and structure depictions, as discussed below.

Figure 11B:
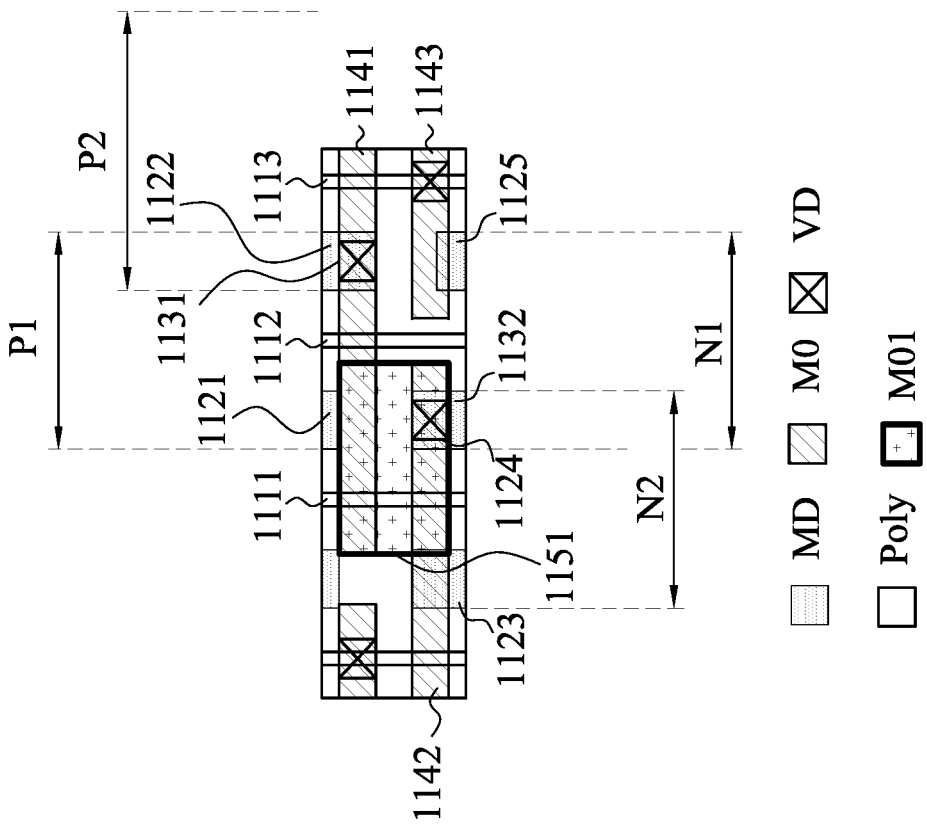
FIG. 11B is a layout diagram of an IC corresponding to the IC of FIG. 11A, in accordance with some embodiments of the present disclosure.
Figure 11A:
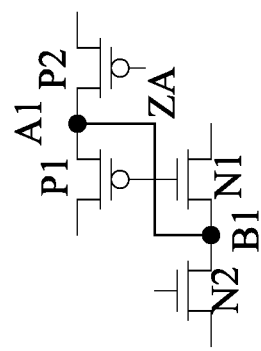
FIG. 11A is a circuit diagram of an IC, in accordance with some embodiments of the present disclosure.

Reference is now made to FIG. 11A. FIG. 11A is a circuit diagram of an IC 1100A, in accordance with some embodiments of the present disclosure. For illustration of the IC 1100A, a gate terminal of a p-type metal oxide semiconductor (PMOS) transistor P1 is coupled to a gate terminal of an n-type metal oxide semiconductor (NMOS) transistor N1. A source/drain terminal of the PMOS transistor P1 is coupled to a source/drain terminal of a PMOS transistor P2 at a node A1. A source/drain terminal of the NMOS transistor N1 is coupled to a source/drain terminal of an NMOS transistor N2 at a node B1. The node A1 is further coupled to the node B1 as indicated by connection ZA shown in FIG. 11A. To implement the IC 1100A including the connection ZA between the nodes A1 and B1 in the embodiments of the present disclosure, embodiments of layout designs and/or structures are provided and discussed below as illustrated with reference to FIG. 11B.

In some embodiments, the IC 1100A is used as a unit cell or unit circuit, in which the unit cell or unit circuit is capable of being used as a basic unit or as part of a device or circuit, in order to implement various devices or circuits. Alternatively stated, in some embodiments, the IC 1100A is implemented in various devices or circuits, including, for example, an inverter, a NAND gate, an AND-OR-invert (AOI) logic gate, a flip-flop, or the like.

FIG. 11B is a layout diagram 1100B of an IC corresponding to the IC 1100A of FIG. 11A, in accordance with some embodiments of the present disclosure. For simplicity of illustration of the layout diagram 1100B, it is merely illustrates a part of layout diagram for implement the IC 1100A of FIG. 11A.

In the illustration of FIG. 11B, gates 1111, 1112 and 1113 are arranged in an active area (not shown) and extend along the column direction. In some embodiments, the gates 1111, 1112 and 1113 correspond to the gate segments 311 and 312 shown in FIGS. 3A to 3C. In various embodiments, the gates 1111, 1112 and 1113 are patterned as "Poly" illustrated in FIG. 11B. Conductive segments 1121, 1122, 1123, 1124 and 1125 extend along the column direction and are referred to as MD segments hereinafter. In various embodiments, the conductive segments 1121, 1122, 1123, 1124 and 1125 are patterned as "MD" illustrated in FIG. 11B.

The MD segments 1121 and 1122 are arranged in the active area, as sources/drains of the PMOS transistor P1 and P2. The gate 1112 and the MD segments 1121 and 1122 together correspond to the PMOS transistor P1. The gate 1113, the MD segment 1122 and another MD segment (not shown) arranged next to the MD segment 1122 together correspond to the PMOS transistor P2. In such embodiments, the PMOS transistors P1 and P2 share the MD segment 1122, which corresponds to the PMOS transistors P1 and P2 being coupled at the node A1 as discussed above with respect to FIG. 11A. The MD segments 1123, 1124 and 1125 are arranged in the active area, as sources/drains of the NMOS transistor N1 and N2. The gate 1111 and the MD segments 1123 and 1124 together correspond to the NMOS transistor N1. The gate 1112 and the MD segments 1124 and 1125 together correspond to the NMOS transistor N2. In such embodiments, the NMOS transistors N1 and N2 share the MD segment 1124, which corresponds to the NMOS transistors N1 and N2 being coupled at the node B1 as discussed above with respect to FIG. 11A.

Vias 1131 and 1132 are arranged between the active area and the M0 layer. In various embodiments, the vias 1131 and 1132 are patterned as "VD" illustrated in FIG. 11B. The vias 1131 and 1132 are also referred to as VD vias hereinafter, which are discussed above at least with reference to FIG. 5B, for coupling between the MD segments 1121-1125 in the active area and conductive rails 1141-1143 in the M0 layer. In the illustration of FIG. 11B, the VD via 1131 is arranged between the MD segment 1122 and the conductive rail 1141, and the VD via 1132 is arranged between the MD segment 1124 and the conductive rail 1142. The VD via 1131 couples the MD segment 1122 to the conductive rail 1141. The VD via 1132 couples the MD segment 1124 to the conductive rail 1142.

In some embodiments, the layout diagram 1100B further includes a data rail (not shown) arranged in the M1 layer above the M0 layer, and the data rail extends in the column direction and is coupled to the conductive rail 1141. With such configuration, a data signal provided from the data rail is transmitted through the conductive rail 1141, and is further transmitted through the via 1131 to the MD segment 1122. In such embodiments, the node A1 as discussed above with respect to FIG. 11A is further coupled to the data rail, for receiving the data signal at the node A1.

The Conductive rails 1141, 1142 and 1143 are arranged in the M0 layer which is above the active area and extend along the row direction. In some embodiments, the conductive rails 1141, 1142 and 1143 are patterned as "M0" illustrated in FIG. 11B. In some other embodiments, the conductive rails 1141, 1142 and 1143 are also referred to as signal conductive rails which are discussed above at least with reference to FIG. 4.

A conductive segment 1151 is arranged in the M0 layer, and is arranged below the M1 layer. In various embodiments, the conductive segment 1151 is patterned as "M01" illustrated in FIG. 11B. The conductive segment 1151 is shaped as a block and is also referred to as the M0 jumper corresponding to the conductive segments 121-124 as illustrated in FIGS. 3A-3C, in some embodiments. In a layout view, the conductive segment 1151 is partially overlapped with the conductive rails 1141 and 1142, the gate 1111 and the VD via 1132. The conductive segment 1151 couples the conductive rails 1141 and 1142 together. Accordingly, the MD segment 1122 is coupled through the VD via 1131 to the conductive rail 1141, and the conductive rail 1141 is further coupled through the conductive segment 1151 to the conductive rail 1142. The conductive rail 1142 is coupled through the VD via 1132 to the MD segment 1124. With the above configurations, the MD segments 1122 and 1124 together are coupled to the conductive segment 1151, which corresponds to the nodes A1 and B1 being coupled between the connection ZA as discussed above with respect to FIG. 11A.

Reference is now made to FIG. 12A. FIG. 12A is a circuit diagram of an IC 1200A, in accordance with some embodiments of the present disclosure. For illustration of the IC 1200A, a gate terminal of a PMOS transistor P1 is coupled to a gate terminal of a NMOS transistor N1; a gate terminal of a PMOS transistor P2 is coupled to a gate terminal of a NMOS transistor N2; a gate terminal of a PMOS transistor P3 is coupled to a gate terminal of a NMOS transistor N3; and a gate terminal of a PMOS transistor P4 is coupled to a gate terminal of a NMOS transistor N4.

A source/drain terminal of the PMOS transistor P1 is coupled to a node A1; a source/drain terminal of the PMOS transistor P1 is coupled to a source/drain terminal of the PMOS transistor P2 at a node A2; a source/drain terminal of the PMOS transistor P2 is coupled to a source/drain terminal of the PMOS transistor P3 at a node A3; a source/drain terminal of the PMOS transistor P3 is coupled to a source/drain terminal of the PMOS transistor P4 at a node A4; and a source/drain terminal of the PMOS transistor P4 is coupled to a node A5 which is further coupled to the nodes A1 and A3.

Furthermore, a source/drain terminal of the NMOS transistor N1 is coupled to a node B1; a source/drain terminal of the NMOS transistor N1 is coupled to a source/drain terminal of a NMOS transistor N2; a source/drain terminal of the NMOS transistor N2 is coupled to a source/drain terminal of a NMOS transistor N3 at a node B2; a source/drain terminal of the NMOS transistor N3 is coupled to a source/drain terminal of a NMOS transistor N4; and a source/drain terminal of the NMOS transistor N4 is coupled to a node B3. The node A3 is further coupled to a power rail referenced as VDD. Each of the nodes B1 and B3 is further coupled to another power rail referenced as VSS, and a voltage of the power rail VSS is lower than that of the power rail VDD. The node A4 is further coupled to the node B2 as indicated by connection ZN shown in FIG. 12A. To implement the IC 1200A including the connection ZN between the nodes A4 and B2 in the embodiments of the present disclosure, embodiments of layout designs and/or structures are provided and discussed below as illustrated with reference to FIG. 12B.

FIG. 12B is a layout diagram 1200B of an IC corresponding to the IC 1200A of FIG. 12A, in accordance with some embodiments of the present disclosure.

In the illustration of FIG. 12B, gates 1211, 1212, 1213 and 1214 are arranged as gate terminals of PMOS transistors P1-P4 or NMOS transistors N1-N4 in FIG. 12A. MD segments 1220, 1221, 1222, 1223, 1224, 1225, 1226, 1227, 1228 and 1229 are arranged as sources/drains of PMOS transistors P1-P4 or NMOS transistors N1-N4 in FIG. 12A.

The gate 1211 and the MD segments 1220 and 1221 together correspond to the PMOS transistor P1. The gate 1212 and the MD segments 1221 and 1222 together correspond to the PMOS transistor P2. The gate 1213 and the MD segments 1222 and 1223 together correspond to the PMOS transistor P3. The gate 1214 and the MD segments 1223 and 1224 together correspond to the PMOS transistor P4. In such embodiments, the PMOS transistors P1 and P2 share the MD segment 1221, which corresponds to the PMOS transistors P1 and P2 being coupled at the node A2 illustrated in FIG. 12A. The PMOS transistors P2 and P3 share the MD segment 1222, which corresponds to the PMOS transistors P2 and P3 being coupled at the node A3 illustrated in FIG. 12A. The PMOS transistors P3 and P4 share the MD segment 1223, which corresponds to the PMOS transistors P3 and P4 being coupled at the node A4 illustrated in FIG. 12A.

Furthermore, the gate 1211 and the MD segments 1225 and 1226 together correspond to the NMOS transistor N1. The gate 1212 and the MD segments 1226 and 1227 together correspond to the NMOS transistor N2. The gate 1213 and the MD segments 1227 and 1228 together correspond to the NMOS transistor N3. The gate 1214 and the MD segments 1228 and 1229 together correspond to the NMOS transistor N4. In such embodiments, the NMOS transistors N2 and N3 share the MD segment 1227, which corresponds to the NMOS transistors N2 and N3 being coupled at the node B2 illustrated in FIG. 12A.

Conductive rails 1241, 1242, 1243, 1244, 1245, 1246, 1247, 1248 and 1249 are arranged. The conductive rails 1242, 1243, 1244, 1245, 1246, 1248 and 1249 are arranged between the conductive rails 1241 and 1247. A width of the conductive rails 1242, 1243, 1244, 1245, 1246, 1248 or 1249 is smaller than a width of the conductive rails 1241 or 1247. In some embodiments, the conductive rails 1242, 1243, 1244, 1245, 1246, 1248 and 1249 are referred to as the signal conductive rails, and the conductive rails 1241 and 1247 are referred to as the power conductive rails, which are discussed above at least with reference to FIG. 4.

VD vias 1231, 1232, 1233, 1234, 1235, 1236, 1237 and 1238 are arranged. The VD via 1231 couples the MD segment 1220 to the conductive rail 1242. The VD via 1232 couples the MD segment 1221 to the conductive rail 1241 which is further coupled to a power rail (not shown) arranged in the M1 layer. The MD segment 1221 and the conductive rail 1241 together are coupled to the power rail, which corresponds to the node A3 being coupled to the power rail VDD as discussed above with respect to FIG. 12A. The VD via 1233 couples the MD segment 1222 to the conductive rail 1242. The VD via 1234 couples the MD segment 1223 to the conductive rail 1244. The VD via 1235 couples the MD segment 1224 to the conductive rail 1242. With such configurations, the MD segments 1220, 1222 and 1224 are coupled together, which corresponds to the nodes A1, A3 and A5 being coupled together as discussed above with respect to FIG. 12A.

Moreover, the VD via 1236 couples the MD segment 1225 to the conductive rail 1247 which is further coupled to another power rail (not shown) arranged in the M1 layer. The MD segment 1225 and the conductive rail 1247 together are coupled to the power rail, which corresponds to the node B1 being coupled to the power rail VSS as discussed above with respect to FIG. 12A. The VD via 1237 couples the MD segment 1227 to the conductive rail 1245. The VD via 1238 couples the MD segment 1229 to the conductive rail 1247 which is further coupled to the power rail as same as that is coupled to the MD segment 1225. The MD segment 1229 and the conductive rail 1247 together are coupled to the power rail, which corresponds to the node B3 being coupled to the power rail VSS as discussed above with respect to FIG. 12A.

VG vias 1251, 1252, 1253 and 1254 are arranged. The VG via 1251 couples the gate 1211 to the conductive rail 1243. The VG via 1252 couples the gate 1212 to the conductive rail 1246. The VG via 1253 couples the gate 1213 to the conductive rail 1249. The VG via 1254 couples the gate 1214 to the conductive rail 1248.

Conductive segments 1261, 1262 and 1263 are arranged. The conductive segment 1261 is also referred to as the M0 jumper, and corresponds to the conductive segment 121, 122 or 123 as illustrated in FIG. 3A or 3C, in some embodiments.

The conductive segment 1261 couples the conductive rails 1244 and 1245 together. With such configurations, the MD segments 1223 and 1227 are coupled together, which corresponds to the nodes A4 and B2 being coupled between the connection ZN as discussed above with respect to FIG. 12A.

Moreover, the conductive segments 1262 and 1263 are also referred to as the V0 rails, and correspond to the conductive segments 111 and 112 as illustrated in FIGS. 3A-3C, in some embodiments. As discussed above with reference to the VD vias 1231-1238, the conductive segment 1262 couples to both of the conductive rail 1241 and the MD segment 1221, which is further coupled to the power rail VDD. The conductive segment 1263 couples to both of the conductive rail 1247 and the MD segments 1225 and 1229, which is further coupled to the power rail VSS.

Reference is now made to FIG. 13A. FIG. 13A is a circuit diagram of an IC 1300A, in accordance with some embodiments of the present disclosure. In some embodiments, the IC 1300A is used as one unit cell/circuit for implementing two different logic functions, which is also indicated as a two stage cell. For illustration of the IC 1300A, a gate terminal of a PMOS transistor P1 is coupled to a gate terminal of a NMOS transistor N1 at a node E1; a gate terminal of a PMOS transistor P2 is coupled to a gate terminal of a NMOS transistor N2; and a gate terminal of a PMOS transistor P3 is coupled to a gate terminal of a NMOS transistor N3.

Furthermore, a source/drain terminal of the PMOS transistor P1 is coupled to a node A1; a source/drain terminal of the PMOS transistor P1 is coupled to a source/drain terminal of a PMOS transistor P2 at a node A2; a source/drain terminal of the PMOS transistor P2 is coupled to a source/drain terminal of a PMOS transistor P3 at a node A3; a source/drain terminal of the PMOS transistor P3 is coupled to a node A4. A source/drain terminal of the NMOS transistor N1 is coupled to a node B1; a source/drain terminal of the NMOS transistor N1 is coupled to a source/drain terminal of a NMOS transistor N2 at a node B2; a source/drain terminal of the NMOS transistor N2 is coupled to a source/drain terminal of a NMOS transistor N3; and a source/drain terminal of the NMOS transistor N3 is coupled to a node B3. The nodes A2 and A4 are further coupled to a power rail referenced as VDD. The nodes B2 is further coupled to another power rail referenced as VSS. With reference to FIG. 13A, the node A1 is further coupled to the node B1 as indicated by connection Z. The node A3 is further coupled to the node E1 at a node E2 as indicated by connection ZE. The node A3 is also further coupled to the node B3 as indicated by connection ZN. To implement the IC 1300A including the connection Z between the nodes A1 and B1, the connection ZE between the nodes E1 and E2, and connection ZN between the nodes A3 and B3 in the embodiments of the present disclosure, embodiments of layout designs and/or structures are provided and discussed below as illustrated with reference to FIG. 13B.

FIG. 13B is a layout diagram 1300B of an IC corresponding to the IC 1300A of FIG. 13A, in accordance with some embodiments of the present disclosure.

In the illustration of FIG. 13B, gates 1311, 1312 and 1313 are arranged as gate terminals of PMOS transistors P1-P3 or NMOS transistors N1-N3 in FIG. 13A. MD segments 1321, 1322, 1323, 1324, 1325, 1326 and 1327 are arranged as sources/drains of PMOS transistors P1-P3 or NMOS transistors N1-N3 in FIG. 13A.

The gate 1311 and the MD segments 1321 and 1322 together correspond to the PMOS transistor P1. The gate 1312 and the MD segments 1322 and 1333 together correspond to the PMOS transistor P2. The gate 1313 and the MD segments 1323 and 1324 together correspond to the PMOS transistor P3. In such embodiments, the PMOS transistors P1 and P2 share the MD segment 1322, which corresponds to the PMOS transistors P1 and P2 being coupled at the node A2 illustrated in FIG. 13A. The PMOS transistors P2 and P3 share the MD segment 1323, which corresponds to the PMOS transistors P2 and P3 being coupled at the node A3 illustrated in FIG. 13A.

Furthermore, the gate 1311 and the MD segments 1321 and 1325 together correspond to the NMOS transistor N1. The gate 1312 and the MD segments 1325 and 1326 together correspond to the NMOS transistor N2. The gate 1313 and the MD segments 1326 and 1327 together correspond to the NMOS transistor N3. In such embodiments, the NMOS transistors N1 and N2 share the MD segment 1325, which corresponds to the NMOS transistors N1 and N2 being coupled at the node B2 illustrated in FIG. 13A. The PMOS transistor P1 and the NMOS transistor N1 share the MD segment 1321, which corresponds to the PMOS transistor P1 and the NMOS transistor N1 coupled at the nodes A1 and B1 together. It also corresponds to the nodes A1 and B1 being coupled between the connection Z illustrated in FIG. 13A.

Conductive rails 1341, 1342, 1343, 1344, 1345, 1346 and 1347 are arranged. In some embodiments, the conductive rails 1342, 1343, 1344, 1345 and 1346 are referred to as the signal conductive rails, and the conductive rails 1341 and 1347 are referred to as the power conductive rails, which are discussed above at least with reference to FIG. 4.

VD vias 1331, 1332, 1333, 1334, 1335 and 1336 are arranged. The VD via 1331 couples the MD segment 1321 to the conductive rail 1344. The VD via 1332 couples the MD segment 1322 to the conductive rail 1341 which is further coupled to a power rail (not shown) arranged in the M1 layer. The MD segment 1322 and the conductive rail 1341 together are coupled to the power rail, which corresponds to the node A2 being coupled to the power rail VDD as discussed above with respect to FIG. 13A. The VD via 1333 couples the MD segment 1323 to the conductive rail 1343. The VD via 1334 couples the MD segment 1324 to the conductive rail 1341. Similarly, the MD segment 1324 and the conductive rail 1341 together are coupled to the power rail, which corresponds to the node A4 being coupled to the power rail VDD as discussed above with respect to FIG. 13A. The VD via 1335 couples the MD segment 1325 to the conductive rail 1347 which is further coupled to another power rail (not shown) arranged in the M1 layer. The MD segment 1325 and the conductive rail 1347 together are coupled to the power rail, which corresponds to the node B2 being coupled to the power rail VSS as discussed above with respect to FIG. 13A. The VD via 1336 couples the MD segment 1327 to the conductive rail 1346.

VG vias 1351, 1352 and 1353 are arranged. The VG via 1351 couples the gate 1311 to the conductive rail 1343. With such configurations, the gate 1311 is further coupled through the conductive rail 1343 to the MD segment 1323, which corresponds to the nodes E1 and A3 being coupled between the connection ZE as discussed above with respect to FIG. 13A. The VG via 1352 couples the gate 1312 to the conductive rail 1345. The VG via 1353 couples the gate 1313 to the conductive rail 1342.

Conductive segments 1361, 1362 and 1363 are arranged. The conductive segment 1361 is also referred to as the M0 jumper, and corresponds to the conductive segment 121, 122 or 123 as illustrated in FIG. 3A or 3C, in some embodiments. The conductive segment 1361 couples the conductive rails 1343 and 1346 together. With such configurations, the MD segments 1323 and 1327 are coupled together, which corresponds to the nodes A3 and B3 being coupled between the connection ZN as discussed above with respect to FIG. 13A.

Moreover, the conductive segments 1362 and 1363 are also referred to as the V0 rails, and correspond to the conductive segments 111 and 112 as illustrated in FIGS. 3A-3C, in some embodiments. As discussed above with reference to the VD vias 1331-1336, the conductive segment 1362 couples to both of the conductive rail 1341 and the MD segments 1322 and 1324, which is further coupled to the power rail VDD. The conductive segment 1263 couples to both of the conductive rail 1347 and the MD segment 1325, which is further coupled to the power rail VSS.

Figure 14B:
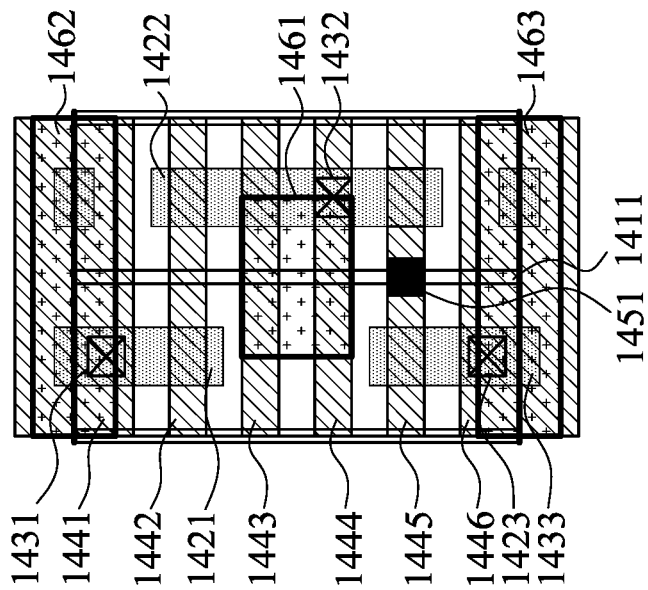
FIG. 14B is a layout diagram of an IC corresponding to the IC of FIG. 14A, in accordance with some embodiments of the present disclosure.
Figure 14A:
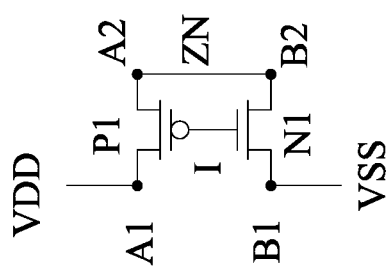
FIG. 14A is a circuit diagram of an IC, in accordance with some embodiments of the present disclosure.

Reference is now made to FIG. 14A. FIG. 14A is a circuit diagram of an IC 1400A, in accordance with some embodiments of the present disclosure. For illustration of the IC 1400A, a gate terminal of a PMOS transistor P1 is coupled to a gate terminal of a NMOS transistor N1 as indicated by connection I. In some embodiments, the connection I is indicated as an input terminal, for providing a control signal to both of the PMOS transistor P1 and the NMOS transistor N1.

Furthermore, a source/drain terminal of the PMOS transistor P1 is coupled to a node A1. A source/drain terminal of the PMOS transistor P1 is coupled to a node A2. A source/drain terminal of the NMOS transistor N1 is coupled to a node B1. A source/drain terminal of the NMOS transistor N2 is coupled to a node B2. The nodes A1 is further coupled to a power rail referenced as VDD. The nodes B1 is further coupled to another power rail referenced as VSS. The node A2 is further coupled to the node B2 as indicated by connection ZN. To implement the IC 1400A including the connection ZN between the nodes A2 and B2 in the embodiments of the present disclosure, embodiments of layout designs and/or structures are provided and discussed below as illustrated with reference to FIG. 14B.

FIG. 14B is a layout diagram 1400B of an IC corresponding to the IC 1400A of FIG. 14A, in accordance with some embodiments of the present disclosure.

In the illustration of FIG. 14B, a gate 1411 is arranged as the gate terminal of PMOS transistor P1 and NMOS transistor N1 in FIG. 14A. MD segments 1421, 1422 and 1423 are arranged as sources/drains of PMOS transistor P1 or NMOS transistor N1 in FIG. 14A.

The gate 1411 and the MD segments 1421 and 1422 together correspond to the PMOS transistor P1. The gate 1411 and the MD segments 1423 and 1422 together correspond to the NMOS transistor N1. In such embodiments, the PMOS transistor P1 share the MD segment 1422, which corresponds to the PMOS transistor P1 being coupled at the nodes A2 and B2 together illustrated in FIG. 14A. It also corresponds to the nodes A2 and B2 being coupled between the connection ZN illustrated in FIG. 14A.

Conductive rails 1441, 1442, 1443, 1444, 1445 and 1446 are arranged. In some embodiments, the conductive rails 1442, 1443, 1444 and 1445 are referred to as the signal conductive rails, and the conductive rails 1441 and 1446 are referred to as the power conductive rails, which are discussed above at least with reference to FIG. 4.

VD vias 1431, 1432 and 1433 are arranged. The VD via 1431 couples the MD segment 1421 to the conductive rail 1441 which is further coupled to a power rail (not shown) arranged in the M1 layer. The MD segment 1421 and the conductive rail 1441 together are coupled to the power rail, which corresponds to the node A1 being coupled to the power rail VDD as discussed above with respect to FIG. 14A. The VD via 1432 couples the MD segment 1422 to the conductive rail 1444. The VD via 1433 couples the MD segment 1423 to the conductive rail 1446 which is further coupled to another power rail (not shown) arranged in the M1 layer. The MD segment 1423 and the conductive rail 1446 together are coupled to the power rail, which corresponds to the node B1 being coupled to the power rail VSS as discussed above with respect to FIG. 14A.

VG via 1451 is arranged. The VG via 1451 couples the gate 1411 to the conductive rail 1445 which is further coupled to a signal rail (not shown) arranged in the M1 layer. The gate 1411 and the conductive rail 1445 together are coupled to the signal rail, which corresponds to the gate of the PMOS transistor P1 or NMOS transistor N1 being coupled between the connection I as discussed above with respect to FIG. 14A.

Conductive segments 1461, 1462 and 1463 are arranged. The conductive segment 1461 is also referred to as the M0 jumper, and corresponds to the conductive segment 121, 122 or 123 as illustrated in FIG. 3A or 3C, in some embodiments. The conductive segment 1461 couples the conductive rails 1443 and 1444 together.

Moreover, the conductive segments 1462 and 1463 are also referred to as the V0 rails, and correspond to the conductive segments 111 and 112 as illustrated in FIGS. 3A-3C, in some embodiments. As discussed above with reference to the VD vias 1431-1433, the conductive segment 1462 couples to both of the conductive rail 1441 and the MD segment 1421, which is further coupled to the power rail VDD. The conductive segment 1463 couples to both of the conductive rail 1446 and the MD segment 1423, which is further coupled to the power rail VSS.

Figure 15B:
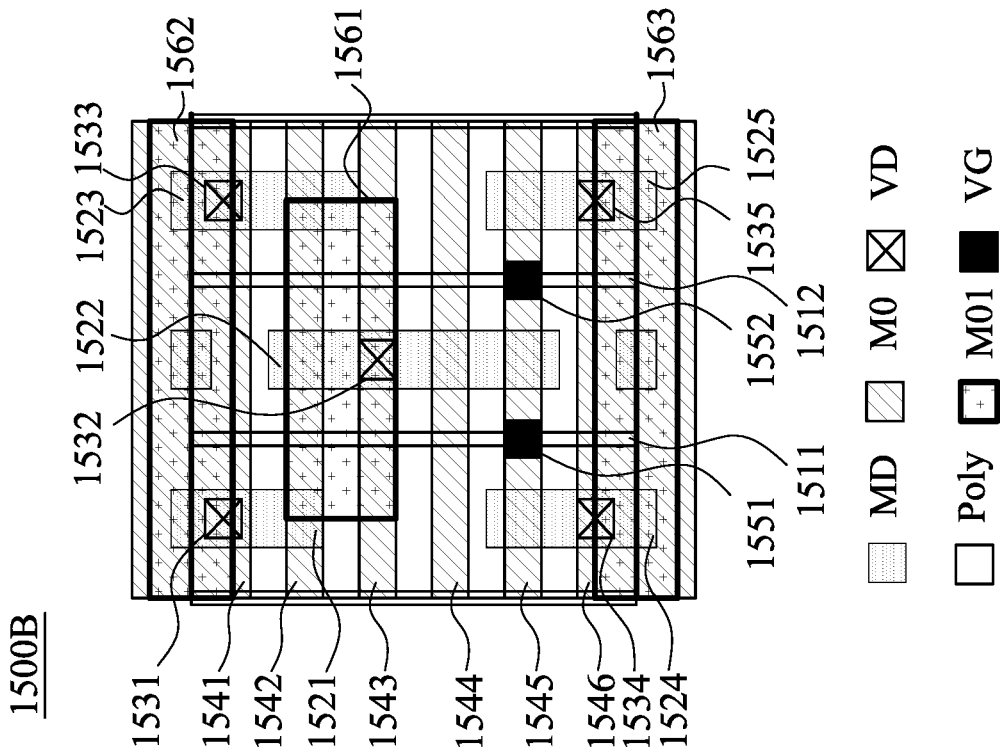
FIG. 15B is a layout diagram of an IC corresponding to the IC of FIG. 15A, in accordance with some embodiments of the present disclosure.
Figure 15A:
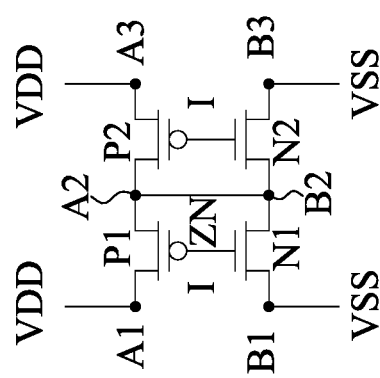
FIG. 15A is a circuit diagram of an IC, in accordance with some embodiments of the present disclosure.

Reference is now made to FIG. 15A. FIG. 15A is a circuit diagram of an IC 1500A, in accordance with some embodiments of the present disclosure. For illustration of the IC 1500A, a gate terminal of a PMOS transistor P1 is coupled to a gate terminal of a NMOS transistor N1 as indicated by connection I. A gate terminal of a PMOS transistor P2 is coupled to a gate terminal of a NMOS transistor N2 as also indicated by the connection I. In some embodiments, the connection I has a similar configuration/arrangement to the connection I illustrated in FIG. 14A.

Furthermore, a source/drain terminal of the PMOS transistor P1 is coupled to a node A1; a source/drain terminal of the PMOS transistor P1 is coupled to a source/drain terminal of a PMOS transistor P2 at a node A2; and a source/drain terminal of the PMOS transistor P2 is coupled to a node A3. A source/drain terminal of the NMOS transistor N1 is coupled to a node B1; a source/drain terminal of the NMOS transistor N1 is coupled to a source/drain terminal of a NMOS transistor N2 at node B2; and a source/drain terminal of the NMOS transistor N2 is coupled to a node B3. The nodes A1 and A3 are further coupled to a power rail referenced as VDD. The nodes B1 and B3 are further coupled to another power rail referenced as VSS. The node A2 is further coupled to the node B2 as indicated by connection ZN shown in FIG. 15A. To implement the IC 1500A including the connection ZN between the nodes A2 and B2 in the embodiments of the present disclosure, embodiments of layout designs and/or structures are provided and discussed below as illustrated with reference to FIG. 15B.

FIG. 15B is a layout diagram 1500B of an IC corresponding to the IC 1500A of FIG. 15A, in accordance with some embodiments of the present disclosure.

In the illustration of FIG. 15B, gates 1511 and 1512 are arranged as gate terminals of PMOS transistors P1-P2 or NMOS transistors N1-N2 in FIG. 15A. MD segments 1521, 1522, 1523, 1524 and 1525 are arranged as source/drain terminals of PMOS transistors P1-P2 or NMOS transistors N1-N2 in FIG. 15A.

The gate 1511 and the MD segments 1521 and 1522 together correspond to the PMOS transistor P1. The gate 1512 and the MD segments 1522 and 1523 together correspond to the PMOS transistor P2. In such embodiments, the PMOS transistors P1 and P2 share the MD segment 1522, which corresponds to the PMOS transistors P1 and P2 being coupled at the node A2 illustrated in FIG. 15A. The gate 1511 and the MD segments 1524 and 1522 together correspond to the NMOS transistor N1. The gate 1512 and the MD segments 1522 and 1525 together correspond to the NMOS transistor N2. In such embodiments, the NMOS transistors N1 and N2 share the MD segment 1522, which corresponds to the NMOS transistors N1 and N2 being coupled at the node B2 illustrated in FIG. 15A. Also, the NMOS transistor N1/N2 and the PMOS transistor P1/P2 share the MD segment 1522, which corresponds to the nodes A2 and B2 being coupled between the connection ZN illustrated in FIG. 15A.

Conductive rails 1541, 1542, 1543, 1544, 1545 and 1546 are arranged. In some embodiments, the conductive rails 1542, 1543, 1544 and 1545 are referred to as the signal conductive rails, and the conductive rails 1541 and 1546 are referred to as the power conductive rails, which are discussed above at least with reference to FIG. 4.

VD vias 1531, 1532, 1533, 1534 and 1535 are arranged. The VD via 1531 couples the MD segment 1521 to the conductive rail 1541 which is further coupled to a power rail (not shown) arranged in the M1 layer. The MD segment 1521 and the conductive rail 1541 together are coupled to the power rail, which corresponds to the node A1 being coupled to the power rail VDD as discussed above with respect to FIG. The VD via 1532 couples the MD segment 1522 to the conductive rail 1543. The VD via 1533 couples the MD segment 1523 to the conductive rail 1541. Similarly, the MD segment 1523 and the conductive rail 1541 together are coupled to the power rail, which corresponds to the node A3 being coupled to the power rail VDD as discussed above with respect to FIG. 15A.

Moreover, the VD via 1534 couples the MD segment 1524 to the conductive rail 1546 which is further coupled to another power rail (not shown) arranged in the M1 layer. The MD segment 1524 and the conductive rail 1546 together are coupled to the power rail, which corresponds to the node B1 being coupled to the power rail VSS as discussed above with respect to FIG. 15A. The VD via 1535 couples the MD segment 1525 to the conductive rail 1546. Similarly, the MD segment 1525 and the conductive rail 1546 together are coupled to the power rail, which corresponds to the node B3 being coupled to the power rail VSS as discussed above with respect to FIG. 15A.

VG vias 1551 and 1552 are arranged. The VG via 1551 couples the gate 1511 to the conductive rail 1545 which is further coupled to a signal rail (not shown) arranged in the M1 layer. Also, the VG via 1552 couples the gate 1512 to the conductive rail 1545. The gate 1511 and the conductive rail 1545 together are coupled to the signal rail, which corresponds to the gate of the PMOS transistor P1 or NMOS transistor N1 being coupled between the connection I as discussed above with respect to FIG. 15A. Similarly, the gate 1512 and the conductive rail 1545 together are coupled to the same signal rail that is also coupled to the gate 1511, which corresponds to the gate of the PMOS transistor P2 or NMOS transistor N2 being coupled between the connection that is also indicated as the connection I.

Conductive segments 1561, 1562 and 1563 are arranged. The conductive segment 1561 is also referred to as the M0 jumper, and corresponds to the conductive segment 124 as illustrated in FIG. 3B or 3C, in some embodiments. The conductive segment 1561 couples the conductive rails 1542 and 1543 together.

Moreover, the conductive segments 1562 and 1563 are also referred to as the V0 rails, and correspond to the conductive segments 111 and 112 as illustrated in FIGS. 3A-3C, in some embodiments. As discussed above with reference to the VD vias 1531-1535, the conductive segment 1562 couples to both of the conductive rail 1541 and the MD segments 1521 and 1523, which is further coupled to the power rail VDD. The conductive segment 1563 couples to both of the conductive rail 1546 and the MD segments 1524 and 1525, which is further coupled to the power rail VSS.

Figures 16A, 16B:
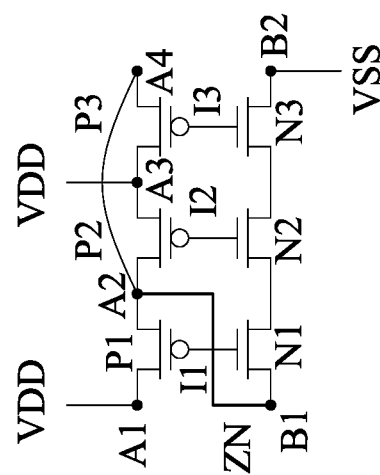
FIG. 16A is a circuit diagram of an IC, in accordance with some embodiments of the present disclosure.
FIG. 16B is a layout diagram of an IC corresponding to the IC of FIG. 16A, in accordance with some embodiments of the present disclosure.

Reference is now made to FIG. 16A. FIG. 16A is a circuit diagram of an IC 1600A, in accordance with some embodiments of the present disclosure. For illustration of the IC 1600A, a gate terminal of a PMOS transistor P1 is coupled to a gate terminal of a NMOS transistor N1 as indicated by connection I1. A gate terminal of a PMOS transistor P2 is coupled to a gate terminal of a NMOS transistor N2 as indicated by connection I2; and a gate terminal of a PMOS transistor P3 is coupled to a gate terminal of a NMOS transistor N3 as indicated by connection I3. In some embodiments, the connection I1, I2 or I3 has a similar configuration/arrangement to the connection I illustrated in FIG. 14A. In some other embodiments, the connections I1, I2 and I3 are further coupled to signal rails (not shown) that are different from one another, for transmitting different data signals. For example, the connection I1 is coupled to a first signal rail; the connection I2 is coupled to a second signal rail; and the connection I3 is coupled to a third signal rail.

Furthermore, a source/drain terminal of the PMOS transistor P1 is coupled to a node A1; a source/drain terminal of the PMOS transistor P1 is coupled to a source/drain terminal of a PMOS transistor P2 at a node A2; a source/drain terminal of the PMOS transistor P2 is coupled to a source/drain terminal of a PMOS transistor P3 at a node A3. A source/drain terminal of the PMOS transistor P3 is coupled to a node A4. A source/drain terminal of the NMOS transistor N1 is coupled to a node B1; a source/drain terminal of the NMOS transistor N1 is coupled to a source/drain terminal of a NMOS transistor N2; a source/drain terminal of the NMOS transistor N2 is coupled to a source/drain terminal of a NMOS transistor N3; and a source/drain terminal of the NMOS transistor N3 is coupled to a node B2. The nodes A1 and A3 are further coupled to a power rail referenced as VDD. The node B2 is further coupled to another power rail referenced as VSS. The node A2 is further coupled to the node A4. The node A2 is further coupled to the node B1 as indicated by connection ZN shown in FIG. 16A. To implement the IC 1600A including the connection ZN between the nodes A2 and B1 in the embodiments of the present disclosure, embodiments of layout designs and/or structures are provided and discussed below as illustrated with reference to FIG. 16B.

FIG. 16B is a layout diagram 1600B of an IC corresponding to the IC 1600A of FIG. 16A, in accordance with some embodiments of the present disclosure.

In the illustration of FIG. 16B, gates 1611, 1612 and 1613 are arranged as gate terminals of PMOS transistors P1-P3 or NMOS transistors N1-N3 in FIG. 16A. MD segments 1621, 1622, 1623, 1624, 1625, 1626, 1627 and 1628 are arranged as source/drain terminals of PMOS transistors P1-P3 or NMOS transistors N1-N3 in FIG. 16A.

The gate 1611 and the MD segments 1621 and 1622 together correspond to the PMOS transistor P1. The gate 1612 and the MD segments 1622 and 1623 together correspond to the PMOS transistor P2. In such embodiments, the PMOS transistors P1 and P2 share the MD segment 1622, which corresponds to the PMOS transistors P1 and P2 being coupled at the node A2 illustrated in FIG. 16A. The gate 1613 and the MD segments 1623 and 1624 together correspond to the PMOS transistor P3. In such embodiments, the PMOS transistors P2 and P3 share the MD segment 1623, which corresponds to the PMOS transistors P2 and P3 being coupled at the node A3 illustrated in FIG. 16A. The gate 1611 and the MD segments 1625 and 1626 together correspond to the NMOS transistor N1. The gate 1612 and the MD segments 1626 and 1627 together correspond to the NMOS transistor N2. The gate 1613 and the MD segments 1627 and 1628 together correspond to the NMOS transistor N3.

Conductive rails 1641, 1642, 1643, 1644, 1645, 1646 and 1647 are arranged. In some embodiments, the conductive rails 1642, 1643, 1644, 1645 and 1646 are referred to as the signal conductive rails, and the conductive rails 1641 and 1647 are referred to as the power conductive rails, which are discussed above at least with reference to FIG. 4.

VD vias 1631, 1632, 1633, 1634, 1635 and 1636 are arranged. The VD via 1631 couples the MD segment 1621 to the conductive rail 1641 which is further coupled to a power rail (not shown) arranged in the M1 layer. The MD segment 1621 and the conductive rail 1641 together are coupled to the power rail, which corresponds to the node A1 being coupled to the power rail VDD as discussed above with respect to FIG. 16A. The VD via 1632 couples the MD segment 1622 to the conductive rail 1643. The VD via 1633 couples the MD segment 1623 to the conductive rail 1641, which is further coupled to the power rail. Similarly, the MD segment 1623 and the conductive rail 1641 together are coupled to the power rail, which corresponds to the node A3 being coupled to the power rail VDD as discussed above with respect to FIG. 16A. The VD via 1634 couples the MD segment 1624 to the conductive rail 1643. With such configurations, the MD segments 1622, and 1624 are coupled together, which corresponds to the nodes A2 and A4 being coupled together as discussed above with respect to FIG. 16A.

Furthermore, the VD via 1635 couples the MD segment 1625 to the conductive rail 1644. The VD via 1636 couples the MD segment 1628 to the conductive rail 1647 which is further coupled to another power rail (not shown) arranged in the M1 layer. The MD segment 1628 and the conductive rail 1647 together are coupled to the power rail, which corresponds to the node B2 being coupled to the power rail VSS as discussed above with respect to FIG. 16A.

VG vias 1651, 1652 and 1653 are arranged. The VG via 1651 couples the gate 1611 to the conductive rail 1645 which is further coupled to a first signal rail (not shown) arranged in the M1 layer. The gate 1611 and the conductive rail 1645 together are coupled to the first signal rail, which corresponds to the connection I1 being coupled to the first signal rail as discussed above with respect to FIG. 16A, in some embodiments. The VG via 1652 couples the gate 1612 to the conductive rail 1642 which is further coupled to a second signal rail (not shown) arranged in the M1 layer. The gate 1612 and the conductive rail 1642 together are coupled to the second signal rail, which corresponds to the connection I2 being coupled to the second signal rail as discussed above with respect to FIG. 16A, in some embodiments. The VG via 1653 couples the gate 1613 to the conductive rail 1646 which is further coupled to a third signal rail (not shown) arranged in the M1 layer. The gate 1613 and the conductive rail 1646 together are coupled to the third signal rail, which corresponds to the connection I3 being coupled to the third signal rail as discussed above with respect to FIG. 16A, in some embodiments.

Conductive segments 1661, 1662 and 1663 are arranged. The conductive segment 1661 is shaped as a railed block, and is also referred to as the M0 jumper, corresponding to the conductive segment 124 as illustrated in FIG. 3B or 3C, in some embodiments. The conductive segment 1661 couples the conductive rails 1643 and 1644 together. With such configurations, the MD segments 1625 and 1622 are coupled together, which corresponds to the nodes B1 and A2 being coupled between the connection ZN as discussed above with respect to FIG. 16A. In addition, the MD segments 1625, 1622 and 1624 are further coupled together, which corresponds to the nodes B1, A2 and A4 being coupled to each other as discussed above with respect to FIG. 16A.

Moreover, the conductive segments 1662 and 1663 are also referred to as the V0 rails, and correspond to the conductive segments 111 and 112 as illustrated in FIGS. 3A-3C, in some embodiments. As discussed above with reference to the VD vias 1631-1636, the conductive segment 1662 couples to both of the conductive rail 1641 and the MD segments 1621 and 1623, which is further coupled to the power rail VDD. The conductive segment 1663 couples to both of the conductive rail 1647 and the MD segment 1628, which is further coupled to the power rail VSS.

Reference is now made to FIG. 17A. FIG. 17A is a circuit diagram of an IC 1700A, in accordance with some embodiments of the present disclosure. For illustration of the IC 1700A, a PMOS transistor P1 includes a gate terminal A1, a drain (D) terminal and a source (S) terminal. A NMOS transistor N1 includes a gate terminal B2, a D terminal and an S terminal. The S terminal of the PMOS transistor P1 is coupled to the D terminal of the NMOS transistor N1 to form a first transistor pair. A PMOS transistor P2 includes a gate terminal B1, a D terminal and an S terminal. A NMOS transistor N2 includes a gate terminal A2, a D terminal and an S terminal. The D terminal of the PMOS transistor P2 is coupled to the S terminal of the NMOS transistor N2 to form a second transistor pair.

The gate terminal A1 of the PMOS transistor P1 is coupled to the gate terminal A2 of the NMOS transistor N2. The gate terminal B1 of the PMOS transistor P2 is coupled to the gate terminal B2 of the NMOS transistor N1. The S terminal of the PMOS transistor P1 and the D terminal of the NMOS transistor N1 are coupled to the D terminal of the PMOS transistor P2 and the S terminal of the NMOS transistor N2, to indicate a connection Z as shown in FIG. 17A, in order to operate as a transmission gate circuit 1700A. In some embodiments, the connection Z is further coupled to a signal rail and operated as an output terminal of the circuit 1700A, for transmitting a data signal. In some embodiments, the transmission gate circuit 1700A is in a single cell. To implement the transmission gate circuit 1700A including the connection Z in the embodiments of the present disclosure, embodiments of layout designs and/or structures are provided as discussed in more detail below as illustrated with reference to FIG. 17B, 17C or 17D.

Reference is now made to FIGS. 17B and 17C. FIGS. 17B and 17C are layout diagrams 1700B and 1700C of ICs corresponding to the IC 1700A of FIG. 17A, in accordance with some embodiments of the present disclosure. For simplicity of illustration of the layout diagram 1700B or 1700C, it is merely illustrates a part of layout diagram for implement the IC 1700A of FIG. 17A.

In some embodiments, the layout diagram 1700B or 1700C illustrates a unit pattern, in which the unit pattern is capable of being fabricated as a basic unit or as part of a device or circuit including the transmission gate as discussed above with respect to FIG. 17A, in order to implement various layout diagrams. Alternatively stated, in some embodiments, the layout diagram 1700B or 1700C is implemented in various layout diagrams for implementing the devices or circuits including the transmission gate.

As illustrated in FIG. 17B, the layout diagram 1700B includes gates 1711 and 1712, MD segments (not labelled), conductive rails 1741, 1742 and 1743, VG vias 1751 and 1752, a conductive segment 1761, and cut segments 1771 and 1772.

The cut segments 1771 and 1772 arranged in the active area and extend along the row direction, patterned as "CT" in FIG. 17B, for cutting off conductive segments in the layout diagram 1700B. For example, the cut segment 1771 is configured to cut off the gate 1711, and the cut segment 1772 is configured to cut off the gate 1712. Alternatively stated, the cut segments 1771 and 1772 are configured to separate one gate 1711 or 1712 to two separated portions. In some embodiments, the cut segments 1771 and 1772 correspond to the cut segments CT at least shown in FIG. 1A.

The VG via 1751 couples the gate 1711 with the VG via 1751 to the conductive rail 1743, and VG via 1752 couples the gate 1712 with the VG via 1752 to the conductive rail 1741.

The conductive segment 1761 is partially overlapped with the gate 1711, the cut segment 1771, the conductive rails 1741 and 1743, and the VG via 1751. The conductive segment 1761 is also referred to as the M0 jumper, and corresponds to the conductive segment 121, 122 or 123 as illustrated in FIG. 3A or 3C, in some embodiments. The conductive segment 1761 couples the conductive rails 1741 and 1743 together.

In the illustration of FIG. 17B, a poly pitch D1 is referred to as a distance between two adjacent gates 1711 and 1712. A M0 pitch D2 is referred to as a distance between two adjacent conductive rails 1741 and 1742. In some embodiments, the poly pitch D1 corresponds to the poly pitch D1 shown in FIGS. 3A to 3C, and the M0 pitch D2 corresponds to the M0 pitch D2 shown in FIGS. 3A to 3C.

The cut segments 1771 and 1772 are separated by a distance D3 in the column direction. The distance D3 is referred to as a jog interval between two adjacent edges of these two adjacent cut segments 1771 and 1772, as illustrated in FIG. 17B. In addition, the gate 1711 is separated from the cut segment 1772 by a distance D4 in the row direction. The cut segment 1772 is not arranged across the gate 1711 and is arranged next to the gate 1711. The distance D4 is referred to as an interval between an edge of the cut segment 1772 and an edge of the gate 1711. The edge of the cut segment 1772 and the edge of the gate 1711 are arranged next to each other.

In some embodiments, a minimum of the distance D3 is about in a range of 0.3 times of the M0 pitch D2 to 0.6 times of the M0 pitch D2 (i.e., 0.3*M0 pitch D2~1*M0 pitch D2). In various embodiments, the distance D4 is about in a range of 0.4 times of the poly pitch D1 to 0.6 times of the poly pitch D1 (i.e., 0.4*poly pitch D1~0.6*poly pitch D1).

As illustrated in FIG. 17C, the layout diagram 1700C includes gates 1713, 1714 and 1715, MD segments (not labelled), conductive rails 1744 and 1745, VG vias 1753 and 1754, a conductive segment 1762, and cut segments 1773 and 1774.

The cut segment 1773 is partially overlapped with the gate 1713 and is configured to cut off the gate 1713. The cut segment 1774 is partially overlapped with the gate 1715 and is configured to cut off the gate 1715. In some embodiments, the cut segments 1773 and 1774 correspond to the cut segments CT at least shown in FIG. 1A.

The VG via 1753 is overlapped with the gate 1713 and the conductive rail 1745, for coupling the gate 1713 with the VG via 1753 to the conductive rail 1745. The VG via 1754 is overlapped with the gate 1715 and the conductive rail 1744, for coupling the gate 1715 with the VG via 1754 to the conductive rail 1744.

The conductive segment 1762 is partially overlapped with the gate 1715, the cut segment 1774, the conductive rails 1744 and 1745, and the VG via 1754. The conductive segment 1762 is also referred to as the M0 jumper, and corresponds to the conductive segment 121, 122 or 123 as illustrated in FIG. 3A or 3C, in some embodiments. The conductive segment 1762 couples the conductive rails 1744 and 1745 together.

In the illustration of FIG. 17C, the poly pitch D1 and the M0 pitch D2 correspond to the poly pitch D1 and the M0 pitch D2 shown in FIG. 17B. The cut segments 1773 and 1774 are separated by a distance D5 in the column direction. The distance D5 is referred to as a jog interval between two adjacent edges of these two adjacent cut segments 1773 and 1774, as illustrated in FIG. 17C. The gate 1714 is separated from the cut segment 1774 by a distance D6 in the row direction. The cut segment 1775 is not arranged across the gate 1714 and is arranged next to the gate 1714. The distance D6 is referred to as an interval between two adjacent edges of the cut segment 1774 and the gate 1714.

In some embodiments, the distance D5 corresponds to the distance D3 shown in FIG. 17B, and has a similar range scope. In some other embodiments, the distance D6 corresponds to the distance D4 shown in FIG. 17B, and has a similar range scope.

Reference is now made to FIG. 17D. FIG. 17D is a layout diagram 1700D of ICs corresponding to the IC 1700A of FIG. 17A, in accordance with some embodiments of the present disclosure.

In the illustration of FIG. 17D, gates 1711 and 1712 are arranged as gate terminals of PMOS transistors P1-P2 or NMOS transistors N1-N2 in FIG. 17A. MD segments 1721, 1722, 1723, 1724 and 1725 are arranged as source/drain terminals of PMOS transistors P1-P2 or NMOS transistors N1-N2 in FIG. 17A.

Cut segments 1771 and 1772 are arranged and will be removed for fabricating the layout diagram 1700D. The cut segment 1771 is arranged across the gate 1711 for separating the gate 1711 to two portions including the gate 1711 with a VG 1751 and the gate 1711 with a VG 1753. The cut segment 1771 is partially overlapped with a conductive rail 1743 and the gate 1711. The cut segment 1772 is arranged across the gate 1712 for separating the gate 1712 to two portions including the gate 1712 with a VG 1752 and the gate 1712 with a VG 1754. The cut segment 1772 is partially overlapped with a conductive rail 1744 and the gate 1712.

The gate 1711 with the VG 1751 and the MD segments 1721 and 1722 together correspond to the PMOS transistor P1. The gate 1712 with the VG 1752 and the MD segments 1722 and 1723 together correspond to the PMOS transistor P2. The gate 1711 with the VG 1753 and the MD segments 1724 and 1722 together correspond to the NMOS transistor N1. The gate 1712 with the VG 1754 and the MD segments 1722 and 1725 together correspond to the NMOS transistor N2. In such embodiments, the PMOS transistors P1 and P2 and the NMOS transistors N1 and N2 share the MD segment 1722, which corresponds to the PMOS transistors P1 and P2 and the NMOS transistors N1 and N2 being coupled between the connection Z illustrated in FIG. 17A.

Conductive rails 1741, 1742, 1743, 1744, 1745 and 1746 are arranged. In some embodiments, the conductive rails 1741, 1742, 1743, 1744, 1745 and 1746 are referred to as the signal conductive rails, which are discussed above at least with reference to FIG. 4.

VD via 1731 is arranged. The VD via 1731 couples the MD segment 1722 to the conductive rail 1746 which is further coupled to a signal rail (not shown) arranged in the M1 layer. In some embodiments, the signal rail is indicated as the output terminal for transmitting the signal transmitted from the connection Z as discussed above with respect to FIG. 17A.

VG vias 1751, 1752, 1753 and 1754 are arranged. The VG via 1751 couples the gate 1711 with the VG via 1751 to the conductive rail 1741 which is further coupled to a first signal rail (not shown) arranged in the M1 layer. The VG via 1752 couples the gate 1712 with the VG via 1752 to the conductive rail 1743 which is further coupled to a second signal rail (not shown) arranged in the M1 layer. The VG via 1753 couples the gate 1711 with the VG via 1753 to the conductive rail 1744 which is further coupled to the second signal rail. The VG via 1754 couples the gate 1712 with the VG via 1754 to the conductive rail 1745 which is further coupled to the first signal rail. In such configurations, it corresponds to the gate terminal A1 of the PMOS transistor P1 and the gate terminal A2 of the NMOS transistor N2 being coupled together to receive a first signal transmitted from the first signal rail, as discussed above with respect to FIG. 17A. Similarly, it corresponds to the gate terminal B1 of the PMOS transistor P2 and the gate terminal N2 of the NMOS transistor B2 being coupled together to receive a second signal transmitted from the second signal rail, as discussed above with respect to FIG. 17A.

Conductive segment 1761 is arranged. The conductive segment 1761 is shaped as a block, and is also referred to as the M0 jumper, corresponding to the conductive segment 121, 122 or 123 as illustrated in FIG. 3A or 3C, in some embodiments. The conductive segment 1761 is partially overlapped with the gate 1711, the cut segment 1771, two adjacent conductive rails 1743 and 1744, and the VG via 1753. The conductive segment 1761 couples the conductive rails 1743 and 1744 together. As discussed above, the conductive rails 1743 and 1744 are further coupled to the second signal rail by having the arrangement of the conductive segment 1761.

Figure 17E:
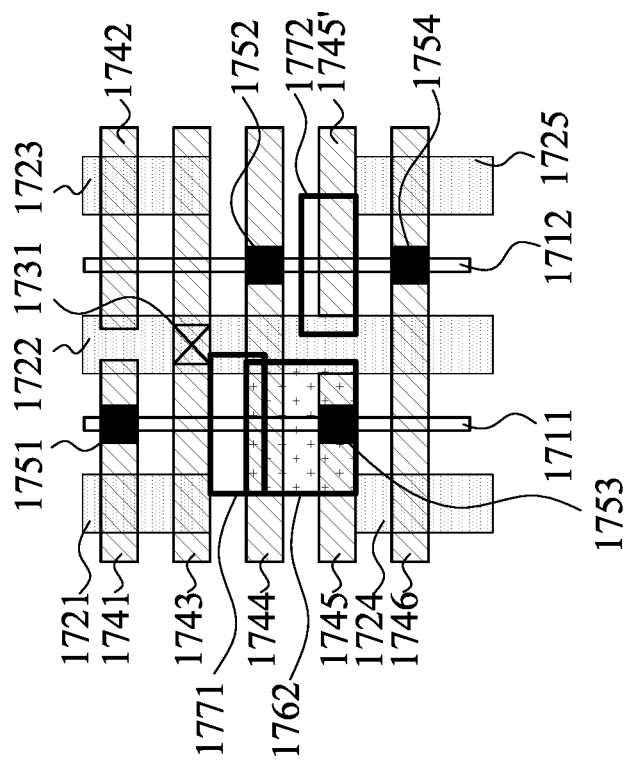

Reference is now made to FIG. 17E. FIG. 17E is a layout diagram 1700E of ICs corresponding to the IC 1700A of FIG. 17A, in accordance with some embodiments of the present disclosure.

In the illustration of FIG. 17E, compared to the embodiments in FIG. 17D, the cut segment 1771 is partially overlapped with a conductive rail 1744 and the gate 1711, and the cut segment 1772 is partially overlapped with a conductive rail 1745' and the gate 1712. The VG via 1753 couples the MD segment 1722 to the conductive rail 1743 which is further coupled to the signal rail (not shown) as an output rail for transmitting the signal transmitted from the connection Z as discussed above with respect to FIG. 17A. The VG via 1752 couples the gate 1712 with the VG via 1752 to the conductive rail 1744 which is further coupled to the second signal rail. The VG via 1753 couples the gate 1711 with the VG via 1753 to the conductive rail 1744 which is further coupled to the second signal rail. The VG via 1754 couples the gate 1712 with the VG via 1754 to the conductive rail 1745 which is further coupled to the first signal rail. In such configurations, it also corresponds to the connections illustrated in FIG. 17A, as discussed with reference FIG. 17D. The conductive segment 1761 is partially overlapped with the gate 1711, the cut segment 1771, two adjacent conductive rails 1744 and 1745, and the VG via 1753.

Reference is now made to FIG. 18A. FIG. 18A is a circuit diagram of an IC 1800A that is equivalent to the transmission gate circuit 1700A in FIG. 17A, in accordance with some embodiments of the present disclosure. In the illustration of FIG. 18A, compared to FIG. 17A, the IC 1800A further includes a PMOS transistor P3 and a NMOS transistor N3. A gate terminal of the PMOS transistor P1 is coupled to a node A1; a gate terminal of the PMOS transistor P2 is coupled to a node B1; a gate terminal of the PMOS transistor P3 is coupled to a gate of the NMOS transistor N2. A gate terminal of the NMOS transistor N1 is coupled to a node B2; a gate terminal of the NMOS transistor N3 is coupled to the gate of the PMOS transistor P2; the gate terminal of the NMOS transistor N2 is coupled to a node A2. The node A2 is further coupled to the gate terminal of the PMOS transistor P3. The node B1 is further coupled to the node B2 as indicated by connection Z shown in FIG. 18A. To implement the IC 1800A including the connection Z between the nodes B1 and B2 in the embodiments of the present disclosure, embodiments of layout designs and/or structures are provided and discussed below as illustrated with reference to FIG. 18B.

Furthermore, a source/drain terminal of the PMOS transistor P1 is coupled to a source/drain terminal of the PMOS transistor P2 at a node S1; a source/drain terminal of the PMOS transistor P2 is coupled to a source/drain terminal of the PMOS transistor P3 at a node S2; and a source/drain terminal of the PMOS transistor P3 is coupled to a node S2'. A source/drain terminal of the NMOS transistor N1 is coupled to a source/drain terminal of the NMOS transistor N3 at a node S3; a source/drain terminal of the NMOS transistor N3 is coupled to a source/drain terminal of the NMOS transistor N2 at a node S3'. The node S1 is further coupled to the node S3 as indicated by connection Z' shown in FIG. 18A. To implement the IC 1800A including the connection Z' between the nodes S1 and S3 in the embodiments of the present disclosure, embodiments of layout designs and/or structures are provided and discussed below as illustrated with reference to FIG. 18B.

The node S2 is further coupled to the node S2', corresponding to the source terminal and the drain terminal of the PMOS transistor P3 coupled together. The source and drain terminal of the PMOS transistor P3 are coupled together in a short-circuit configuration such that the PMOS transistor P3 is inoperative. In addition, the node S3 is further coupled to the node S3', corresponding to the source terminal and the drain terminal of the NMOS transistor N3 coupled together. The source and drain terminal of the NMOS transistor N3 are coupled together in a short-circuit configuration such that the NMOS transistor N3 is inoperative. With the connections of the PMOS transistor P3 and the NMOS transistor N3, as illustrated in FIG. 18A, the IC 1800A is able to operate as a circuit equivalent to the transmission gate circuit 1700A in FIG. 17A.

FIG. 18B is a layout diagram 1800B of an IC corresponding to the IC 1800A of FIG. 18A, in accordance with some embodiments of the present disclosure.

In the illustration of FIG. 18B, gates 1811, 1812 and 1813 are arranged as gate terminals of PMOS transistors P1-P3 or NMOS transistors N1-N3 in FIG. 18A. MD segments 1821, 1822, 1823, 1824, 1825, 1826 and 1827 are arranged as source/drain terminals of PMOS transistors P1-P3 or NMOS transistors N1-N3 in FIG. 18A.

A cut segment 1871 is arranged and will be removed for fabricating the IC 1800A. The cut segment 1871 is arranged across the gate 1811 for separating the gate 1811 to two portions including the gate 1811 with a VG 1851 and the gate 1811 with a VG 1853.

The gate 1811 with the VG 1851 and the MD segments 1821 and 1822 together correspond to the PMOS transistor P1. The gate 1812 and the MD segments 1822 and 1823 together correspond to the PMOS transistor P2. In such embodiments, the PMOS transistors P1 and P2 share the MD segment 1822, which corresponds to the PMOS transistors P1 and P2 being coupled at the node S1 illustrated in FIG. 18A. The gate 1813 and the MD segments 1823 and 1824 together correspond to the PMOS transistor P3. In such embodiments, the PMOS transistors P2 and P3 share the MD segment 1823, which corresponds to the PMOS transistors P2 and P3 being coupled at the node S2 illustrated in FIG. 18A. The gate 1811 with the VG 1853 and the MD segments 1825 and 1822 together correspond to the NMOS transistor N1. The gate 1812 and the MD segments 1822 and 1826 together correspond to the NMOS transistor N3. In such embodiments, the NMOS transistors N1 and N3 share the MD segment 1822, which corresponds to the NMOS transistors N1 and N3 being coupled at the node S3 illustrated in FIG. 18A. Furthermore, the PMOS transistors P1 and P2 and the NMOS transistors N1 and N3 share the MD segment 1822, which corresponds to the PMOS transistors P1 and P2 and the NMOS transistors N1 and N3 being coupled between the connection Z' illustrated in FIG. 18A. The gate 1813 and the MD segments 1826 and 1827 together correspond to the NMOS transistor N2. In such embodiments, the NMOS transistors N3 and N2 share the MD segment 1826, which corresponds to the NMOS transistors N3 and N2 being coupled at the node S3' illustrated in FIG. 18A.

Conductive rails 1841, 1842, 1843, 1844, 1845, 1846, 1847 and 1848 are arranged. In some embodiments, the conductive rails 1842, 1843, 1844, 1846, 1847 and 1848 are referred to as the signal conductive rails, and the conductive rails 1841 and 1845 are referred to as the power conductive rails, which are discussed above at least with reference to FIG. 4.

VD vias 1831, 1832, 1833, 1834 and 1835 are arranged. The VD via 1831 couples the MD segment 1822 to the conductive rail 1842. The VD via 1832 couples the MD segment 1823 to the conductive rail 1846, and the VD via 1833 couples the MD segment 1824 to the conductive rail 1846. In such embodiments, the source terminal of the PMOS transistor P3 and the drain terminal of the PMOS transistor P3 are coupled together, which corresponds to the source/drain terminals of the PMOS transistor P3 being coupled at the nodes S2 and S2' as the short-circuit configuration illustrated in FIG. 18A. Similarly, the VD via 1834 couples the MD segment 1822 to the conductive rail 1845, and the VD via 1835 couples the MD segment 1826 to the conductive rail 1846. In such embodiments, the source terminal of the NMOS transistor N2 and the drain terminal of the NMOS transistor N2 are coupled together, which corresponds to the source/drain terminals of the NMOS transistor N2 being coupled together at the nodes S3 and S3' as the short-circuit configuration illustrated in FIG. 18A.

VG vias 1851, 1852, 1853 and 1854 are arranged. The VG via 1851 couples the gate 1811 with the VG 1851 to the conductive rail 1841 which is further coupled to a first signal rail (not shown) arranged in the M1 layer. It corresponds to the PMOS transistor P1 being coupled at the node A1 in FIG. 18A. The VG via 1852 couples the gate 1812 to the conductive rail 1843. The VG via 1853 couples the gate 1812 with the VG 1853 to the conductive rail 1844. The VG via 1854 couples the gate 1813 to the conductive rail 1847 which is further coupled to a second signal rail (not shown) arranged in the M1 layer. It corresponds to the NMOS transistor N2 being coupled at the node A2 in FIG. 18A.

A conductive segment 1861 is arranged, and is partially overlapped with the cut segment 1871, the gate 1811, the conductive rails 1843 and 1844, and the VG via 1853. The conductive segment 1861 is shaped as a block, and is also referred to as a M0 jumper, corresponding to the conductive segment 121, 122 or 123 as illustrated in FIG. 3A or 3C, in some embodiments. The conductive segment 1861 couples the conductive rails 1843 and 1844 together. With such configurations, the gate 1811 with the VG via 1853 and the gate 1812 are coupled together, which corresponds to the nodes B1 and B2 being coupled between the connection Z as discussed above with respect to FIG. 18A.

Figure 19A:
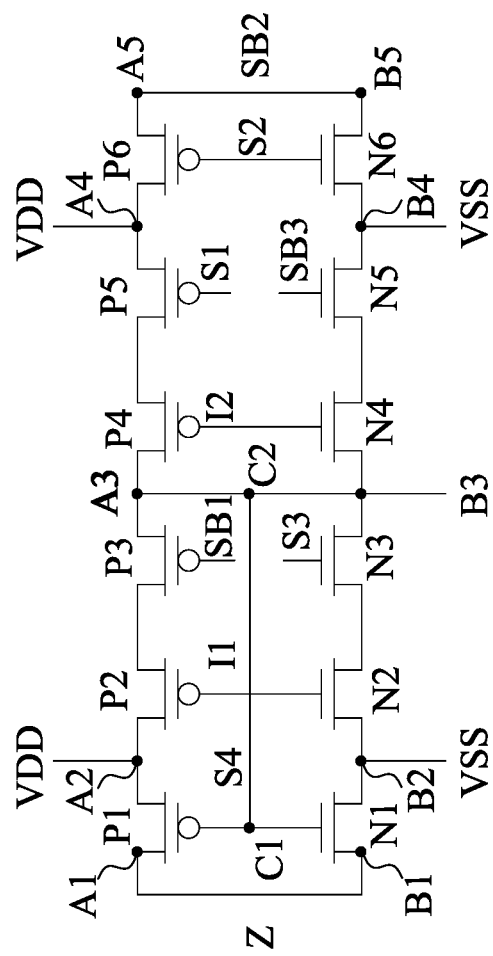
FIG. 19A is a circuit diagram of an IC, in accordance with some embodiments of the present disclosure.

Reference is now made to FIG. 19A. FIG. 19A is a circuit diagram of an IC 1900A that is equivalent to the transmission gate circuit 1700A in FIG. 17A, in accordance with some embodiments of the present disclosure. In the illustration of FIG. 19A, compared to FIG. 17A, the IC 1900A further includes PMOS transistor P3, P4, P5 and P6 and NMOS transistors N3, N4, N5 and N6. A gate terminal of the PMOS transistor P1 is coupled to a gate terminal of the NMOS transistor N1 at a node C1; a gate terminal of the PMOS transistor P2 is coupled to a gate terminal of the NMOS transistor N2 as indicated by connection I1; a gate terminal of the PMOS transistor P3 is coupled to a node SB1; a gate terminal of the PMOS transistor P4 is coupled to a gate terminal of the NMOS transistor N4 as indicated by connection I2; a gate terminal of the PMOS transistor P5 is coupled to a node S1; a gate terminal of the PMOS transistor P6 is coupled to a gate terminal of the NMOS transistor N6 as indicated by connection S2; a gate terminal of the NMOS transistor N3 is coupled to a node S3; and a gate terminal of the NMOS transistor N5 is coupled to a node SB3.

Figure 19B:
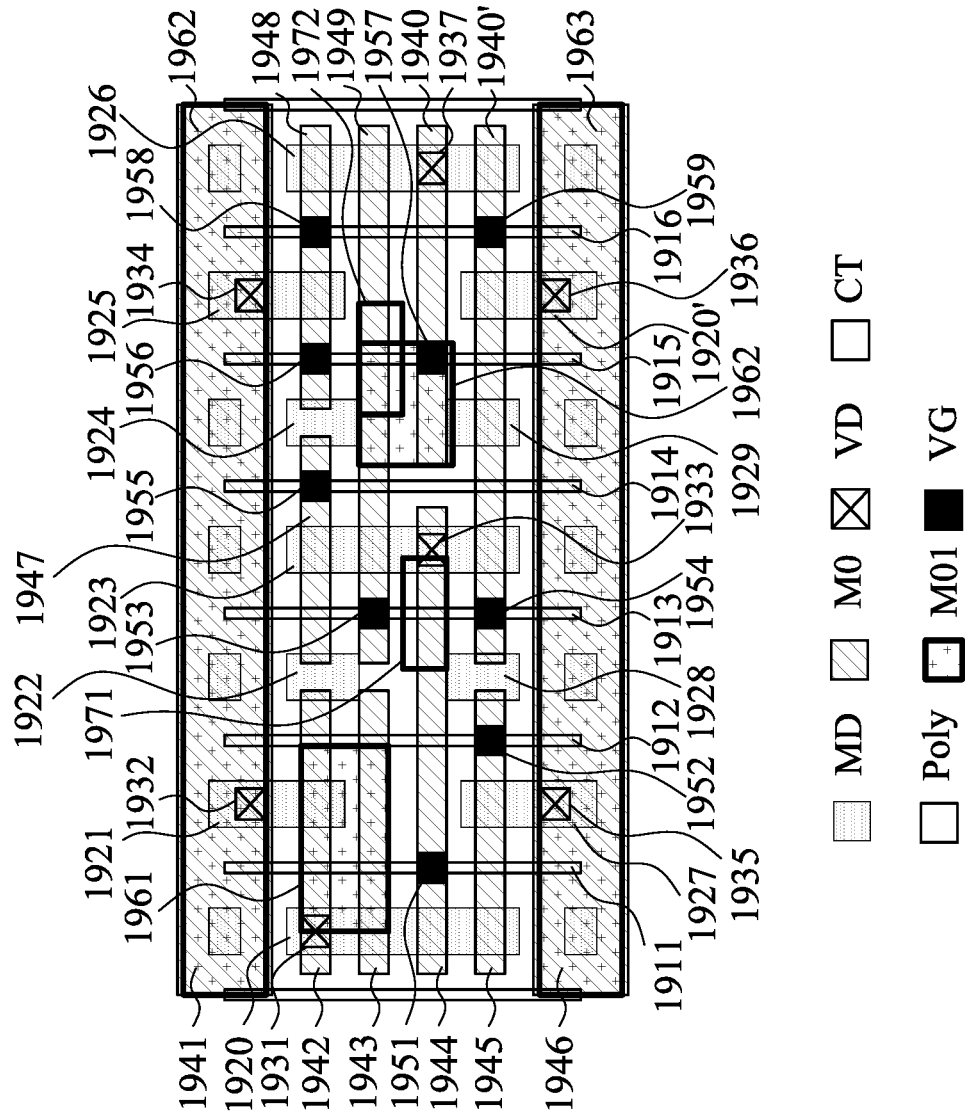
FIG. 19B is a layout diagram of an IC corresponding to the IC of FIG. 19A, in accordance with some embodiments of the present disclosure.

In some embodiments for illustrating the FIGS. 19A and 19B, the nodes SB1, SB2 and the connection SB3 are further coupled to a first signal rail indicated as SB (not shown), for receiving a first signal transmitted from the first signal rail. The nodes S1, S2 and S3 are further coupled to a second signal rail indicated as S (not shown), for receiving a second signal, other than the first signal, transmitted from the signal rail. The connection I1 is further coupled to a third signal rail indicated as I1 (not shown), for receiving a third signal transmitted from the third signal rail. The connection I2 is further coupled to a fourth signal rail indicated as I2 (not shown), for receiving a fourth signal transmitted from the fourth signal rail.

Furthermore, a source/drain terminal of the PMOS transistor P1 is coupled to a node A1; a source/drain terminal of the PMOS transistor P1 is coupled to a source/drain terminal of a PMOS transistor P2 at a node A2; a source/drain terminal of the PMOS transistor P2 is coupled to a source/drain terminal of a PMOS transistor P3; a source/drain terminal of the PMOS transistor P3 is coupled to a source/drain terminal of a PMOS transistor P4 at a node A3; a source/drain terminal of the PMOS transistor P4 is coupled to a source/drain terminal of a PMOS transistor P5; a source/drain terminal of the PMOS transistor P5 is coupled to a source/drain terminal of a PMOS transistor P6 at a node A4; and a source/drain terminal of the PMOS transistor P6 is coupled to a node A5. A source/drain terminal of the NMOS transistor N1 is coupled to a node B1; a source/drain terminal of the NMOS transistor N1 is coupled to a source/drain terminal of a NMOS transistor N2 at a node B2; a source/drain terminal of the NMOS transistor N2 is coupled to a source/drain terminal of a NMOS transistor N3; a source/drain terminal of the NMOS transistor N3 is coupled to a source/drain terminal of a NMOS transistor N4 at a node B3; a source/drain terminal of the NMOS transistor N4 is coupled to a source/drain terminal of a NMOS transistor N5; a source/drain terminal of the NMOS transistor N5 is coupled to a source/drain terminal of a NMOS transistor N6 at a node B4; and a source/drain terminal of the NMOS transistor N6 is coupled to a node B5.

The nodes A2 and A4 are further coupled to a power rail referenced as VDD. The nodes B2 and B4 are further coupled to another power rail referenced as VSS. The node C2 is further coupled to the node C1. The node A1 is further coupled to the node B1 as indicated by connection Z. The node A3 is further coupled to the node B3 at a node C2. The node C2 is further coupled to the node C1 as indicated by connection S4. The node A5 is further coupled to the node B5 as indicated by connection SB2. To implement the IC 1900A including the connection Z between the nodes A1 and B1, the connection S4 between the nodes C1 and C2, and the connection SB2 between the nodes A5 and B5, in the embodiments of the present disclosure, embodiments of layout designs and/or structures are provided and discussed below as illustrated with reference to FIG. 19B.

FIG. 19B is a layout diagram 1900B of an IC corresponding to the IC 1900A of FIG. 19A, in accordance with some embodiments of the present disclosure. Compared to the layout 1800B in FIG. 18B, less conductive rails are arranged in the layout diagram 1900B.

In the illustration of FIG. 19B, gates 1911, 1912, 1913, 1914, 1915 and 1916 are arranged as gate terminals of PMOS transistors P1-P6 or NMOS transistors N1-N6 in FIG. 18A. MD segments 1920, 1920', 1921, 1922, 1923, 1924, 1925, 1926, 1927, 1928 and 1929 are arranged as source/drain terminals of PMOS transistors P1-P6 or NMOS transistors N1-N6 in FIG. 19A. Cut segments 1971 and 1972 are arranged. The cut segment 1971 is arranged across the gate 1913 for separating the gate 1913 to two portions including the gate 1913 with a VG 1953 and the gate 1913 with a VG 1954. The cut segment 1972 is arranged across the gate 1915 for separating the gate 1915 to two portions including the gate 1915 with a VG 1956 and the gate 1915 with a VG 1957.

The gate 1911 and the MD segments 1920 and 1921 together correspond to the PMOS transistor P1. The gate 1912 and the MD segments 1921 and 1922 together correspond to the PMOS transistor P2. In such embodiments, the PMOS transistors P1 and P2 share the MD segment 1921, which corresponds to the PMOS transistors P1 and P2 being coupled at the node A2 illustrated in FIG. 19A. The gate 1913 with the VG 1953 and the MD segments 1922 and 1923 together correspond to the PMOS transistor P3. The gate 1914 and the MD segments 1923 and 1924 together correspond to the PMOS transistor P4. In such embodiments, the PMOS transistors P3 and P4 share the MD segment 1923, which corresponds to the PMOS transistors P3 and P4 being coupled at the node A3 illustrated in FIG. 19A. The gate 1915 with the VG 1956 and the MD segments 1924 and 1925 together correspond to the PMOS transistor P5. The gate 1916 and the MD segments 1925 and 1926 together correspond to the PMOS transistor P6. In such embodiments, the PMOS transistors P5 and P6 share the MD segment 1925, which corresponds to the PMOS transistors P5 and P6 being coupled at the node A4 illustrated in FIG. 19A.

Furthermore, the gate 1911 and the MD segments 1920 and 1927 together correspond to the NMOS transistor N1. In such embodiments, the NMOS transistor N1 and the PMOS transistor P1 share the MD segment 1920, which corresponds to the NMOS transistor N1 and the PMOS transistor P1 being coupled between illustrated the connection Z in FIG. 19A. The gate 1912 and the MD segments 1927 and 1928 together correspond to the NMOS transistor N2. In such embodiments, the NMOS transistors N1 and N2 share the MD segment 1927, which corresponds to the NMOS transistors N1 and N2 being coupled at the node B2 in FIG. 19A. The gate 1913 and the MD segments 1928 and 1923 together correspond to the NMOS transistor N3. The gate 1914 and the MD segments 1923 and 1929 together correspond to the NMOS transistor N4. In such embodiments, the NMOS transistors N3-N4 and the PMOS transistors P3-P4 share the MD segment 1923, which corresponds to the NMOS transistors N3-N4 and the PMOS transistors P3-P4 being coupled between the nodes A3 and B3 in FIG. 19A. The gate 1915 with the VG 1957 and the MD segments 1929 and 1920' together correspond to the NMOS transistor N5. The gate 1916 and the MD segments 1920' and 1926 together correspond to the NMOS transistor N6. In such embodiments, the NMOS transistors N5 and N6 share the MD segment 1920', which corresponds to the NMOS transistors N5 and N6 being coupled at the node B4 in FIG. 19A. in addition, the NMOS transistor N6 and the PMOS transistor P6 share the MD segment 1926, which corresponds to the NMOS transistor N6 and the PMOS transistor P6 being coupled between the nodes A5 and B5 in FIG. 19A.

Conductive rails 1940, 1940', 1941, 1942, 1943, 1944, 1945, 1946, 1947, 1948 and 1949 are arranged. In some embodiments, the conductive rails 1940, 1940', 1942, 1943, 1944, 1945, 1947, 1948 and 1949 are referred to as signal conductive rails, and the conductive rails 1941 and 1946 are referred to as power conductive rails, which are discussed above at least with reference to FIG. 4.

VD vias 1931, 1932, 1933, 1934, 1935, 1936 and 1937 are arranged. The VD via 1931 couples the MD segment 1920 to the conductive rail 1942. The VD via 1932 couples the MD segment 1921 to the conductive rail 1941 which is further coupled to a power rail (not shown) arranged in the M1 layer. The MD segment 1921 and the conductive rail 1941 together are coupled to the power rail, which corresponds to the node A2 being coupled to the power rail VDD as discussed above with respect to FIG. 19A. The VD via 1933 couples the MD segment 1923 to the conductive rail 1944. The VD via 1934 couples the MD segment 1925 to the conductive rail 1941. The MD segment 1925 and the conductive rail 1941 together are coupled to the power rail, which corresponds to the node A4 being coupled to the power rail VDD as discussed above with respect to FIG. 19A.

Moreover, the VD via 1935 couples the MD segment 1927 to the conductive rail 1946 which is further coupled to another power rail (not shown) arranged in the M1 layer. The MD segment 1927 and the conductive rail 1946 together are coupled to such power rail, which corresponds to the node B2 being coupled to the power rail VD VSS as discussed above with respect to FIG. 19A. The VD via 1936 couples the MD segment 1920' to the conductive rail 1946 which is further coupled to the power rail (not shown) that is same as the conductive rail 1946 is coupled to. The MD segment 1920' and the conductive rail 1946 together are coupled to such power rail, which corresponds to the node B4 being coupled to the power rail VD VSS as discussed above with respect to FIG. 19A. The VD via 1937 couples the MD segment 1926 to the conductive rail 1940 which is further coupled to the first signal rail (not shown) arranged in the M1 layer.

VG vias 1951, 1952, 1953, 1954, 1955, 1957, 1958 and 1959 are arranged. The VG via 1951 couples the gate 1911 to the conductive rail 1944 which is further coupled to a signal rail (not shown) arranged in the M1 layer. It corresponds to the PMOS transistor P1 and the NOMS transistor N1 being coupled at the node C11 in FIG. 19A. In such configurations, the MD segment 1923 coupled to the conductive rail 1944 is further coupled to the gate 1911. It corresponds to the nodes C1 and C2 which is also coupled to the nodes A3 and B3 being coupled between the connection S4 in FIG. 19A. The VG via 1952 couples the gate 1912 to the conductive rail 1945 which is further coupled to the third signal rail (not shown) arranged in the M1 layer. It corresponds to the PMOS transistor P2 and the NOMS transistor N2 being between the connection I1 in FIG. 19A. The VG via 1953 couples the gate 1913 with the VG via 1953 to the conductive rail 1949 which is further coupled to the first signal rail. It corresponds to the PMOS transistor P3 being coupled at the node SB1 in FIG. 19A. The VG via 1954 couples the gate 1913 with the VG via 1954 to the conductive rail 1940' which is further coupled to the second signal rail (not shown) arranged in the M1 layer, in some embodiments. It corresponds to the NMOS transistor N3 being coupled at the node S3 in FIG. 19A.

Moreover, the VG via 1955 couples the gate 1914 to the conductive rail 1947 which is further coupled to the fourth signal rail (not shown) arranged in the M1 layer, in some embodiments. It corresponds to the PMOS transistor P4 and the NOMS transistor N4 being between the connection I2 in FIG. 19A. The VG via 1956 couples the gate 1915 with the VG via 1956 to the conductive rail 1948 which is further coupled to the second signal rail. It corresponds to the PMOS transistor P5 being coupled at the node S1 in FIG. 19A. The VG via 1957 couples the gate 1915 with the VG via 1957 to the conductive rail 1940 which is further coupled to the first signal rail. It corresponds to the NMOS transistor N5 being coupled at the node SB3 in FIG. 19A. The VG via 1958 couples the gate 1916 to the conductive rail 1948 which is further coupled to the second signal rail. Also, the VG via 1959 couples the gate 1916 to the conductive rail 1940' which is further coupled to the second signal rail as well. It corresponds to the PMOS transistor P6 and the NOMS transistor N6 being between the connection S2 in FIG. 19A.

Conductive segments 1961, 1962, 1963 and 1964 are arranged. The conductive segment 1961 is shaped as a railed block, and is also referred to as a M0 jumper, corresponding to the conductive segment 124 as illustrated in FIG. 3B or 3C, in some embodiments. The conductive segment 1961 couples the conductive rails 1942 and 1943 together.

Moreover, the conductive segment 1962 is shaped as a block, and is also referred to as a M0 jumper, corresponding to the conductive segment 121, 122 or 123 as illustrated in FIG. 3A or 3C, in some embodiments. The conductive segment 1962 is partially overlapped with the gate 1915, the cut segment 1972, the conductive rails 1949 and 1940, and the VG via 1957. The conductive segment 1962 couples the conductive rails 1949 and 1940 together. With such configurations, the gate 1913, the gate 1915 with the VG via 1957 and the MD segment 1926 are coupled together, which corresponds to the PMOS transistor P3, the NMOS transistor N5, and the nodes B1 and A2 coupled between the connection SB2 being coupled to a same signal rail which, in some embodiments, is the first signal rail, as discussed above with respect to FIG. 19A.

Furthermore, the conductive segments 1963 and 1964 are also referred to as the V0 rails, and correspond to the conductive segments 111 and 112 as illustrated in FIGS. 3A-3C, in some embodiments. As discussed above with reference to the VD vias 1931-1937, the conductive segment 1963 couples to both of the conductive rail 1941 and the MD segments 1921 and 1925, which is further coupled to the power rail VDD. The conductive segment 1964 couples to both of the conductive rail 1946 and the MD segments 1927 and 1920', which is further coupled to the power rail VSS.

As illustrated by the non-limiting examples depicted in FIGS. 1A to 19B and discussed above, the various embodiments include conductive segments formed on conductive rails and disposed above the M0 layer and below the M1 layer, thereby increasing routing flexibility compared to approaches in which lack of these conductive segments.

Figure 20:
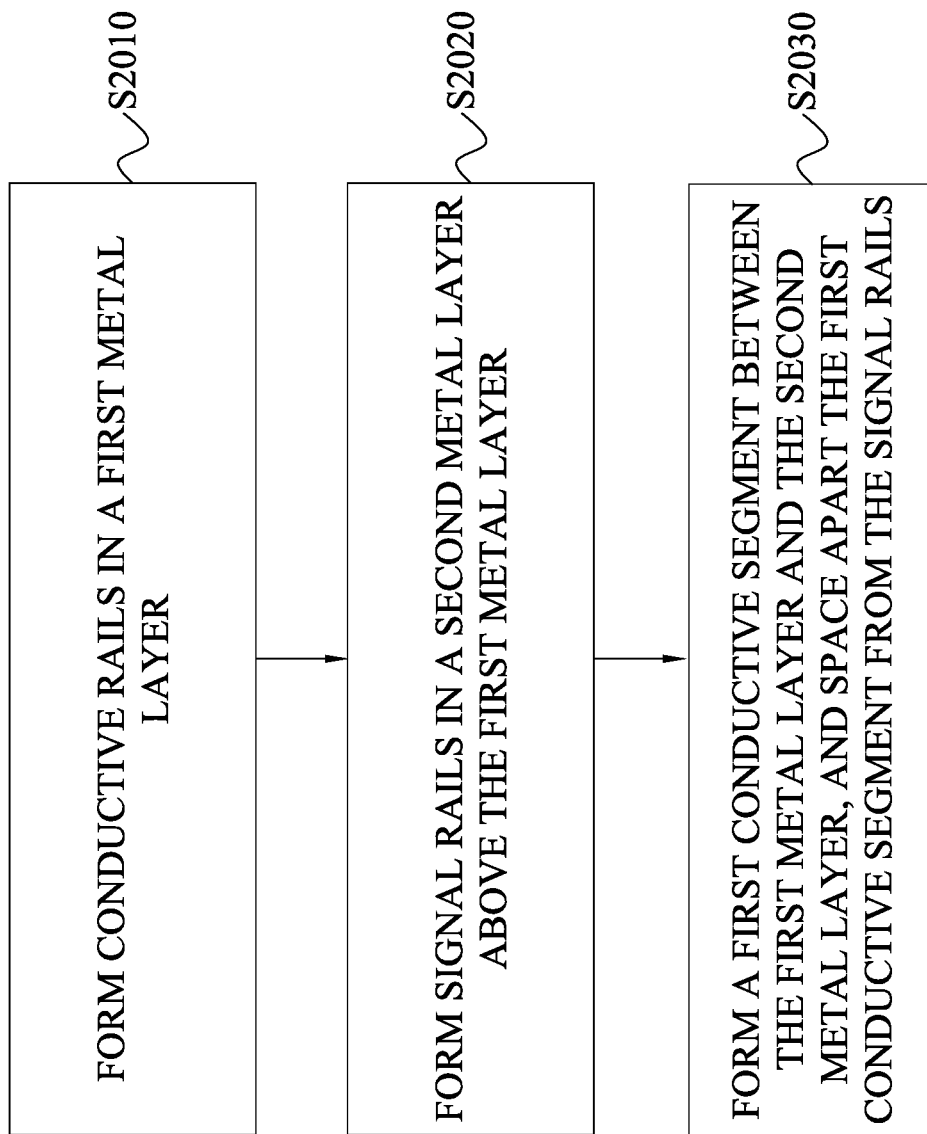
FIG. 20 is a flow chart of a method for fabricating an IC, in accordance with some embodiments of the present disclosure.

Reference is now made to FIG. 20. FIG. 20 is a flow chart of a method 2000 for fabricating an IC, in accordance with some embodiments of the present disclosure. In some embodiments, the IC is manufactured based on an IC layout diagram includes one of layout diagrams 100A, 100B, 200, 300A-300C, 400, 500A-500C, 800, 1100B, 1200B, 1300B, 1400B, 1500B, 1600B, 1700B-1700E, 1800B, or 1900B, corresponding to an IC structure, e.g., one of ICs 700, or 1000, discussed above with respect to FIGS. 1A-19B. In some embodiments, the operations of method 2000 are performed in the order depicted in FIG. 20. In some embodiments, the operations of method 2000 are performed simultaneously and/or in an order other than the order depicted in FIG. 20. In some embodiments, one or more operations are performed before, between, during, and/or after performing one or more operations of method 2000.

At operation 2010, conductive rails are formed in a first metal layer. In some embodiments, the conductive rails correspond to the conductive rails P01, P02 and S01-S04 discussed above with respect to FIGS. 1A to 19B. The first metal layer correspond to the M0 layer discussed above with respect to FIGS. 1A to 19B.

In some embodiments, the conductive rails include a pair of first conductive rails. In various embodiments, the pair of first conductive rails correspond to the conductive rails P01 and P02, that are also indicated as power conductive rails, discussed above with respect to FIGS. 1A to 19B.

At operation 2020, signal rails are formed in a second metal layer above the first metal layer. In some embodiments, the signal rails correspond to the signal rails P11, P12 and S11-S4 or rails not shown discussed above with respect to FIGS. 1A to 19B. The second metal layer correspond to the M1 layer discussed above with respect to FIGS. 1A to 19B.

At operation 2030, a first conductive segment is formed between the first metal layer and the second metal layer, and is spaced apart from the signal rails. In some embodiments, the first conductive segment is overlapped with the pair of first conductive rails in a layout view. In some embodiments, the first conductive segment corresponds to the conductive segment indicated as the V0 rail discussed above with respect to FIGS. 1A to 19B. For example, the first conductive segment corresponds to the conductive segment 111 or 112 shown in FIGS. 1A, 1B, 3A to 3C, or the conductive segment 411*a*, 411*b*, 412*a*. 412*b* in FIGS. 4, 5A to 5C, etc.

In some embodiments, the method 2000 further includes the operations as follows. A second conductive segment is also formed between the first metal layer and the second metal layer, and is also spaced apart from the signal rails. The second conductive segment is overlapped with at least two adjacent conductive rails between the pair of first conductive rail in a layout view. In some embodiments, the second conductive segment corresponds to the conductive segment indicated as the M0 jumper discussed above with respect to FIGS. 1A to 19B. For example, the second conductive segment corresponds to the conductive segment 121, 122, 123 or 124 shown in FIGS. 1A, 1B, 3A to 3C, or the conductive segment 421 in FIGS. 4, 5A to 5C, etc. In various embodiments, the adjacent conductive rails disposed with the second conductive segment corresponds to the conductive rails S0, that are also indicated as signal conductive rails, discussed above with respect to FIGS. 1A to 19B.

Figure 21:
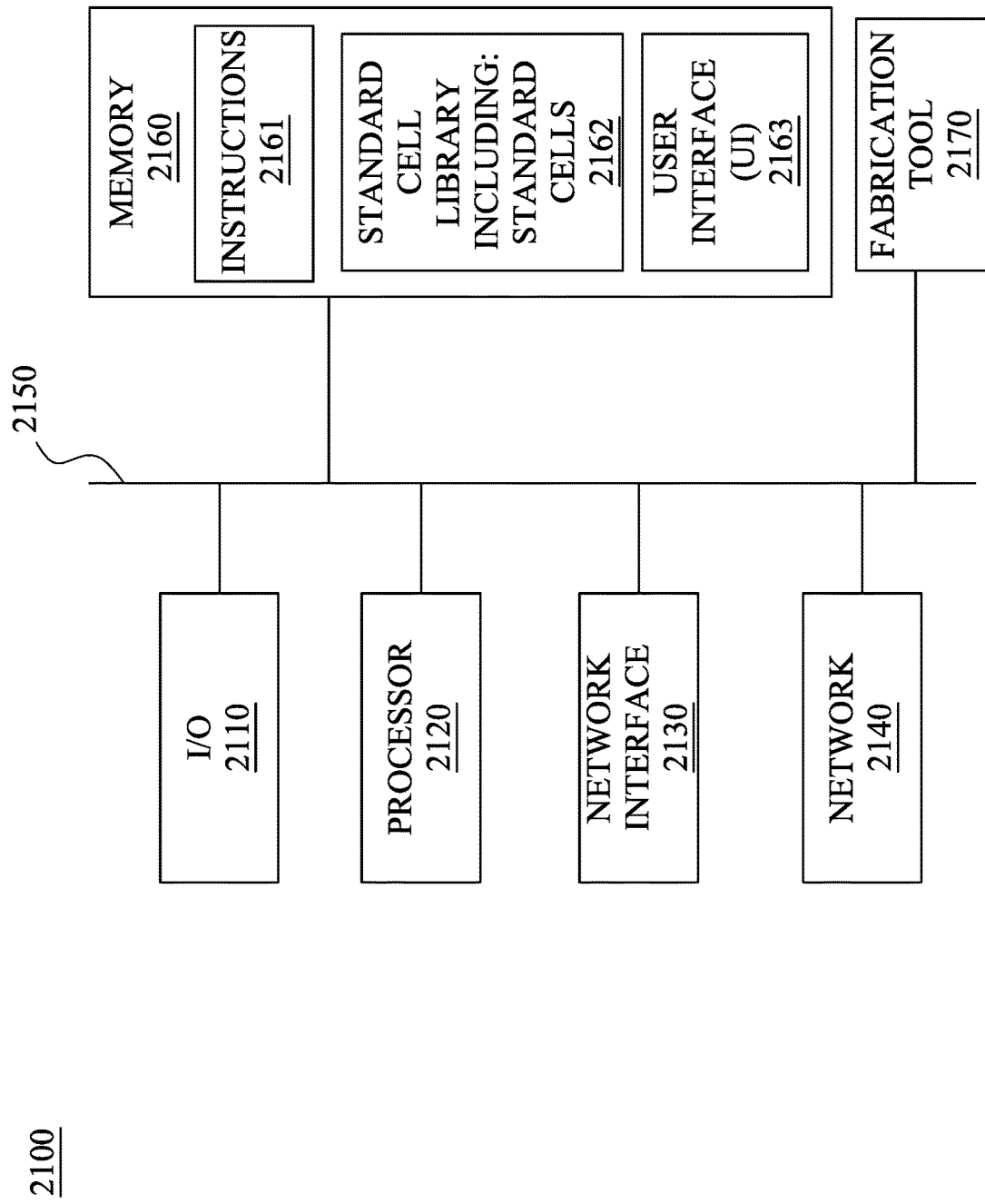
FIG. 21 is a block diagram of a system for designing an IC layout design, in accordance with some embodiments of the present disclosure.

Reference is now made to FIG. 21. FIG. 21 is a block diagram of an electronic design automation (EDA) system 2100 for designing the integrated circuit layout de sign, in accordance with some embodiments of the present disclosure. EDA system 2100 is configured to implement one or more operations of the method 600 disclosed in FIG. 6 and the method 2000 disclosed in FIG. 20, and further explained in conjunction with FIGS. 1A-5C and 7A-19B. In some embodiments, EDA system 2100 includes an APR system.

In some embodiments, EDA system 2100 is a general purpose computing device including a hardware processor 2120 and a non-transitory, computer-readable storage medium 2160. Storage medium 2160, amongst other things, is encoded with, i.e., stores, computer program code (instructions) 2161, i.e., a set of executable instructions. Execution of instructions 2161 by hardware processor 2120 represents (at least in part) an EDA tool which implements a portion or all of, e.g., the method 600 or 2000.

The processor 2120 is electrically coupled to computer-readable storage medium 2160 via a bus 2150. The processor 2120 is also electrically coupled to an I/O interface 2110 and a fabrication tool 2170 by bus 2150. A network interface 2130 is also electrically connected to processor 2120 via bus 2150. Network interface 2130 is connected to a network 2140, so that processor 2120 and computer-readable storage medium 2160 are capable of connecting to external elements via network 2140. The processor 2120 is configured to execute computer program code 2161 encoded in computer-readable storage medium 2160 in order to cause EDA system 2100 to be usable for performing a portion or all of the noted processes and/or methods. In one or more embodiments, processor 2120 is a central processing unit (CPU), a multi-processor, a distributed processing system, an application specific integrated circuit (ASIC), and/or a suitable processing unit.

In one or more embodiments, computer-readable storage medium 2160 is an electronic, magnetic, optical, electromagnetic, infrared, and/or a semiconductor system (or apparatus or device). For example, computer-readable storage medium 2160 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 2160 includes a compact disk-read only memory (CD-ROM), a compact disk-read/write (CD-R/W), and/or a digital video disc (DVD).

In one or more embodiments, storage medium 2160 stores computer program code 2161 configured to cause EDA system 2100 (where such execution represents (at least in part) the EDA tool) to be usable for performing a portion or all of the noted processes and/or methods. In one or more embodiments, storage medium 2160 also stores information which facilitates performing a portion or all of the noted processes and/or methods. In one or more embodiments, storage medium 2160 stores library 2162 of standard cells including such standard cells as disclosed herein, for example, a cell including conductive segments 111, 112 or 121-123 discussed above with respect to FIG. 1A.

EDA system 2100 includes I/O interface 2110. I/O interface 2110 is coupled to external circuitry. In one or more embodiments, I/O interface 2110 includes a keyboard, keypad, mouse, trackball, trackpad, touchscreen, and/or cursor direction keys for communicating information and commands to processor 2120.

EDA system 2100 also includes network interface 2130 coupled to processor 2120. Network interface 2130 allows EDA system 2100 to communicate with network 2140, to which one or more other computer systems are connected. Network interface 2130 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 2100.

EDA system 2100 also includes the fabrication tool 2170 coupled to the processor 2120. The fabrication tool 2170 is configured to fabricate integrated circuits, including, for example, the integrated circuit 700 illustrated in FIGS. 7A-7G or the integrated circuit 1000 illustrated in FIGS. 10A-10C, based on the design files processed by the processor 2120 and/or the IC layout designs as discussed above.

EDA system 2100 is configured to receive information through I/O interface 2110. The information received through I/O interface 2110 includes one or more of instructions, data, design rules, libraries of standard cells, and/or other parameters for processing by processor 2120. The information is transferred to processor 2120 via bus 2150. EDA system 2100 is configured to receive information related to a UI through I/O interface 2110. The information is stored in computer-readable medium 2160 as user interface (UI) 2163.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 2100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 22:
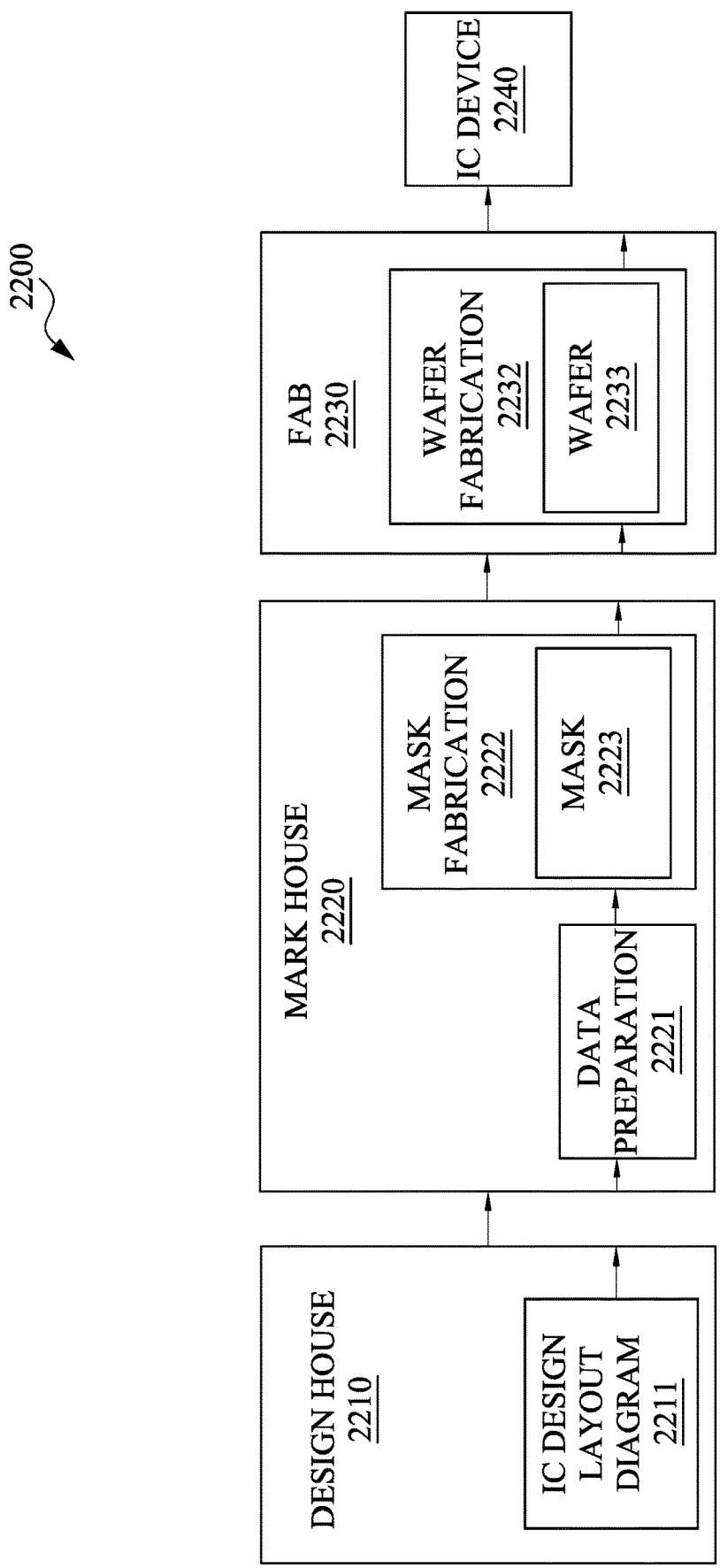
FIG. 22 is a block diagram of an IC manufacturing system, and an IC manufacturing flow associated therewith, in accordance with some embodiments.

FIG. 22 is a block diagram of IC manufacturing system 2200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 2200.

In FIG. 22, IC manufacturing system 2200 includes entities, such as a design house 2210, a mask house 2220, and an IC manufacturer/fabricator ("fab") 2230, that interact with one another in the design, development, and manufacturing cycles and/or services related to manufacturing an IC device 2240. The entities in IC manufacturing system 2200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2210, mask house 2220, and IC fab 2230 is owned by a single larger company. In some embodiments, two or more of design house 2210, mask house 2220, and IC fab 2230 coexist in a common facility and use common resources.

Design house (or design team) 2210 generates an IC design layout diagram 2211. IC design layout diagram 2211 includes various geometrical patterns, for example, an IC layout design depicted in FIGS. 1A-1B, FIG. 2, FIGS. 3A-3C, FIG. 4, FIGS. 5A-5C, FIG. 8, FIGS. 9A-9C, FIG. 11B, FIG. 12B, FIG. 13B, FIG. 14B, FIG. 15B, FIG. 16B, FIG. 17B, FIG. 18B, and/or FIG. 19B, designed for an IC device 2240, for example, integrated circuits 700 and 1000, discussed above with respect to FIGS. 7A-7G and/or FIGS. 10A-10C. The geometrical patterns correspond to patterns of metal, oxide, or semiconductor layers that make up the various components of IC device 2240 to be fabricated. The various layers combine to form various IC features. For example, a portion of IC design layout diagram 2211 includes various IC features, such as an active area, gate electrode, source and drain, conductive segments or vias of an interlayer interconnection, to be formed in a semiconductor substrate (such as a silicon wafer) and various material layers disposed on the semiconductor substrate. Design house 2210 implements a proper design procedure to form IC design layout diagram 2211. The design procedure includes one or more of logic design, physical design or place and route. IC design layout diagram 2211 is presented in one or more data files having information of the geometrical patterns. For example, IC design layout diagram 2211 can be expressed in a GDSII file format or DFII file format.

Mask house 2220 includes data preparation 2221 and mask fabrication 2222. Mask house 2220 uses IC design layout diagram 2211 to manufacture one or more masks 2223 to be used for fabricating the various layers of IC device 2240 according to IC design layout diagram 2211. Mask house 2220 performs mask data preparation 2221, where IC design layout diagram 2211 is translated into a representative data file ("RDF"). Mask data preparation 2221 provides the RDF to mask fabrication 2222. Mask fabrication 2222 includes a mask writer. A mask writer converts the RDF to an image on a substrate, such as a mask (reticle) 2223 or a semiconductor wafer 2233. The IC design layout diagram 2211 is manipulated by mask data preparation 2221 to comply with particular characteristics of the mask writer and/or requirements of IC fab 2230. In FIG. 22, data preparation 2221 and mask fabrication 2222 are illustrated as separate elements. In some embodiments, data preparation 2221 and mask fabrication 2222 can be collectively referred to as mask data preparation.

In some embodiments, data preparation 2221 includes optical proximity correction (OPC) which uses lithography enhancement techniques to compensate for image errors, such as those that can arise from diffraction, interference, other process effects and the like. OPC adjusts IC design layout diagram 2211. In some embodiments, data preparation 2221 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 2221 includes a mask rule checker (MRC) that checks the IC design layout diagram 2211 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 2211 to compensate for limitations during mask fabrication 2222, which may undo part of the modifications performed by OPC in order to meet mask creation rules.

In some embodiments, data preparation 2221 includes lithography process checking (LPC) that simulates processing that will be implemented by IC fab 2230 to fabricate IC device 2240. LPC simulates this processing based on IC design layout diagram 2211 to create a simulated manufactured device, such as IC device 2240. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2211.

It should be understood that the above description of data preparation 2221 has been simplified for the purposes of clarity. In some embodiments, data preparation 2221 includes additional features such as a logic operation (LOP) to modify the IC design layout diagram 2211 according to manufacturing rules. Additionally, the processes applied to IC design layout diagram 2211 during data preparation 2221 may be executed in a variety of different orders.

After data preparation 2221 and during mask fabrication 2222, a mask 2223 or a group of masks 2223 are fabricated based on the modified IC design layout diagram 2211. In some embodiments, mask fabrication 2222 includes performing one or more lithographic exposures based on IC design layout diagram 2211. In some embodiments, an electron-beam (e-beam) or a mechanism of multiple e-beams is used to form a pattern on a mask (photomask or reticle) 2223 based on the modified IC design layout diagram 2211. Mask 2223 can be formed in various technologies. In some embodiments, mask 2223 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 2223 includes a transparent substrate (for example, fused quartz) and an opaque material (for example, chromium) coated in the opaque regions of the binary mask. In another example, mask 2223 is formed using a phase shift technology. In a phase shift mask (PSM) version of mask 2223, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2222 is used in a variety of processes. For example, such a mask(s) is used in an ion implantation process to form various doped regions in semiconductor wafer 2233, in an etching process to form various etching regions in semiconductor wafer 2233, and/or in other suitable processes.

IC fab 2230 includes wafer fabrication 2232. IC fab 2230 is an IC fabrication business that includes one or more manufacturing facilities for the fabrication of a variety of different IC products. In some embodiments, IC Fab 2230 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 2230 uses mask(s) 2223 fabricated by mask house 2220 to fabricate IC device 2240. Thus, IC fab 2230 at least indirectly uses IC design layout diagram 2211 to fabricate IC device 2240. In some embodiments, semiconductor wafer 2233 is fabricated by IC fab 2230 using mask(s) 2223 to form IC device 2240. In some embodiments, the IC fabrication includes performing one or more lithographic exposures based at least indirectly on IC design layout diagram 2211. Semiconductor wafer 2233 includes a silicon substrate or other proper substrate having material layers formed thereon. Semiconductor wafer 2233 further includes one or more of various doped regions, dielectric features, multi-level interconnects, and the like (formed at subsequent manufacturing steps).

Moreover, various circuits or devices to implement the transistors in the aforementioned embodiments are within the contemplated scope of the present disclosure. In some embodiments of this document, at least one of the transistors is implemented with at least one MOS transistor, at least one bipolar junction transistor (BJT), etc., or the combination thereof. Various circuits or devices to implement the transistors in the aforementioned embodiments are within the contemplated scope of the present disclosure.

In some embodiments, an integrated circuit is disclosed and includes a first conductive structure having a fork shape in a film structure and in a first semiconductor layer, including: a root portion of the first conductive structure and multiple tine portions of the first conductive structure that are arranged in the first semiconductor layer; and a neck portion of the first conductive structure surrounded by the film structure. The integrated circuit further includes a second conductive structure that is adjacent to the first conductive structure and has first and second portions that are stacked along a first direction. The first portion of the second conductive structure is surrounded by the film structure and the second portion of the second conductive structure is in the first semiconductor layer. A third conductive structure in the integrated circuit has a horizontal structure and a vertical structure. The horizontal structure extends in a second direction in a second semiconductor layer above the film structure and the first semiconductor layer and the vertical structure passes through the second semiconductor layer and the film structure to contact a first conductive rail in the first semiconductor layer. The first conductive rail and the tine portions are apart from the horizontal structure along the first direction by a same distance.

In some embodiments, along the second direction a width of the first portion of the second conductive structure is smaller than a width of the second portion of the second conductive structure.

In some embodiments, the first conductive structure is interposed between the second conductive structure and the third conductive structure.

In some embodiments, a width of the neck portion of the first conductive structure is greater than a distance between a boundary of a first portion in the tine portions and a boundary of a second portion in the tine portions. The first and second portions in the tine portions are separated from each other.

In some embodiments, the tine portions are configured to transmit signals.

In some embodiments, the second portion of the second conductive structure is configured to transmit a power supply voltage.

In some embodiments, the integrated circuit further includes multiple dielectric structures disposed between the tine portions, the second conductive structure, and the first conductive rail.

In some embodiments, an integrated circuit is also disclosed. The integrated circuit includes a first pair of conductive rails configured to transmit supply voltages and arranged in a first semiconductor layer; a second pair of conductive rails arranged in the first semiconductor layer and interposed between the first pair of conductive rails, configured to transmit a data signal; and a first conductive structure disposed on the second pair of conductive rails and having a protrusion in the first semiconductor layer. The protrusion has a first surface contacting a first rail in the second pair of conductive rails and a second surface contacting a second rail in the second pair of conductive rails.

In some embodiments, the integrated circuit further includes a first conductive segment arranged on a first rail in the first pair of conductive rails a second conductive segment arranged on a second rail in the first pair of conductive rails. The protrusion has a third surface below surfaces where the first and second conductive segments contact the first pair of conductive rails.

In some embodiments, widths of the first and second conductive segments are smaller than a width of the first pair of conductive rails long a horizontal direction.

In some embodiments, widths of the second pair of conductive rails are different from widths of the first pair of conductive rails.

In some embodiments, widths of the second pair of conductive rails are smaller from widths of the first pair of conductive rails.

In some embodiments, the integrated circuit further includes a second conductive structure disposed on one of rail in the second pair of conductive rails and a signal rail. A corner of the first conductive structure is separated from a corresponding corner of the second conductive structure by a distance that is in a range of half of a poly pitch to one poly pitch in the integrated circuit.

In some embodiments, the first and second conductive structures are in shape of a square.

In some embodiments, an integrated circuit is provided and includes a first signal rail extending in a first direction; multiple conductive rails extending in a second direction and each arranged apart from the first signal rail by a first distance along a third direction; and a first conductive segment electrically coupled to at least two rails, having smaller width, in the conductive rails and having a height smaller than the first distance. The first conductive segment is interposed between the first signal rail and the at least two rails and disposed at a central point of the conductive rails along the first direction.

In some embodiments, the integrated circuit further includes a via coupled between the first signal rail and one rail in the conductive rails. A height of the via along the third direction is greater than the height of the first conductive segment.

In some embodiments, the integrated circuit further includes multiple second segments disposed on two rails in the conductive rails, wherein a height of the second segments is smaller than the first distance.

In some embodiments, widths of the second segments are smaller than widths of the two rails in the conductive rails.

In some embodiments, the widths of the two rails in the conductive rails are greater than widths of the at least two rails in the conductive rails.

In some embodiments, a second distance between first and second boundaries of the at least two rails in the conductive rails is greater than a width of the first conductive segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
    a first conductive structure in a film structure and in a first metal layer, comprising:
        a plurality of first conductive rails that are arranged in the first metal layer; and
        a conductive segment surrounded by the film structure;
    a second conductive structure that is adjacent to the first conductive structure and has first and second portions that are stacked along a first direction, wherein the first portion of the second conductive structure is surrounded by the film structure and the second portion of the second conductive structure is in the first metal layer; and
    a third conductive structure having a horizontal structure and a vertical structure, wherein the horizontal structure extends in a second direction in a second metal layer above the film structure and the first metal layer and the vertical structure passes through the second metal layer and the film structure to contact a second conductive rail in the first metal layer,
    wherein the second conductive rail and the plurality of first conductive rails are apart from the horizontal structure along the first direction by a same distance.

2. The integrated circuit of claim 1, wherein along the second direction a width of the first portion of the second conductive structure is smaller than a width of the second portion of the second conductive structure.

3. The integrated circuit of claim 1, wherein the first conductive structure is interposed between the second conductive structure and the third conductive structure.

4. The integrated circuit of claim 1, wherein a width of the conductive segment of the first conductive structure is greater than a distance between a boundary of a first rail in the plurality of first conductive rails and a boundary of a second rail in the plurality of first conductive rails,
    wherein the first rail and the second rail in the plurality of first conductive rails are separated from each other.

5. The integrated circuit of claim 1, wherein the plurality of first conductive rails are configured to transmit signals.

6. The integrated circuit of claim 1, wherein the second portion of the second conductive structure is configured to transmit a power supply voltage.

7. The integrated circuit of claim 1, further comprising:
    a plurality of dielectric structures disposed between the plurality of first conductive rails, the second conductive structure, and the second conductive rail.

8. An integrated circuit, comprising:
    a first pair of conductive rails configured to transmit supply voltages and arranged in a first metal layer;
    a second pair of conductive rails arranged in the first metal layer and interposed between the first pair of conductive rails, configured to transmit a data signal; and
    a first conductive structure disposed on the second pair of conductive rails and having a portion interposed into the first metal layer,
    wherein the portion of the first conductive structure has a first surface contacting a first rail in the second pair of conductive rails and a second surface contacting a second rail in the second pair of conductive rails.

9. The integrated circuit of claim 8, further comprising:
    a first conductive segment arranged on a first rail in the first pair of conductive rails a second conductive segment arranged on a second rail in the first pair of conductive rails,
    wherein the portion of the first conductive structure has a third surface below surfaces where the first and second conductive segments contact the first pair of conductive rails.

10. The integrated circuit of claim 9, wherein widths of the first and second conductive segments are smaller than a width of the first pair of conductive rails long a horizontal direction.

11. The integrated circuit of claim 8, wherein widths of the second pair of conductive rails are different from widths of the first pair of conductive rails.

12. The integrated circuit of claim 11, wherein widths of the second pair of conductive rails are smaller from widths of the first pair of conductive rails.

13. The integrated circuit of claim 8, further comprising:
    a second conductive structure disposed on one of rail in the second pair of conductive rails and a signal rail, wherein a corner of the first conductive structure is separated from a corresponding corner of the second conductive structure by a distance that is in a range of half of a poly pitch to one poly pitch in the integrated circuit.

14. The integrated circuit of claim 13, wherein the first and second conductive structures are in shape of a square.

15. An integrated circuit, comprising:
a first signal rail extending in a first direction;
a plurality of conductive rails extending in a second direction and each arranged apart from the first signal rail by a first distance along a third direction; and
a first conductive segment electrically coupled to at least two rails having smaller width than a width of others in the plurality of conductive rails, wherein the first conductive segment has a height smaller than the first distance, wherein the first conductive segment is interposed between the first signal rail and the at least two rails and disposed at a central point of the plurality of conductive rails along the first direction.

16. The integrated circuit of claim 15, further comprising:
a via coupled between the first signal rail and one rail in the plurality of conductive rails, wherein a height of the via along the third direction is greater than the height of the first conductive segment.

17. The integrated circuit of claim 16, further comprising:
a plurality of second segments disposed on two rails in the plurality of conductive rails, wherein a height of the plurality of second segments is smaller than the first distance.

18. The integrated circuit of claim 17, wherein widths of the plurality of second segments are smaller than widths of the two rails in the plurality of conductive rails.

19. The integrated circuit of claim 18, wherein the widths of the two rails in the plurality of conductive rails are greater than widths of the at least two rails in the plurality of conductive rails.

20. The integrated circuit of claim 15, wherein a second distance between first and second boundaries of the at least two rails in the plurality of conductive rails is greater than a width of the first conductive segment.

* * * * *